United States Patent
Nishinaka et al.

(10) Patent No.: US 8,168,986 B2
(45) Date of Patent: May 1, 2012

(54) GAN-BASED SEMICONDUCTOR LIGHT-EMITTING ELEMENT, LIGHT-EMITTING ELEMENT ASSEMBLY, LIGHT-EMITTING APPARATUS, METHOD OF DRIVING GAN-BASED SEMICONDUCTOR LIGHT-EMITTING ELEMENT, AND IMAGE DISPLAY APPARATUS

(75) Inventors: Ippei Nishinaka, Kanagawa (JP); Goshi Biwa, Kanagawa (JP); Hiroki Naito, Kanagawa (JP)

(73) Assignee: Sony Corporation, Tokyo (JP)

( * ) Notice: Subject to any disclaimer, the term of this patent is extended or adjusted under 35 U.S.C. 154(b) by 635 days.

(21) Appl. No.: 12/408,106

(22) Filed: Mar. 20, 2009

(65) Prior Publication Data
US 2009/0256494 A1    Oct. 15, 2009

(30) Foreign Application Priority Data
Apr. 14, 2008  (JP) ................................ 2008-104405

(51) Int. Cl.
*H01L 33/00*    (2010.01)

(52) U.S. Cl. .................. 257/79; 257/13; 257/E33.008; 438/22

(58) Field of Classification Search .............. 257/11–15, 257/79, 86, 94, 98–103, E33.008, E33.054, 257/E25.028, E25.032; 438/22
See application file for complete search history.

(56) References Cited

U.S. PATENT DOCUMENTS

| | | |
|---|---|---|
| 2002/0085603 A1 | 7/2002 | Okumura |
| 2002/0149024 A1 | 10/2002 | Kato et al. |
| 2003/0001170 A1 | 1/2003 | Shibata et al. |
| 2003/0132448 A1 | 7/2003 | Tsujimura et al. |
| 2006/0163601 A1 | 7/2006 | Harle et al. |
| 2008/0308787 A1* | 12/2008 | Lee et al. .................... 257/13 |

FOREIGN PATENT DOCUMENTS

| | | |
|---|---|---|
| JP | 63-187120 | 11/1988 |
| JP | 09-129926 | 5/1997 |
| JP | 10-256657 | 9/1998 |
| JP | 10-261838 | 9/1998 |
| JP | 2000-091629 | 3/2000 |

(Continued)

OTHER PUBLICATIONS

Japanese Office Action for corresponding JP2008-104405 issued on Jan. 26, 2010.

*Primary Examiner* — Evan Pert
*Assistant Examiner* — Selim Ahmed
(74) *Attorney, Agent, or Firm* — K&L Gates LLP

(57) ABSTRACT

A GaN-based semiconductor light-emitting element is provided and includes a first GaN-based compound semiconductor layer; an active layer having a multi-quantum well structure; and a second GaN-based compound semiconductor layer. At least one of barrier layers constituting the active layer is composed of a varying-composition barrier layer, and the composition of the varying-composition barrier layer varies in the thickness direction thereof so that the band-gap energy in a region of the varying-composition barrier layer, the region being adjacent to a boundary between a well layer disposed closer to the second GaN-based compound semiconductor layer and the varying-composition barrier layer, is lower than that in a region of the varying-composition barrier layer, the region being adjacent to a boundary between a well layer disposed closer to the first GaN-based compound semiconductor layer and the varying-composition barrier layer.

19 Claims, 26 Drawing Sheets

FOREIGN PATENT DOCUMENTS

| | | |
|---|---|---|
| JP | 2000-261106 | 9/2000 |
| JP | 2001-168471 | 6/2001 |
| JP | 2002-131552 | 5/2002 |
| JP | 2002-270894 | 9/2002 |
| JP | 2002-277870 | 9/2002 |
| JP | 2002-319702 | 10/2002 |
| JP | 2002-368268 | 12/2002 |
| JP | 2004-087763 | 3/2004 |
| JP | 2004-087908 | 3/2004 |
| JP | 2004-179428 | 6/2004 |
| JP | 2004-343147 | 12/2004 |
| JP | 2007-080996 | 3/2007 |
| JP | 2007-080998 | 3/2007 |
| WO | 2006-519481 | 8/2006 |

* cited by examiner

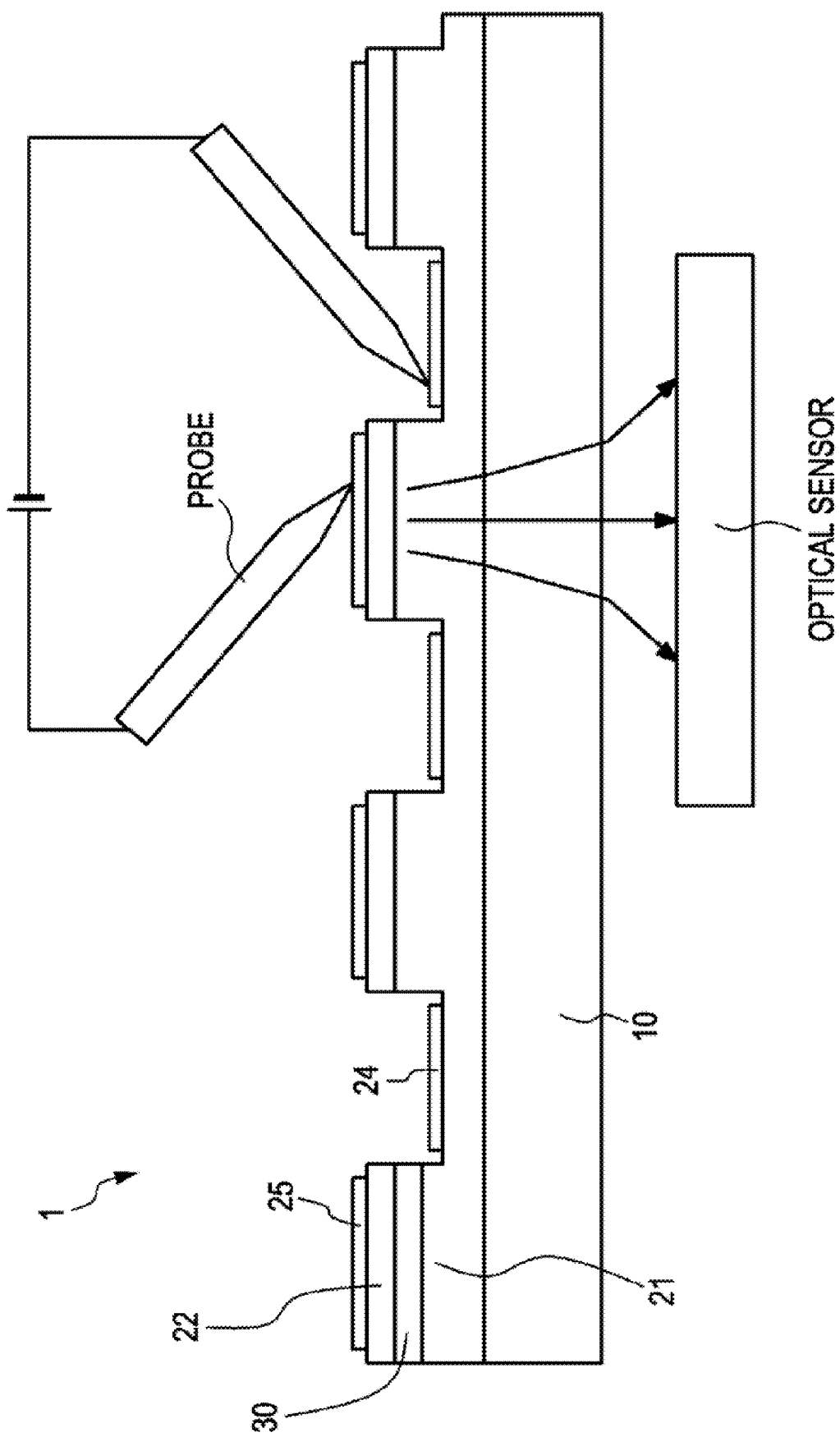

FIG. 6A

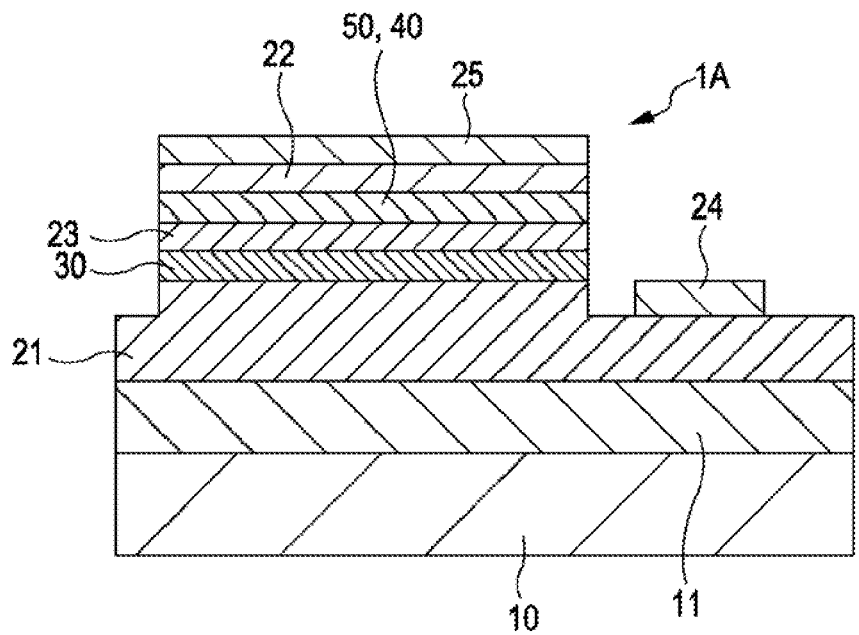

FIG. 6B

| | | |
|---|---|---|
| 22 — | SECOND GaN-BASED COMPOUND SEMICONDUCTOR LAYER | |
| 40 — | LAMINATED STRUCTURE | |
| 41 — | LAMINATE UNIT | UNDOPED GaN-BASED COMPOUND SEMICONDUCTOR LAYER — 53 |
| 43 — | UNDOPED GaN-BASED COMPOUND SEMICONDUCTOR LAYER | |
| 42 — | GaN-BASED COMPOUND SEMICONDUCTOR LAYER OF p-CONDUCTIVITY TYPE | THIRD GaN-BASED COMPOUND SEMICONDUCTOR LAYER — 50 |
| 41 — | LAMINATE UNIT | UNDOPED GaN-BASED COMPOUND SEMICONDUCTOR LAYER — 53 |
| 43 — | UNDOPED GaN-BASED COMPOUND SEMICONDUCTOR LAYER | |
| 42 — | GaN-BASED COMPOUND SEMICONDUCTOR LAYER OF p-CONDUCTIVITY TYPE | THIRD GaN-BASED COMPOUND SEMICONDUCTOR LAYER — 50 |
| 23 — | IMPURITY DIFFUSION-PREVENTING LAYER | |
| 30 — | ACTIVE LAYER | |
| 21 — | FIRST GaN-BASED COMPOUND SEMICONDUCTOR LAYER | |

FIG. 7

| | | |
|---|---|---|
| 22 | SECOND GaN-BASED COMPOUND SEMICONDUCTOR LAYER | |
| 140 | LAMINATED STRUCTURE | |
| 141 | LAMINATE UNIT | UNDOPED GaN-BASED COMPOUND SEMICONDUCTOR LAYER — 153 |
| 143 | UNDOPED GaN-BASED COMPOUND SEMICONDUCTOR LAYER | |
| 143C | THIRD LAYER HAVING COMPOSITION THE SAME AS THAT OF GaN-BASED COMPOUND SEMICONDUCTOR LAYER 42 OF p-CONDUCTIVITY TYPE | THIRD LAYER HAVING COMPOSITION THE SAME AS THAT OF GaN-BASED COMPOUND SEMICONDUCTOR LAYER 150 OF p-CONDUCTIVITY TYPE — 153C |
| 143B | SECOND LAYER HAVING COMPOSITION THAT IS THE SAME AS THAT OF GaN-BASED COMPOUND SEMICONDUCTOR LAYER 42 OF p-CONDUCTIVITY TYPE AND THAT FURTHER CONTAINS In | SECOND LAYER HAVING COMPOSITION THAT IS THE SAME AS THAT OF GaN-BASED COMPOUND SEMICONDUCTOR LAYER 150 OF p-CONDUCTIVITY TYPE AND THAT FURTHER CONTAINS In — 153B |
| 143A | FIRST LAYER HAVING COMPOSITION THE SAME AS THAT OF GaN-BASED COMPOUND SEMICONDUCTOR LAYER 42 OF p-CONDUCTIVITY TYPE | FIRST LAYER HAVING COMPOSITION THE SAME AS THAT OF GaN-BASED COMPOUND SEMICONDUCTOR LAYER 150 OF p-CONDUCTIVITY TYPE — 153A |
| 42 | GaN-BASED COMPOUND SEMICONDUCTOR LAYER OF p-CONDUCTIVITY TYPE | THIRD GaN-BASED COMPOUND SEMICONDUCTOR LAYER — 150 |
| 143 | UNDOPED GaN-BASED COMPOUND SEMICONDUCTOR LAYER | UNDOPED GaN-BASED COMPOUND SEMICONDUCTOR LAYER — 153 |
| 143C | THIRD LAYER HAVING COMPOSITION THE SAME AS THAT OF GaN-BASED COMPOUND SEMICONDUCTOR LAYER 42 OF p-CONDUCTIVITY TYPE | THIRD LAYER HAVING COMPOSITION THE SAME AS THAT OF GaN-BASED COMPOUND SEMICONDUCTOR LAYER 150 OF p-CONDUCTIVITY TYPE — 153C |
| 143B | SECOND LAYER HAVING COMPOSITION THAT IS THE SAME AS THAT OF GaN-BASED COMPOUND SEMICONDUCTOR LAYER 42 OF p-CONDUCTIVITY TYPE AND THAT FURTHER CONTAINS In | SECOND LAYER HAVING COMPOSITION THAT IS THE SAME AS THAT OF GaN-BASED COMPOUND SEMICONDUCTOR LAYER 150 OF p-CONDUCTIVITY TYPE AND THAT FURTHER CONTAINS In — 153B |
| 143A | FIRST LAYER HAVING COMPOSITION THE SAME AS THAT OF GaN-BASED COMPOUND SEMICONDUCTOR LAYER 42 OF p-CONDUCTIVITY TYPE | FIRST LAYER HAVING COMPOSITION THE SAME AS THAT OF GaN-BASED COMPOUND SEMICONDUCTOR LAYER 150 OF p-CONDUCTIVITY TYPE — 153A |
| 42 | GaN-BASED COMPOUND SEMICONDUCTOR LAYER OF p-CONDUCTIVITY TYPE | THIRD GaN-BASED COMPOUND SEMICONDUCTOR LAYER — 150 |
| 23 | IMPURITY DIFFUSION-PREVENTING LAYER | |
| 30 | ACTIVE LAYER | |
| 21 | FIRST GaN-BASED COMPOUND SEMICONDUCTOR LAYER | |

EMITTED LIGHT

LIGHT-EMITTING ELEMENT ASSEMBLY

[STEP-610] (CONTINUATION)

[STEP-620]

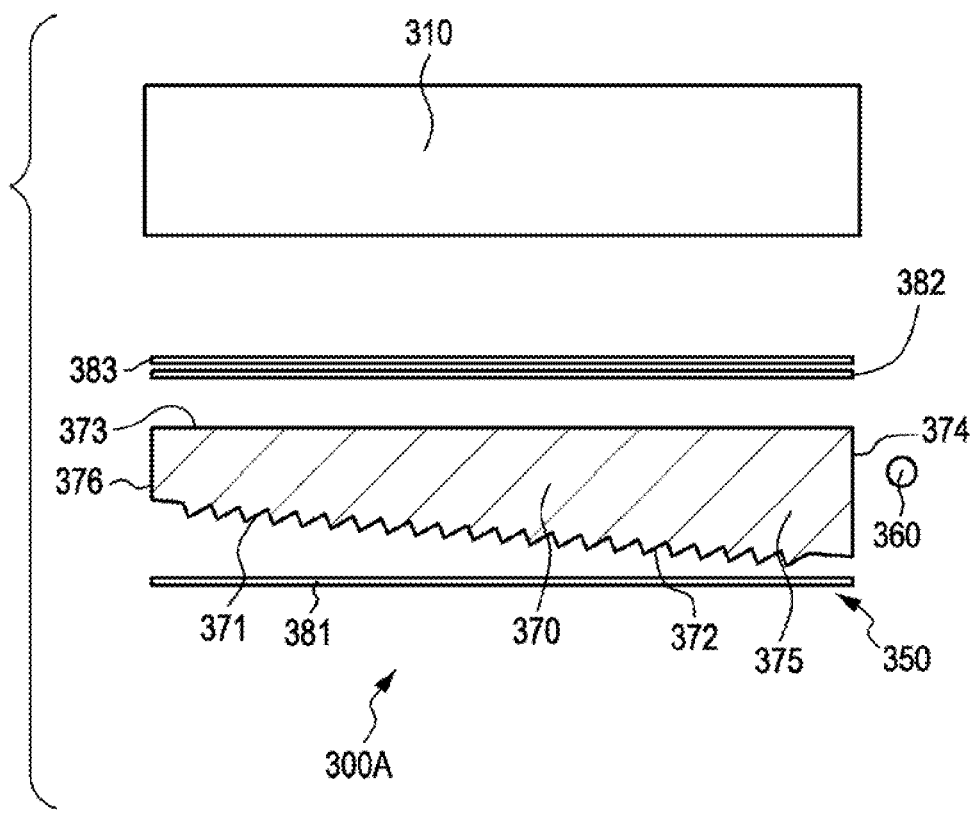

GAN-BASED SEMICONDUCTOR LIGHT-EMITTING ELEMENT, LIGHT-EMITTING ELEMENT ASSEMBLY, LIGHT-EMITTING APPARATUS, METHOD OF DRIVING GAN-BASED SEMICONDUCTOR LIGHT-EMITTING ELEMENT, AND IMAGE DISPLAY APPARATUS

CROSS REFERENCES TO RELATED APPLICATIONS

The present application claims priority to Japanese Priority Patent Application JP 2008-104405 filed in the Japan Patent Office on Apr. 14, 2008, the entire content of which is hereby incorporated by reference.

BACKGROUND

The present disclosure relates to a GaN-based semiconductor light-emitting element, a light-emitting element assembly and light-emitting apparatus including the GaN-based semiconductor light-emitting element, a method of driving the GaN-based semiconductor light-emitting element, and an image display apparatus including the GaN-based semiconductor light-emitting element.

In a light-emitting element (GaN-based semiconductor light-emitting element) including an active layer composed of a gallium nitride (GaN)-based compound semiconductor, a light emission wavelength in a wide range from ultraviolet to infrared can be realized by controlling the band-gap energy by changing the mixed crystal composition or thickness of the active layer. GaN-based semiconductor light-emitting elements that emit various types of colors are commercially available and used in various applications such as an image display apparatus, a lighting device, a test apparatus, and a light source for sterilization. Furthermore, semiconductor lasers and light-emitting diodes (LEDs) that emit blue-violet light have also been developed and used as pickups for writing or reading of large-capacity optical discs.

In general, a GaN-based semiconductor light-emitting element has a structure in which a first GaN-based compound semiconductor layer of n-conductivity type, an active layer, and a second GaN-based compound semiconductor layer of p-conductivity type are sequentially laminated.

In such a GaN-based semiconductor light-emitting element, in order to realize a high luminous efficiency, various techniques related to an active layer composed of well layers and barrier layers have been proposed. Examples of the techniques in the related art include a technique in which the number of well layers is specified (for example, see Japanese Unexamined Patent Application Publication Nos. 10-261838 and 10-256657), a technique in which the mixed crystal compositions of well layers and barrier layers are specified (for example, see Japanese Unexamined Patent Application Publication Nos. 2000-261106 and 2000-091629), and a technique in which a multi-quantum barrier structure is provided to barrier layers disposed between well layers having different light emission wavelengths, thereby controlling the emission intensity ratio of a plurality of light emission peaks (for example, see Japanese Unexamined Patent Application Publication No. 2002-368268). Note that in the multi-quantum well structures disclosed in these patent applications, it is assumed that all the barrier layers have the same composition, the same thickness, and the same structure. Japanese Unexamined Patent Application Publication No. 2004-179428 discloses a technique in which the composition of each of barrier layers is varied. This patent application describes that holes and electrons can be intentionally concentrated on a well layer located close to a p-side cladding layer. Furthermore, Japanese Unexamined Patent Application Publication No. 2004-087763 discloses a technique in which a strain-compensating layer is formed between a well layer and a barrier layer.

In any technique disclosed in the above-mentioned patent applications, when the density of current applied to an active layer is increased, it is difficult to prevent the luminous efficiency in the active layer having a multi-quantum well structure from decreasing. Accordingly, a technique for realizing a higher luminous efficiency has been strongly desired.

SUMMARY

It is desirable to provide a GaN-based semiconductor light-emitting element having a configuration and a structure for realizing a high luminous efficiency (high optical output), a light-emitting element assembly and light-emitting apparatus including the GaN-based semiconductor light-emitting element, a method of driving the GaN-based semiconductor light-emitting element, and an image display apparatus including the GaN-based semiconductor light-emitting element.

A GaN-based semiconductor light-emitting element according to an embodiment includes (A) a first GaN-based compound semiconductor layer of n-conductivity type; (B) an active layer having a multi-quantum well structure including well layers and barrier layers that separate adjacent well layers; (C) a second GaN-based compound semiconductor layer of p-conductivity type; (D) a first electrode that is electrically connected to the first GaN-based compound semiconductor layer; and (E) a second electrode that is electrically connected to the second GaN-based compound semiconductor layer, wherein at least one of the barrier layers constituting the active layer is composed of a varying-composition barrier layer, and the composition of the varying-composition barrier layer varies in the thickness direction thereof so that the band-gap energy in a first region of the varying-composition barrier layer, the first region being adjacent to a boundary between a well layer disposed on a side closer to the second GaN-based compound semiconductor layer and the varying-composition barrier layer, is lower than the band-gap energy in a second region of the varying-composition barrier layer, the second region being adjacent to a boundary between a well layer disposed on a side closer to the first GaN-based compound semiconductor layer and the varying-composition barrier layer.

A light-emitting element assembly according to an embodiment includes a supporting member and the GaN-based semiconductor light-emitting element according to an embodiment disposed on the supporting member.

A light-emitting apparatus according to an embodiment includes (a) a GaN-based semiconductor light-emitting element and (b) a color conversion material that is excited by light emitted from the GaN-based semiconductor light-emitting element to emit light having a wavelength different from the wavelength of the emitted light, wherein the GaN-based semiconductor light-emitting element is composed of the GaN-based semiconductor light-emitting element according to an embodiment.

An image display apparatus according to an embodiment includes a GaN-based semiconductor light-emitting element for displaying an image, wherein the GaN-based semiconductor light-emitting element is composed of the GaN-based semiconductor light-emitting element according to an embodiment.

In the case where the image display apparatus according to an embodiment is a color image display apparatus, the image display apparatus includes at least a first light-emitting element that emits blue light, a second light-emitting element that emits green light, and a third light-emitting element that emits red light, and the GaN-based semiconductor light-emitting element according to an embodiment may constitute at least one (one type) of the first light-emitting element, the second light-emitting element, and the third light-emitting element.

In the description below, the GaN-based semiconductor light-emitting element according to an embodiment, the GaN-based semiconductor light-emitting element in the light-emitting element assembly according to an embodiment, the GaN-based semiconductor light-emitting element in the light-emitting apparatus according to an embodiment, or the GaN-based semiconductor light-emitting element in the image display apparatus according to an embodiment is generically referred to as "GaN-based semiconductor light-emitting element or the like according to an embodiment".

In the GaN-based semiconductor light-emitting element or the like according to an embodiment, the composition of the varying-composition barrier layer may vary stepwise in the thickness direction. In this case, the composition of the varying-composition barrier layer preferably varies in the thickness direction in two steps, and when the boundary between the well layer disposed on the side closer to the first GaN-based compound semiconductor layer and the varying-composition barrier layer is assumed to be a reference, a position to in the thickness direction at which the composition varies preferably satisfies the following relationship:

$$0.01 t_B \leq t_0 \leq 0.5 t_B,$$

and more preferably, $$0.1 t_B \leq t_0 \leq 0.5 t_B,$$

wherein $t_B$ represents the thickness of the varying-composition barrier layer.

Alternatively, in the GaN-based semiconductor light-emitting element or the like according to an embodiment, the composition of the varying-composition barrier layer may continuously vary in the thickness direction.

In each of the GaN-based semiconductor light-emitting elements or the like including the preferred embodiments and configurations described above, the composition of the second region of the varying-composition barrier layer may be GaN, the composition of the first region of the varying-composition barrier layer may be $In_zGa_{(1-z)}N$, and the composition of each of the well layers may be $In_yGa_{(1-y)}N$ (wherein y>z). In this case, the value z is not limited, but the relationship $1 \times 10^{-4} \leq z \leq 3 \times 10^{-2}$ is preferably satisfied.

Alternatively, in each of the GaN-based semiconductor light-emitting elements or the like including the preferred embodiments and configurations described above, the composition of the second region of the varying-composition barrier layer may be AlGaN, the composition of the first region of the varying-composition barrier layer may be GaN or $In_zGa_{(1-z)}N$, and the composition of each of the well layers may be $In_yGa_{(1-y)}N$ (wherein y>z). Also in this case, the value z is not limited, but the relationship $1 \times 10^{-4} \leq z \leq 3 \times 10^{-2}$ is preferably satisfied.

Furthermore, in each of the various types of GaN-based semiconductor light-emitting elements or the like including the preferred embodiments and configurations described above, the number of well layers is, for example, in the range of 6 to 15. In this case, the number of varying-composition barrier layers is preferably ½ or more of the total number of barrier layers. Furthermore, the varying-composition barrier layers preferably occupy positions closer to the second GaN-based compound semiconductor layer.

Furthermore, in each of the GaN-based semiconductor light-emitting elements or the like including various types of the preferred embodiments and configurations described above, the density of a current applied to the active layer (operating current density) is preferably 50 amperes/cm² or more, more preferably 100 amperes/cm² or more, and further preferably 200 amperes/cm² or more.

In each of the GaN-based semiconductor light-emitting elements or the like including various types of the preferred embodiments and configurations described above, the active layer has an area preferably in the range of $1 \times 10^{-12}$ to $1 \times 10^{-8}$ m², and more preferably, in the range of $1 \times 10^{-11}$ to $1 \times 10^{-9}$ m².

In each of the GaN-based semiconductor light-emitting elements or the like including various types of the preferred embodiments and configurations described above, the GaN-based semiconductor light-emitting element has a thickness preferably in the range of $1 \times 10^{-7}$ to $1 \times 10^{-5}$ m, and more preferably in the range of $1 \times 10^{-6}$ to $1 \times 10^{-5}$ m.

Furthermore, each of the GaN-based semiconductor light-emitting elements or the like including various types of the preferred embodiments and configurations described above may further include (F) an impurity diffusion-preventing layer for preventing a p-type impurity from diffusing into the active layer, the impurity diffusion-preventing layer being composed of an undoped GaN-based compound semiconductor, and (G) a laminated structure, the impurity diffusion-preventing layer and the laminated structure being disposed between the active layer and the second GaN-based compound semiconductor layer in that order from the active layer side, wherein the laminated structure includes at least one laminate unit in which a GaN-based compound semiconductor layer of p-conductivity type and an undoped GaN-based compound semiconductor layer are laminated in that order from the active layer side. For convenience, such a structure is referred to as a "GaN-based semiconductor light-emitting element having a first structure".

Alternatively, each of the GaN-based semiconductor light-emitting elements or the like including various types of the preferred embodiments and configurations described above may further include (F) an impurity diffusion-preventing layer for preventing a p-type impurity from diffusing into the active layer, the impurity diffusion-preventing layer being composed of an undoped GaN-based compound semiconductor, and (G) a third GaN-based compound semiconductor layer of p-conductivity type, the impurity diffusion-preventing layer and the third GaN-based compound semiconductor layer being disposed between the active layer and the second GaN-based compound semiconductor layer in that order from the active layer side, wherein at least one undoped GaN-based compound semiconductor layer is provided on a side of the third GaN-based compound semiconductor layer, the side being closer to the second GaN-based compound semiconductor layer. For convenience, such a structure is referred to as a "GaN-based semiconductor light-emitting element having a second structure".

In the GaN-based semiconductor light-emitting element having the first structure, the GaN-based compound semiconductor layer of p-conductivity type and the undoped GaN-based compound semiconductor layer which constitute the laminate unit may have the same composition. In the GaN-based semiconductor light-emitting element having the second structure, the third GaN-based compound semiconductor layer of p-conductivity type and the undoped GaN-based compound semiconductor layer provided in the third GaN-based compound semiconductor layer may have the same composition.

In the GaN-based semiconductor light-emitting element having the first structure, an undoped GaN-based compound semiconductor layer constituting the laminate unit may have a GaN-based compound semiconductor layer, the composition of which contains indium. In the GaN-based semiconductor light-emitting element having the second structure, the undoped GaN-based compound semiconductor layer provided in the third GaN-based compound semiconductor layer may have a GaN-based compound semiconductor layer, the composition of which contains indium.

Alternatively, in the GaN-based semiconductor light-emitting element having the first structure, the undoped GaN-based compound semiconductor layer constituting the laminate unit may have a three-layer structure including a first layer having the same composition as the GaN-based compound semiconductor layer of p-conductivity type constituting the laminate unit, a second layer having the composition that is the same as that of the first layer and that further contains indium, and a third layer having the same composition as the first layer. In this case, the undoped GaN-based compound semiconductor layer constituting the laminate unit may have a three-layer structure including the first layer composed of undoped GaN, the second layer composed of undoped $In_xGa_{(1-x)}N$ (wherein $0 < x \leq 0.3$), and the third layer composed of undoped GaN. Furthermore, the active layer may include an $In_yGa_{(1-y)}N$ layer, wherein the relationship $x \leq y$ is satisfied.

Meanwhile, in the GaN-based semiconductor light-emitting element having the second structure, the undoped GaN-based compound semiconductor layer provided in the third GaN-based compound semiconductor layer may have a three-layer structure including a first layer having the same composition as the third GaN-based compound semiconductor layer of p-conductivity type, a second layer having the composition that is the same as that of the first layer and that further contains indium, and a third layer having the same composition as the first layer. In this case, the undoped GaN-based compound semiconductor layer provided in the third GaN-based compound semiconductor layer may have a three-layer structure including the first layer composed of undoped GaN, the second layer composed of undoped $In_xGa_{(1-x)}N$ (wherein $0 < x \leq 0.3$), and the third layer composed of undoped GaN. Furthermore, the active layer may include an $In_yGa_{(1-y)}N$ layer, wherein the relationship $x \leq y$ is satisfied.

In each of the GaN-based semiconductor light-emitting elements having the first structure, the light-emitting elements including the preferred embodiments and configurations described above, the laminated structure preferably include one to ten laminate units. In each of the GaN-based semiconductor light-emitting elements having the second structure, the light-emitting elements including the preferred embodiments and configurations described above, the third GaN-based compound semiconductor layer preferably includes one to ten undoped GaN-based compound semiconductor layers.

Furthermore, in each of the GaN-based semiconductor light-emitting elements having the first structure, the light-emitting elements including the preferred embodiments and configurations described above, the GaN-based compound semiconductor layer of p-conductivity type constituting the laminate unit has a p-type impurity concentration of preferably $1 \times 10^{18}/cm^3$ to $4 \times 10^{20}/cm^3$, and more preferably $1 \times 10^{19}/cm^3$ to $2 \times 10^{20}/cm^3$. In each of the GaN-based semiconductor light-emitting elements having the second structure, the light-emitting elements including the preferred embodiments and configurations described above, the third GaN-based compound semiconductor layer has a p-type impurity concentration of preferably $1 \times 10^{18}/cm^3$ to $4 \times 10^{20}/cm^3$, and more preferably $1 \times 10^{19}/cm^3$ to $2 \times 10^{20}/cm^3$.

Furthermore, in each of the GaN-based semiconductor light-emitting elements having the first structure, the light-emitting elements including the preferred embodiments and configurations described above, the GaN-based compound semiconductor layer of p-conductivity type constituting the laminate unit may have a thickness in the range of two-atomic-layer thickness to 50 nm, the undoped GaN-based compound semiconductor layer constituting the laminate unit may have a thickness in the range of two-atomic-layer thickness to 50 nm, and the laminated structure may have a thickness in the range of 5 nm to 200 nm. In each of the GaN-based semiconductor light-emitting elements having the second structure, the light-emitting elements including the preferred embodiments and configurations described above, the undoped GaN-based compound semiconductor layer provided in the third GaN-based compound semiconductor layer may have a thickness in the range of two-atomic-layer thickness to 50 nm, and the third GaN-based compound semiconductor layer may have a thickness in the range of 5 nm to 200 nm.

A method of driving a GaN-based semiconductor light-emitting element according to an embodiment includes a step of applying a current to the active layer of any of the GaN-based semiconductor light-emitting elements or the like having the first structure or the second structure, the light-emitting elements or the like including various types of the preferred embodiments and configurations described above (hereinafter generically referred to as "light-emitting element or the like according to an embodiment") at a current density (operating current density) of preferably 50 amperes/cm² or more, more preferably 100 amperes/cm² or more, and further preferably 200 amperes/cm² or more.

The operating current density of the GaN-based semiconductor light-emitting element is the value obtained by dividing the operating current value by the area (area of junction region) of the active layer. That is, commercially available GaN-based semiconductor light-emitting elements have various types of package forms, and the size of the GaN-based semiconductor light-emitting elements also varies depending on the application or the amount of light. In addition, for example, the standard driving current (operating current) varies depending on the size of the GaN-based semiconductor light-emitting elements. Therefore, it is difficult to directly compare current dependency of properties of the light-emitting elements with each other. Accordingly, for the sake of generalization, instead of the value of driving current itself, the above operating current density (units: ampere/cm²), which is obtained by dividing the driving current value by the area (area of junction region) of the active layer, is used in the present application.

The GaN-based semiconductor light-emitting element having the first structure can be produced by sequentially forming the first GaN-based compound semiconductor layer, the active layer, the impurity diffusion-preventing layer, the laminated structure, and the second GaN-based compound semiconductor layer, wherein the GaN-based compound semiconductor layer, the composition of which contains indium, in the undoped GaN-based compound semiconductor layer constituting the laminate unit is formed at a temperature higher than the temperature at which the GaN-based compound semiconductor layer, the composition of which contains indium, in the active layer is formed.

The GaN-based semiconductor light-emitting element having the second structure can be produced by sequentially forming the first GaN-based compound semiconductor layer, the active layer, the impurity diffusion-preventing layer, the third GaN-based compound semiconductor layer, and the second GaN-based compound semiconductor layer, wherein the GaN-based compound semiconductor layer, the composition of which contains indium, in the undoped GaN-based compound semiconductor layer provided in the third GaN-based compound semiconductor layer is formed at a temperature higher than the temperature at which the GaN-based compound semiconductor layer, the composition of which contains indium, in the active layer is formed.

In the light-emitting element or the like according to an embodiment, examples of the first GaN-based compound semiconductor layer, the second GaN-based compound semiconductor layer, and the impurity diffusion-preventing layer include a GaN layer, an AlGaN layer, an InGaN layer, and an AlInGaN layer. Furthermore, these compound semiconductor layers may contain a boron (B) atom, a thallium (Tl) atom, an arsenic (As) atom, a phosphorus (P) atom, or an antimony (Sb) atom, as desired.

In the light-emitting element or the like according to an embodiment, various types of GaN-based compound semiconductor layers are sequentially formed on a light-emitting element formation substrate. Examples of the light-emitting element formation substrate include a sapphire substrate, a GaAs substrate, a GaN substrate, a SiC substrate, an alumina substrate, a ZnS substrate, a ZnO substrate, an AlN substrate, a LiMgO substrate, a LiGaO$_2$ substrate, a MgAl$_2$O$_4$ substrate, an InP substrate, a Si substrate, and substrates on which an underlayer and a buffer layer are provided on a surface (main surface) of these substrates. In the light-emitting element or the like according to an embodiment, the light-emitting element formation substrate may remain in the final product, or may be finally removed. In the latter case, the light-emitting element or the like according to an embodiment is provided on a supporting member.

Example of the supporting member in a light-emitting element assembly according to an embodiment include the substrates cited as the light-emitting element formation substrate, a glass substrate, a metal substrate, a metal sheet, an alloy substrate, an alloy sheet, a ceramic substrate, a ceramic sheet, a semiconductor substrate, a plastic substrate, a plastic sheet, and a plastic film. Examples of the plastic film include a polyethersulfone (PES) film, a polyethylene naphthalate (PEN) film, a polyimide (PI) film, and a polyethylene terephthalate (PET) film. Examples of the supporting member further include a substrate prepared by bonding any of the above-mentioned films to a glass substrate; and a glass substrate having a polyimide resin layer, an acrylic resin layer, a polystyrene resin layer, or a silicone rubber layer thereon. The glass substrate may be replaced with a metal substrate or a plastic substrate. Alternatively, the supporting member may be a substrate in which an insulating film is provided on a surface of any of the above-mentioned substrates. Examples of the material of the insulating film include inorganic insulating materials such as silicon oxide materials, silicon nitrides (SiN$_Y$), and metal oxide high dielectric insulating films; and organic insulating materials such as polymethyl methacrylate (PMMA), polyvinylphenol (PVP), and polyvinyl alcohol (PVA). These materials may be used in combinations. Examples of the silicon oxide materials include silicon oxides (SiO$_X$), silicon oxynitride (SiON), spin on glass (SOG), and low-dielectric constant SiO$_X$ materials (such as polyaryl ethers, cyclo-perfluorocarbon polymers, benzocyclobutene, cyclic fluorocarbon resins, polytetrafluoroethylene, fluorinated aryl ethers, fluorinated polyimides, amorphous carbon, and organic SOG). Examples of a method of forming the insulating film include PVD methods, CVD methods, a spin coating method, printing methods, coating methods, a dipping method, a casting method, and a spray method.

In each of the light-emitting apparatuses including the various types of preferred embodiments and configurations described above (hereinafter may be generically referred to as "light-emitting apparatus according to an embodiment"), examples of light emitted from an GaN-based semiconductor light-emitting element include visible light, ultraviolet light, and a combination of visible light and ultraviolet light.

In the light-emitting apparatus according to an embodiment, light emitted from a GaN-based semiconductor light-emitting element may be blue light, and light emitted from a color conversion material may be at least one selected from the group consisting of yellow light, green light, and red light. The light emitted from the GaN-based semiconductor light-emitting element and the light emitted from the color conversion material (e.g., yellow; red and green; yellow and red; green, yellow, and red) may be mixed to emit white light. Here, examples of a color conversion material that is excited by blue light emitted from a GaN-based semiconductor light-emitting element and that emits red light include red-light-emitting phosphor particles. Specific examples thereof include (ME:Eu)S (wherein "ME" represents at least one type of atom selected from the group consisting of Ca, Sr, and Ba; hereinafter the same), (M:Sm)$_X$(Si,Al)$_{12}$(O,N)$_{16}$ (wherein "M" represents at least one type of atom selected from the group consisting of Li, Mg, and Ca; hereinafter the same), ME$_2$Si$_5$N$_8$:Eu, (Ca:Eu)SiN$_2$, and (Ca:Eu)AlSiN$_3$. Examples of a color conversion material that is excited by blue light emitted from a GaN-based semiconductor light-emitting element and that emits green light include green-light-emitting phosphor particles. Specific examples thereof include (ME:Eu)Ga$_2$S$_4$, (M:RE)$_X$(Si,Al)$_{12}$(O,N)$_{16}$ (wherein "RE" represents Tb or Yb), (M:Tb)$_X$(Si,Al)$_{12}$(O,N)$_{16}$, (M:Yb)$_X$(Si,Al)$_{12}$(O,N)$_{16}$, and Si$_{6-Z}$Al$_Z$O$_Z$N$_{8-Z}$:Eu. Furthermore, examples of a color conversion material that is excited by blue light emitted from a GaN-based semiconductor light-emitting element and that emits yellow light include yellow-light-emitting phosphor particles. A specific example thereof is yttrium aluminum garnet (YAG)-based phosphor particles. The color conversion materials may be used alone or in combinations of two or more types of materials. Furthermore, by using two or more types of color conversion materials as a mixture, light having a color other than yellow, green, and red may be emitted from the mixture of the color conversion materials. Specifically, the light-emitting element may have a structure in which cyan light is emitted. In such a case, a mixture of green-light-emitting phosphor particles (such as LaPO$_4$:Ce,Tb, BaMgAl$_{10}$O$_{17}$:Eu,Mn, Zn$_2$SiO$_4$:Mn, MgAl$_{11}$O$_{19}$:Ce,Tb, Y$_2$SiO$_5$:Ce,Tb, or MgAl$_{11}$O$_{19}$:CE,Tb,Mn) and blue-light-emitting phosphor particles (such as BaMgAl$_{10}$O$_{17}$:Eu, BaMg$_2$Al$_{16}$O$_{27}$:Eu, Sr$_2$P$_2$O$_7$:Eu, Sr$_5$(PO$_4$)$_3$Cl:Eu, (Sr,Ca,Ba,Mg)$_5$(PO$_4$)$_3$Cl:Eu, CaWO$_4$, or CaWO$_4$:Pb) can be used.

Examples of a color conversion material that is excited by ultraviolet light emitted from a GaN-based semiconductor light-emitting element and that emits red light include red-light-emitting phosphor particles. Specific examples thereof include Y$_2$O$_3$:Eu, YVO$_4$:Eu, Y(P,V)O$_4$:Eu, 3.5MgO.0.5MgF$_2$.Ge$_2$:Mn, CaSiO$_3$:Pb,Mn, Mg$_6$AsO$_{11}$:Mn, $(Sr,Mg)_3(PO_4)_3$:Sn, $La_2O_2S$:Eu, and $Y_2O_2S$:Eu. Examples of a color conversion material that is excited by ultraviolet light emitted from a GaN-based semiconductor light-emitting element and that emits green light include green-light-emitting phosphor particles. Specific examples thereof include $LaPO_4$:Ce,Th, $BaMgAl_{10}O_{17}$:Eu,Mn, $Zn_2SiO_4$:Mn, $MgAl_{11}O_{19}$:Ce,Th, $Y_2SiO_5$:Ce,Tb, $MgAl_{11}O_{19}$:CE,Tb,Mn, and $Si_{6-Z}Al_ZO_ZN_{8-Z}$:Eu. Furthermore, examples of a color conversion material that is excited by ultraviolet light emitted from a GaN-based semiconductor light-emitting element and that emits blue light include blue-light-emitting phosphor particles. Specific examples thereof include $BaMgAl_{10}O_{17}$: Eu, $BaMg_2Al_{16}O_{27}$:Eu, $Sr_2P_2O_7$:Eu, $Sr_5(PO_4)_3Cl$:Eu, $(Sr,Ca,Ba,Mg)_5(PO_4)_3Cl$:Eu, $CaWO_4$, and $CaWO_4$:Pb. Furthermore, examples of a color conversion material that is excited by ultraviolet light emitted from a GaN-based semiconductor light-emitting element and that emits yellow light include yellow-light-emitting phosphor particles. Specific examples thereof include YAG-based phosphor particles. The color conversion materials may be used alone or in combinations of two or more types of materials. Furthermore, by using two or more types of color conversion materials as a mixture, light having a color other than yellow, green, and red may be emitted from the mixture of the color conversion materials. Specifically, the light-emitting element may have a structure in which cyan light is emitted. In such a case, a mixture of the green-light-emitting phosphor particles and the blue-light-emitting phosphor particles can be used.

The color conversion material is not limited to phosphor particles. Other examples of the color conversion material include luminescent particles composed of an indirect transition-type silicon material having a quantum well structure, such as a two-dimensional quantum well structure, a one-dimensional quantum well structure (quantum wire), or a zero-dimensional quantum well structure (quantum dot), in which the carrier wave function is localized in order that carriers can be efficiently converted into light as in a direct transition-type material, thus utilizing a quantum effect. It has also been reported that rare earth atoms added to a semiconductor material sharply emit light by means of an intra-shell transition, and luminescent particles to which such a technique is applied can also be used.

Examples of image display apparatuses including the various types of preferred embodiments and configurations described above (hereinafter may be generically referred to as "image display apparatus according to an embodiment") include image display apparatuses having configurations and structures described below. Unless otherwise stated, the number of GaN-based semiconductor light-emitting elements constituting an image display apparatus or a light-emitting element panel may be determined on the basis of the specifications of the image display apparatus. In addition, a light valve may be further provided in accordance with the specifications of the image display apparatus.

(1) Image Display Apparatus Having First Structure

A passive matrix-type or active matrix-type, direct-view-type image display apparatus including ($\alpha$) a light-emitting element panel having GaN-based semiconductor light-emitting elements arranged in a two-dimensional matrix, wherein the light emission/non-emission state of each of the GaN-based semiconductor light-emitting elements is controlled, and the emission state of each of the GaN-based semiconductor light-emitting elements is directly visually observed to display an image.

(2) Image Display Apparatus Having Second Structure

A passive matrix-type or active matrix-type, projection-type image display apparatus including ($\alpha$) a light-emitting element panel having GaN-based semiconductor light-emitting elements arranged in a two-dimensional matrix, wherein the light emission/non-emission state of each of the GaN-based semiconductor light-emitting elements is controlled, and projection is performed on a screen to display an image.

(3) Image Display Apparatus Having Third Structure

A (direct-view-type or projection-type) color image display apparatus including ($\alpha$) a red-light-emitting element panel having semiconductor light-emitting elements that emit red light (hereinafter also referred to as "red-light-emitting semiconductor light-emitting elements) (e.g., AlGaInP-based semiconductor light-emitting elements or GaN-based semiconductor light-emitting elements; hereinafter the same), the light-emitting elements being arranged in a two-dimensional matrix; ($\beta$) a green-light-emitting element panel having GaN-based semiconductor light-emitting elements that emit green light (hereinafter also referred to as green-light-emitting GaN-based semiconductor light-emitting elements), the light-emitting elements being arranged in a two-dimensional matrix; ($\gamma$) a blue-light-emitting element panel having GaN-based semiconductor light-emitting elements that emit blue light (hereinafter also referred to as "blue-light-emitting GaN-based semiconductor light-emitting elements"), the light-emitting elements being arranged in a two-dimensional matrix; and ($\delta$) means (e.g., a dichroic prism; hereinafter the same) for combining light emitted from each of the red-light-emitting element panel, the green-light-emitting element panel, and the blue-light-emitting element panel into a single optical path, wherein the light emission/non-emission state of each of the red-light-emitting semiconductor light-emitting elements, the green-light-emitting GaN-based semiconductor light-emitting elements, and the blue-light-emitting GaN-based semiconductor light-emitting elements is controlled.

(4) Image Display Apparatus Having Fourth Structure

A (direct-view-type or projection-type) image display apparatus including ($\alpha$) a GaN-based semiconductor light-emitting element; and ($\beta$) a light transmission controlling device (e.g., a liquid crystal display device, a digital micromirror device (DMD), or a liquid crystal on silicon (LCOS); hereinafter the same) which is a light valve that controls transmission/non-transmission of light emitted from the GaN-based semiconductor light-emitting element, wherein the transmission/non-transmission of light emitted from the GaN-based semiconductor light-emitting element is controlled by the light transmission controlling device to display an image.

The number of GaN-based semiconductor light-emitting elements can be determined on the basis of specifications of the image display apparatus, and may be one or two or more. Examples of means (i.e., a light-guiding member) for guiding light emitted from the GaN-based semiconductor light-emitting element to the light transmission controlling device include an optical guiding member, a microlens array, a mirror, a reflector plate, and a condenser lens.

(5) Image Display Apparatus Having Fifth Structure

A (direct-view-type or projection-type) image display apparatus including ($\alpha$) a light-emitting element panel having GaN-based semiconductor light-emitting elements arranged in a two-dimensional matrix; and ($\beta$) a light transmission controlling device (light valve) that controls transmission/non-transmission of light emitted from each of the GaN-based semiconductor light-emitting elements, wherein the transmission/non-transmission of light emitted from each of the GaN-based semiconductor light-emitting elements is controlled by the light transmission controlling device to display an image.

(6) Image Display Apparatus Having Sixth Structure

A (direct-view-type or projection-type) color image display apparatus including (α) a red-light-emitting element panel having red-light-emitting semiconductor light-emitting elements arranged in a two-dimensional matrix, and a red-light transmission controlling device (light valve) that controls transmission/non-transmission of light emitted from the red-light-emitting element panel; (β) a green-light-emitting element panel having green-light-emitting GaN-based semiconductor light-emitting elements arranged in a two-dimensional matrix, and a green-light transmission controlling device (light valve) that controls transmission/non-transmission of light emitted from the green-light-emitting element panel; (γ) a blue-light-emitting element panel having blue-light-emitting GaN-based semiconductor light-emitting elements arranged in a two-dimensional matrix, and a blue-light transmission controlling device (light valve) that controls transmission/non-transmission of light emitted from the blue-light-emitting element panel; and (δ) means for combining the light emitted from each of the red-light transmission controlling device, the green-light transmission controlling device, and the blue-light transmission controlling device into a single optical path, wherein the transmission/non-transmission of the light emitted from the light-emitting element panels is controlled by the corresponding light transmission controlling devices to display an image.

(7) Image Display Apparatus Having Seventh Structure

A (direct-view-type or projection-type) field-sequential color image display apparatus including (α) a red-light-emitting semiconductor light-emitting element; (β) a green-light-emitting GaN-based semiconductor light-emitting element; (γ) a blue-light-emitting GaN-based semiconductor light-emitting element; (δ) means for combining light emitted from each of the red-light-emitting semiconductor light-emitting element, the green-light-emitting GaN-based semiconductor light-emitting element, and the blue-light-emitting GaN-based semiconductor light-emitting element into a single optical path; and (ε) a light transmission controlling device (light valve) that controls transmission/non-transmission of light emitted from the means for combining light into the optical path, wherein the transmission/non-transmission of the light emitted from each of the light-emitting elements is controlled by the light transmission controlling device to display an image.

(8) Image Display Apparatus Having Eighth Structure

A (direct-view-type or projection-type) field-sequential color image display apparatus including (α) a red-light-emitting element panel having red-light-emitting semiconductor light-emitting elements arranged in a two-dimensional matrix; (β) a green-light-emitting element panel having green-light-emitting GaN-based semiconductor light-emitting elements arranged in a two-dimensional matrix; (γ) a blue-light-emitting element panel having blue-light-emitting GaN-based semiconductor light-emitting elements arranged in a two-dimensional matrix; (δ) means for combining light emitted from each of the red-light-emitting element panel, the green-light-emitting element panel, and the blue-light-emitting element panel into a single optical path; and (ε) a light transmission controlling device (light valve) that controls transmission/non-transmission of light emitted from the means for combining light into the optical path, wherein the transmission/non-transmission of the light emitted from each of the light-emitting element panels is controlled by the light transmission controlling device to display an image.

(9) Image Display Apparatus Having Ninth Structure

A passive matrix-type or active matrix-type, direct-view-type color image display apparatus including a first light-emitting element; a second light-emitting element; and a third light-emitting element, wherein the light emission/non-emission state of each of the first light-emitting element, the second light-emitting element, and the third light-emitting element is controlled, and the emission state of each of the light-emitting elements is directly visually observed to display an image.

(10) Image Display Apparatus Having Tenth Structure

A passive matrix-type or active matrix-type, projection-type color image display apparatus including a first light-emitting element; a second light-emitting element; and a third light-emitting element, wherein the light emission/non-emission state of each of the first light-emitting element, the second light-emitting element, and the third light-emitting element is controlled, and projection is performed on a screen to display an image.

(11) Image Display Apparatus Having Eleventh Structure

A (direct-view-type or projection-type) field-sequential color image display apparatus including light-emitting element units arranged in a two-dimensional matrix; and a light transmission controlling device (light valve) that controls transmission/non-transmission of light emitted from each of the light-emitting element units, wherein the light emission/non-emission state of each of a first light-emitting element, a second light-emitting element, and a third light-emitting element in each of the light-emitting element units is controlled by time-sharing, and transmission/non-transmission of light emitted from each of the first light-emitting element, the second light-emitting element, and the third light-emitting element is controlled by the light transmission controlling device to display an image.

In producing the light-emitting element or the like according to an embodiment, in order to prevent the generation of thermal damage to the active layer, preferably, the relationship $T_{MAX} < 1,350 - 0.75\lambda$ is satisfied, and more preferably, the relationship $T_{MAX} < 1,250 - 0.75\lambda$ is satisfied, wherein $T_{MAX}$ (° C.) is the maximum growth temperature in the crystal growth of each of the GaN-based compound semiconductor layers formed after the formation of the active layer, and $\lambda$ is the light emission wavelength of the active layer. Examples of a method of forming each of the GaN-based compound semiconductor layers include metal-organic chemical vapor deposition (MOCVD), molecular beam epitaxy (MBE), and hydride vapor phase epitaxy (HVPE), in which a halogen contributes to a transportation or a reaction.

Examples of an organic gallium source gas used in MOCVD include trimethylgallium (TMG) gas and triethylgallium (TEG) gas. Examples of a nitrogen source gas used in MOCVD include ammonia gas and hydrazine gas. In the formation of a GaN-based compound semiconductor layer of n-conductivity type, for example, silicon (Si) may be added as an n-type impurity (n-type dopant). In the formation of a GaN-based compound semiconductor layer of p-conductivity type, for example, magnesium (Mg) may be added as a p-type impurity (p-type dopant). In the case where the GaN-based compound semiconductor layer contains aluminum (Al) or indium (In) as a constituent atom, trimethylaluminum (TMA) gas may be used as an Al source, and trimethylindium (TMI) gas may be used as an In source. Furthermore, monosilane gas ($SiH_4$ gas) may be used as a Si source, and cyclopentadienylmagnesium gas, methylcyclopentadienylmagnesium, or bis(cyclopentadienyl)magnesium ($Cp_2Mg$) may be used as a Mg source. Furthermore, in addition to Si, examples of the n-type impurity (n-type dopant) include Ge, Se, Sn, C, and Ti. In addition to Mg, examples of the p-type impurity (p-type dopant) include Zn, Cd, Be, Ca, Ba, and O.

The second electrode that is electrically connected to the second GaN-based compound semiconductor layer of p-conductivity type (or the second electrode provided on a contact layer) preferably has a single-layer structure or a multilayer structure containing at least one metal selected from the group consisting of palladium (Pd), platinum (Pt), nickel (Ni), aluminum (Al), titanium (Ti), gold (Au), and silver (Ag). Alternatively, a transparent conductive material such as indium tin oxide (ITO) may be used. Among these, silver (Ag), Ag/Ni, or Ag/Ni/Pt, which can reflect light with high efficiency is preferably used. On the other hand, the first electrode that is electrically connected to the first GaN-based compound semiconductor layer of n-conductivity type preferably has a single-layer structure or a multilayer structure containing at least one metal selected from the group consisting of gold (Au), silver (Ag), palladium (Pd), aluminum (Al), titanium (Ti), tungsten (W), copper (Cu), zinc (Zn), tin (Sn), and indium (In). Examples of the structure include Ti/Au, Ti/Al, and Ti/Pt/Au. The first electrode and the second electrode can be formed by physical vapor deposition (PVD) such as vacuum deposition or sputtering. The first electrode is electrically connected to the first GaN-based compound semiconductor layer. In this case, the first electrode may be disposed on the first GaN-based compound semiconductor layer or may be connected to the first GaN-based compound semiconductor layer, with a conductive material layer or a conductive light-emitting element formation substrate therebetween. The second electrode is electrically connected to the second GaN-based compound semiconductor layer. In this case, similarly, the second electrode may be disposed on the second GaN-based compound semiconductor layer or may be connected to the second GaN-based compound semiconductor layer, with a conductive material layer therebetween.

A pad electrode may be provided on each of the first electrode and the second electrode so as to establish electrical connection to an external electrode or circuit. The pad electrode preferably has a single-layer structure or a multilayer structure containing at least one metal selected from the group consisting of titanium (Ti), aluminum (Al), platinum (Pt), gold (Au), and nickel (Ni). The pad electrode may have a multilayer structure composed of Ti/Pt/Au or Ti/Au.

In an embodiment, the amount (luminance) of light emitted from the GaN-based semiconductor light-emitting element can be controlled by controlling the pulse width of the driving current, the pulse density of the driving current, or by combination of the pulse width and the pulse density of the driving current. In addition to this, the amount of light emission can be controlled by the peak current value of the driving current. This is because the effect of a change in the peak current value of the driving current on the light emission wavelength of the GaN-based semiconductor light-emitting element is small.

Specifically, for example, the amount (brightness or luminance) of light emitted from a GaN-based semiconductor light-emitting element can be controlled as follows. In a GaN-based semiconductor light-emitting element, $\lambda_0$ represents the peak current value of the driving current for obtaining a certain light emission wavelength $\lambda_0$, $P_0$ represents the pulse width of the driving current, and $T_{OP}$ represents a one-operation period of the GaN-based semiconductor light-emitting element or the like or a one-operation period in the method of driving the GaN-based semiconductor light-emitting element according to an embodiment. In this case, (1) the amount (luminance) of light emitted from the GaN-based semiconductor light-emitting element can be controlled by controlling (adjusting) the peak current value $I_0$ of the driving current; and (2) the amount (brightness or luminance) of light emitted from the GaN-based semiconductor light-emitting element can be controlled by controlling the pulse width $P_0$ of the driving current (pulse width control of driving current); and/or (3) the amount (brightness or luminance) of light emitted from the GaN-based semiconductor light-emitting element can be controlled by controlling the number of pulses (pulse density) having the pulse width $P_0$ in the one-operation period $T_{OP}$ of the GaN-based semiconductor light-emitting element (pulse density control of driving current).

The above-described control of the amount of light emitted from the GaN-based semiconductor light-emitting element can be achieved by a driving circuit for the GaN-based semiconductor light-emitting element, the driving circuit including (a) a pulse driving current supply unit that supplies the GaN-based semiconductor light-emitting element with a pulse driving current, (b) a pulse driving current setting unit that sets the pulse width and pulse density of the driving current, and (c) a unit that sets the peak current value.

Each of the light-emitting elements or the like including the preferred embodiments and configurations described above may have a face-up structure (i.e., a structure in which light generated in the active layer is emitted from the second GaN-based compound semiconductor layer) or a flip-chip structure (i.e., a structure in which light generated in the active layer is emitted from the first GaN-based compound semiconductor layer). Furthermore, the light-emitting element or the like according to an embodiment may have, for example, a shell-type structure or a surface-mounted structure.

Specific examples of the GaN-based semiconductor light-emitting element include a light-emitting diode (LED) and a semiconductor laser (LD). The structure and configuration of the GaN-based semiconductor light-emitting element are not particularly limited as long as the multilayer structure of GaN-based compound semiconductor layers has a light-emitting diode structure or a laser structure. Furthermore, in addition to the above-described light-emitting apparatuses including GaN-based semiconductor light-emitting elements and color conversion materials and (direct-view-type or projection-type) image display apparatuses, examples of the application fields of the light-emitting element or the like according to an embodiment include surface light source devices (backlights); liquid crystal display device assemblies including color liquid crystal display device assemblies; light sources for variable color illumination; displays; lamp fittings and lights in vehicles such as automobiles, electric trains, ships, and aircrafts (e.g., headlights, taillights, high-mounted stop lights, small lights, turn signal lamps, fog lights, interior lamps, meter-panel lights, light sources provided in various types of buttons, destination lamps, emergency lights, and emergency exit guide lights); various types of lamp fittings and lights in buildings (e.g., outdoor lights, interior lights, lighting equipment, emergency lights, and emergency exit guide lights); street lights; various types of indicating lamp fittings in traffic signals, advertising displays, machines, and apparatuses; lighting equipment and lighting parts in tunnels, underground passages, and the like; special illuminations in various inspection devices such as biological microscopes; sterilizers using light; deodorizing sterilizers combined with photocatalysts; exposure apparatuses for photographs and semiconductor lithography; and devices that modulates light to transmit information through spaces, optical fibers, or waveguides.

In the case where a light-emitting element or the like according to an embodiment is applied to a surface light source device, as described above, the light source includes a first light-emitting element that emits blue light, a second light-emitting element that emits green light, and a third light-emitting element that emits red light, and the light-emitting element or the like according to an embodiment can constitute at least one (one type) of the first light-emitting element, the second light-emitting element, and the third light-emitting element. However, the structure of the light source is not limited thereto. The light source in the surface light source device may be composed of one or a plurality of light-emitting apparatuses according to an embodiment. In addition, each of the number of first light-emitting elements, the number of second light-emitting elements, and the number of third light-emitting elements may be one or two or more. The surface light source device may be one of two types of surface light source devices (backlights) selected from a direct-type surface light source device, disclosed in, for example, Japanese Unexamined Utility Model Registration Application Publication No. 63-187120 or Japanese Unexamined Patent Application Publication No. 2002-277870, and an edge-light-type (also referred to as "side-light-type") surface light source device disclosed in, for example, Japanese Unexamined Patent Application Publication No. 2002-131552. The number of GaN-based semiconductor light-emitting elements is basically arbitrary and may be determined on the basis of the specifications of the surface light source device. The first light-emitting element, the second light-emitting element, and the third light-emitting element are arranged so as to face a liquid crystal display device, and a diffusion plate, an optical functional sheet group including a diffusion sheet, a prism sheet, and a polarization conversion sheet, and a reflection sheet are disposed between the liquid crystal display device and each of the first light-emitting element, the second light-emitting element, and the third light-emitting element.

In GaN-based semiconductor light-emitting elements in the related art, since the composition of each barrier layer is constant, holes injected from the second GaN-based compound semiconductor layer of p-conductivity type to a well layer constituting the active layer are unevenly distributed as a whole active layer, specifically, densely distributed at the second GaN-based compound semiconductor layer side. In contrast, the GaN-based semiconductor light-emitting element or the like according to an embodiment includes a varying-composition barrier layer. The composition of the varying-composition barrier layer varies in the thickness direction thereof so that the band-gap energy in a first region of the varying-composition barrier layer, the first region being adjacent to a boundary between a well layer disposed on a side closer to the second GaN-based compound semiconductor layer and the varying-composition barrier layer is lower than the band-gap energy in a second region of the varying-composition barrier layer, the second region being adjacent to a boundary between a well layer disposed on a side closer to the first GaN-based compound semiconductor layer and the varying-composition barrier layer. Therefore, the unevenness in the distribution of holes as a whole active layer, the holes being injected from the second GaN-based compound semiconductor layer of p-conductivity type to well layers constituting the active layer, can be reduced without changing the distribution of electrons injected from the first GaN-based compound semiconductor layer of n-conductivity type to the well layers constituting the active layer. As a result, a region where an electron and a hole are recombined expands over the active layer, as compared with GaN-based semiconductor light-emitting elements in the related art. Accordingly, a GaN-based semiconductor light-emitting element with a high luminous efficiency (high optical output) can be realized, and the problem of a decrease in the luminous efficiency in emission of light having a long wavelength can be solved by preventing the luminous efficiency at a high current density from decreasing. Furthermore, a region in the active layer where light can be emitted expands, and thus a decrease in luminance saturation at a high current density and a decrease in the amount of wavelength shift can be realized.

Furthermore, the GaN-based semiconductor light-emitting element having the first structure or the second structure includes a laminated structure including at least one laminate unit in which a GaN-based compound semiconductor layer of p-conductivity type and an undoped GaN-based compound semiconductor layer are laminated, or includes a third GaN-based compound semiconductor layer on which at least one undoped GaN-based compound semiconductor layer is provided on a side closer to the second GaN-based compound semiconductor layer. Therefore, it is possible to realize a higher luminous efficiency of the GaN-based semiconductor light-emitting element.

Additional features and advantages are described herein, and will be apparent from the following Detailed Description and the figures.

BRIEF DESCRIPTION OF THE FIGURES

FIG. 5 is a schematic view of a GaN-based semiconductor light-emitting element during a characteristic evaluation of the GaN-based semiconductor light-emitting element;

FIG. 6A is a schematic partial cross-sectional view of a GaN-based semiconductor light-emitting element of Example 4;

FIG. 6B is a view showing the structure of a first GaN-based compound semiconductor layer, an active layer, a laminated structure (third GaN-based compound semiconductor layer), and a second GaN-based compound semiconductor layer, etc. in the GaN-based semiconductor light-emitting element of Example 4;

FIG. 7 is a view showing the structure of a first GaN-based compound semiconductor layer, an active layer, a laminated structure (a third GaN-based compound semiconductor layer), and a second GaN-based compound semiconductor layer, etc. in a GaN-based semiconductor light-emitting element of Example 5;

FIG. 27 is a schematic view of a color liquid crystal display device assembly of Example 10.

DETAILED DESCRIPTION

The embodiments will now be described using Examples with reference to the drawings.

EXAMPLE 1

Figure 1A:
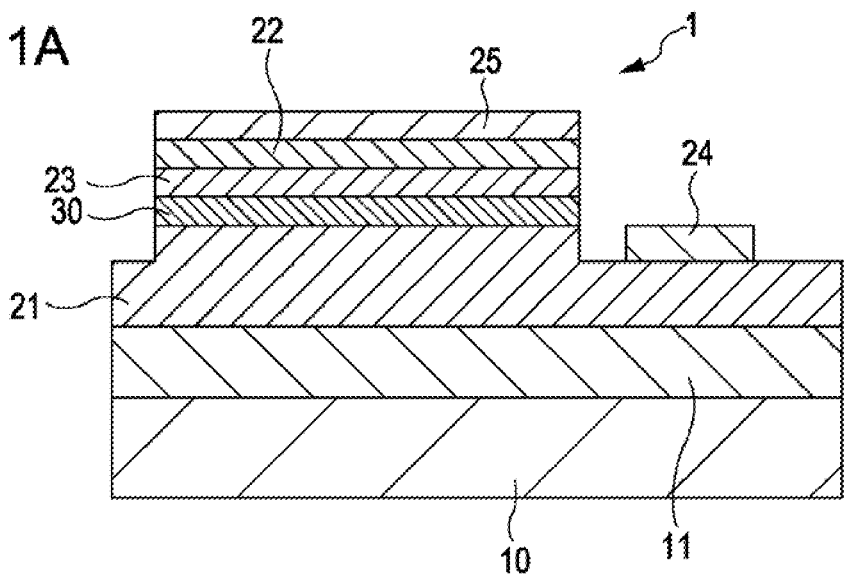
FIG. 1A is a schematic partial cross-sectional view of a GaN-based semiconductor light-emitting element of Example 1.
Figure 1B:
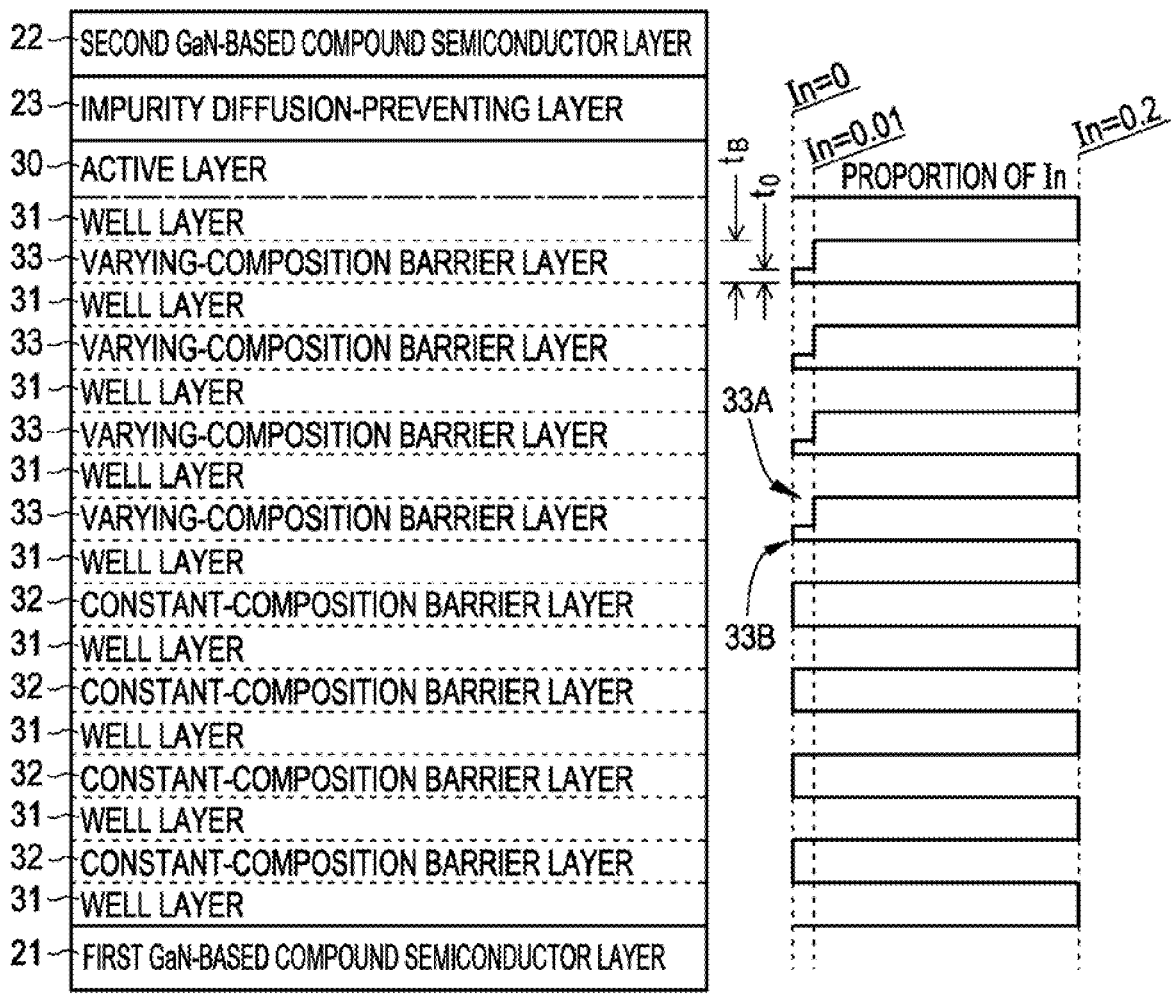
FIG. 1B includes a view showing a laminated state of well layers and barrier layers constituting an active layer of the GaN-based semiconductor light-emitting element of Example 1 and a diagram showing the proportion of indium (In) in the well layers and the barrier layers.

Example 1 relates to a GaN-based semiconductor light-emitting element according to an embodiment and a method of driving a GaN-based semiconductor light-emitting element according to an embodiment. FIG. 1A is a schematic partial cross-sectional view of a GaN-based semiconductor light-emitting element of Example 1. FIG. 1B shows a laminated state of well layers and barrier layers constituting an active layer and the proportion of indium (In) in the well layers and the barrier layers.

A GaN-based semiconductor light-emitting element 1 of Example 1 includes (A) a first GaN-based compound semiconductor layer 21 of n-conductivity type, (B) an active layer 30 having a multi-quantum well structure including well layers 31 and barrier layers that separate adjacent well layers 31, (C) a second GaN-based compound semiconductor layer 22 of p-conductivity type, (D) a first electrode 24 that is electrically connected to the first GaN-based compound semiconductor layer 21, and (E) a second electrode 25 that is electrically connected to the second GaN-based compound semiconductor layer 22.

In the GaN-based semiconductor light-emitting element 1, at least one of the barrier layers constituting the active layer 30 is composed of a varying-composition barrier layer 33. The composition of the varying-composition barrier layer 33 varies in the thickness direction thereof so that the band-gap energy in a first region 33A of the varying-composition barrier layer 33, the first region 33A being adjacent to a boundary between a well layer 31 disposed on a side closer to the second GaN-based compound semiconductor layer 22 and the varying-composition barrier layer 33, is lower than the band-gap energy in a second region 33B of the varying-composition barrier layer 33, the second region 33B being adjacent to a boundary between a well layer 31 disposed on a side closer to the first GaN-based compound semiconductor layer 21 and the varying-composition barrier layer 33. Specifically, in Example 1, the composition of the varying-composition barrier layer 33 varies stepwise in the thickness direction. More specifically, the composition of the varying-composition barrier layer 33 varies in the thickness direction in two steps. When the boundary between the well layer 31 disposed on the side closer to the first GaN-based compound semiconductor layer 21 and the varying-composition barrier layer 33 is assumed to be a reference, a position t₀ in the thickness direction at which the composition varies satisfies the following relationship:

$$0.01 t_B \leq t_0 \leq 0.5 t_B$$

wherein $t_B$ represents the thickness of the varying-composition barrier layer 33. Further specifically, the following relationship is satisfied:

$$t_B = 15 \text{ nm}$$

$$t_0 = 5 \text{ nm} (= t_B/3)$$

The number of steps of the variation in the composition of the varying-composition barrier layer 33 in the thickness direction is not limited to two. Alternatively, the composition of the varying-composition barrier layer 33 may vary in three or more steps.

The composition of the second region 33B of the varying-composition barrier layer 33, the second region 33B being adjacent to the boundary between the well layer 31 disposed on the side closer to the first GaN-based compound semiconductor layer 21 and the varying-composition barrier layer 33, is GaN. On the other hand, the composition of the first region 33A of the varying-composition barrier layer 33, the first region 33A being adjacent to the boundary between the well layer 31 disposed on the side closer to the second GaN-based compound semiconductor layer 22 and the varying-composition barrier layer 33, is $In_z Ga_{(1-z)} N$. Furthermore, the composition of each of the well layers 31 is $In_y Ga_{(1-y)} N$ (wherein y>z). In Example 1, y is 0.2 and z is 0.01. By adding indium, the band-gap energy becomes lower than the band-gap energy in the case where indium is not added.

In Example 1, the number of well layers 31 is 9, and the total number of barrier layers is 8. The number of varying-composition barrier layers 33 is ½ or more of the total number of barrier layers. More specifically, the number of varying-composition barrier layers 33 is 4. Furthermore, these varying-composition barrier layers 33 occupy positions closer to the second GaN-based compound semiconductor layer 22. Barrier layers other than the varying-composition barrier layers 33 are represented by constant-composition barrier layers 32. The composition of each of the constant-composition barrier layers 32 is GaN, and the thickness thereof is 15 nm.

The first GaN-based compound semiconductor layer 21 is composed of Si-doped GaN (GaN:Si) of n-conductivity type, and the second GaN-based compound semiconductor layer 22 is composed of Mg-doped GaN (Ga:Mg) of p-conductivity type. Furthermore, as described above, each of the well layers 31 is composed of $In_{0.2} Ga_{0.8} N$ and has a thickness of 3 nm. The active layer 30 has an area of $4 \times 10^{-10}$ m², and the GaN-based semiconductor light-emitting element 1 has a thickness of $5 \times 10^{-6}$ m. As shown in FIG. 1A, the GaN-based semiconductor light-emitting element 1 includes a light-emitting element formation substrate 10 and an underlayer 11 including a buffer layer and an undoped GaN layer disposed on the buffer layer.

In the GaN-based semiconductor light-emitting element 1 of Example 1, a current with a current density (operating current density) of 50 amperes/cm² or more, preferably 100 amperes/cm² or more, and further preferably 200 amperes/cm² or more is applied to the active layer 30.

A method of producing the GaN-based semiconductor light-emitting element of Example 1 will now be described.

Step-100

First, a sapphire substrate, the main surface of which is the C plane, is used as the light-emitting element formation substrate 10. The light-emitting element formation substrate 10 is cleaned in a carrier gas composed of hydrogen at a substrate temperature of 1,050° C. for 10 minutes, and the substrate temperature is then decreased to 500° C. A buffer layer composed of low-temperature GaN with a thickness of 30 nm is formed on the light-emitting element formation substrate 10 by crystal growth by metal-organic chemical vapor deposition (MOCVD) during which trimethylgallium (TMG) gas used as a gallium source is supplied while supplying ammonia gas used as a nitrogen source. After the crystal growth, the supply of TMG gas is temporarily stopped. Subsequently, the substrate temperature is increased to 1,020° C., the supply of TMG gas is then started again. Thus, an undoped GaN layer with a thickness of 1 μm is formed on the buffer layer by crystal growth. Accordingly, an underlayer 11 is formed. Subsequently, supply of monosilane gas ($SiH_4$ gas) used as a silicon source is started. Thereby, a first GaN-based compound semiconductor layer 21 of n-conductivity type composed of Si-doped GaN (GaN:Si) with a thickness of 3 μm is formed on the undoped GaN layer constituting the underlayer 11 by crystal growth. The doping concentration is about $5 \times 10^{18}$/cm³.

Step-110

Subsequently, the supply of TMG gas and $SiH_4$ gas is temporarily stopped, the carrier gas is switched from hydrogen gas to nitrogen gas, and the substrate temperature is decreased to 685° C. Triethylgallium (TEG) gas is used as a Ga source and trimethylindium (TMI) gas is used as an In source, and these gases are supplied by switching valves. Thereby, an active layer 30 having a multi-quantum well structure including nine well layers 31 composed of $In_{0.2} Ga_{0.8} N$ and eight barrier layers (specifically, constant-composition barrier layers 32 composed of GaN, and varying-composition barrier layers 33 each including a first region 33A composed of $In_{0.01} Ga_{0.99} N$ and a second region 33B composed of GaN) is formed. During the formation of the well layers 31, the substrate temperature is 685° C. During the formation of the constant-composition barrier layers 32 and the varying-composition barrier layers 33, the substrate temperature is 810° C. In this example, the light emission wavelength λ is 520 nm.

Step-120

After the formation of the active layer 30 having the multi-quantum well structure is completed, an impurity diffusion-preventing layer 23 composed of undoped GaN with a thickness of 5 nm is grown while increasing the substrate temperature to 800° C. The impurity diffusion-preventing layer 23 is formed in order to prevent a p-type impurity from diffusing into the active layer 30.

Step-130

Subsequently, the substrate temperature is increased to 850° C., and supply of TMG gas and bis(cyclopentadienyl) magnesium ($Cp_2Mg$) gas is started, thereby forming a second GaN-based compound semiconductor layer 22 composed of Mg-doped GaN (GaN:Mg) with a thickness of 100 nm by crystal growth. The doping concentration is about $5 \times 10^{19}$/cm³. Subsequently, a contact layer (not shown) composed of InGaN is formed by crystal growth. The supply of TMG gas and $Cp_2Mg$ gas is stopped, and the substrate temperature is decreased. The supply of ammonia gas is stopped at a substrate temperature of 600° C., and the substrate temperature is decreased to room temperature to complete the crystal growth.

Regarding the substrate temperature $T_{MAX}$ after the growth of the active layer 30, the relationship $T_{MAX} < 1,350 - 0.75\lambda$ (° C.) is satisfied, and preferably, the relationship $T_{MAX} < 1,250 - 0.75\lambda$ (° C.) is satisfied, wherein $\lambda$ (nm) is the light emission wavelength. By using such a substrate temperature $T_{MAX}$ after the growth of the active layer 30, thermal degradation of the active layer 30 can be suppressed, as described in Japanese Unexamined Patent Application Publication No. 2002-319702.

Step-140

After the crystal growth is completed, an annealing treatment is performed at 800° C. for ten minutes in a nitrogen gas atmosphere to activate the p-type impurity (p-type dopant).

Step-150

Subsequently, as in the ordinary wafer process and chip formation process for LEDs, a protective film (not shown) is formed, a second electrode 25 and a first electrode 24 are formed by photolithography, etching, and metal vapor deposition, and chips are then formed by dicing. Furthermore, resin molding and packaging of the chips are performed. Thus, a GaN-based semiconductor light-emitting element 1 of Example 1 (e.g., any of various types of light-emitting diodes having a shell-type structure, a surface-mounted structure, or the like) can be produced.

A GaN-based semiconductor light-emitting element of Comparative Example 1 was produced by the same method as used in Example 1 except that all eight barrier layers had a composition of GaN and a thickness of 15 nm.

In each of the GaN-based semiconductor light-emitting elements of Example 1 and Comparative Example 1, for the purpose of evaluation, the first GaN-based compound semiconductor layer 21 was partly exposed using lithography and etching, a second electrode composed of Ag/Ni was formed on the second GaN-based compound semiconductor layer 22, and a first electrode composed of Ti/Al was formed on the first GaN-based compound semiconductor layer 21. Probes were brought into contact with the first electrode and the second electrode. A driving current was supplied to the GaN-based semiconductor light-emitting element, and light emitted from the reverse face of the light-emitting element formation substrate 10 was detected. FIG. 5 is a schematic view of this evaluation process.

Figure 3:
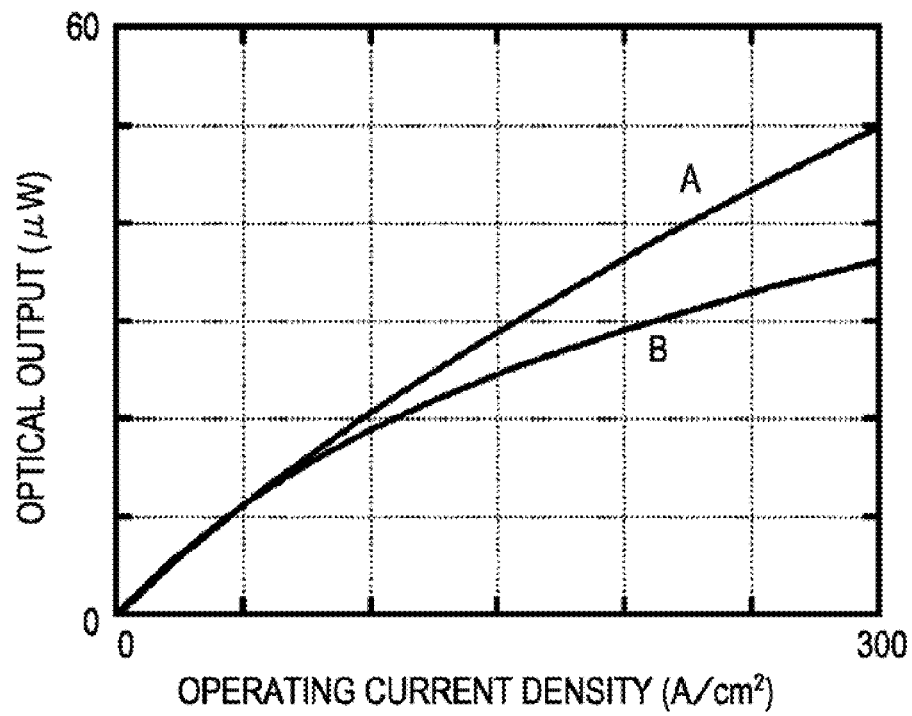
FIG. 3 is a graph showing the relationship between the operating current density (ampere/cm$^2$) and the optical output ($\mu$W) in each of GaN-based semiconductor light-emitting elements of Example 1 and Comparative Example 1.

FIG. 3 shows the relationship between the operating current density (ampere/cm$^2$) and the optical output ($\mu$W) in each of Example 1 and Comparative Example 1. As is apparent from FIG. 3, in Example 1 shown by curve "A", the optical output at the same operating current density certainly increased as compared with Comparative Example 1 shown by curve "B". The increase in the optical output could be confirmed over the entire range of operating current densities from an ordinary LED operating current density (50 amperes/cm$^2$) to a high operating current density (300 amperes/cm$^2$). The light emission wavelength of each of Example 1 and Comparative Example 1 is 520 nm.

Figure 4:
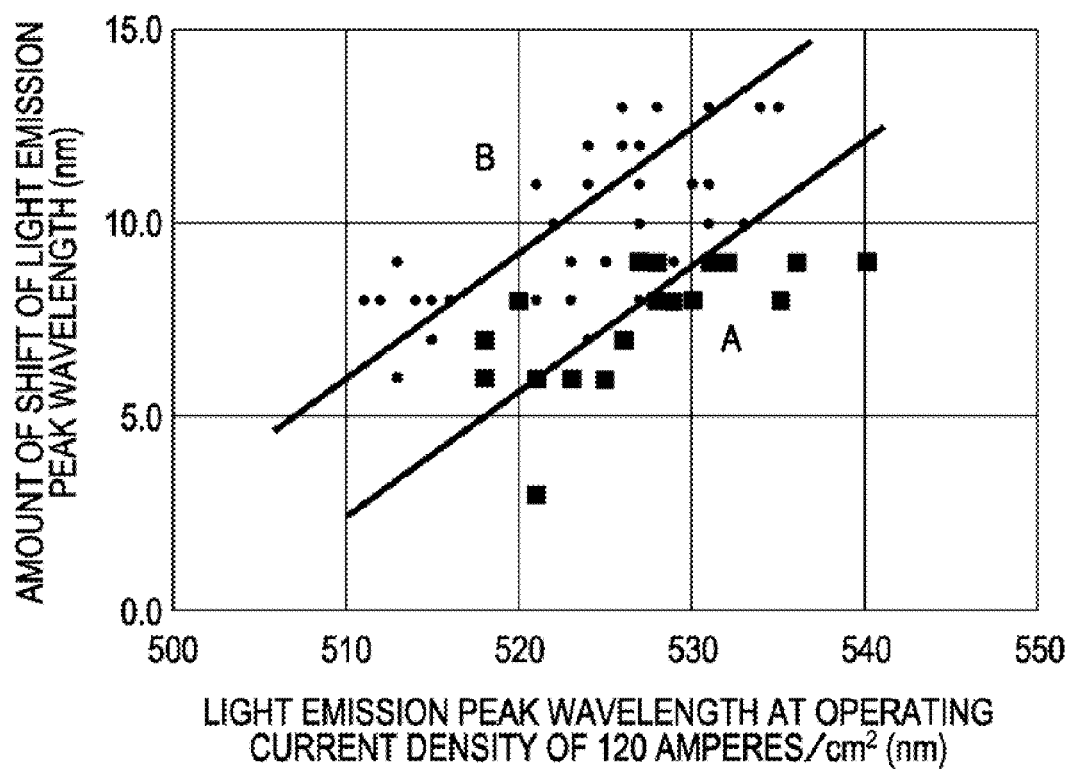
FIG. 4 is a graph showing the results of the amount of shift of light emission peak wavelength when the operating current density was changed from 60 amperes/cm$^2$ to 300 amperes/cm$^2$ in the GaN-based semiconductor light-emitting elements of Example 1 and Comparative Example 1.

FIG. 4 shows the results of the amount of shift of light emission peak wavelength when the operating current density was changed from 60 amperes/cm$^2$ to 300 amperes/cm$^2$. In FIG. 4, the vertical axis represents the amount of shift of light emission peak wavelength (units: nm), and the horizontal axis represents the light emission peak wavelength at an operating current density of 120 amperes/cm$^2$. In FIG. 4, black squares and straight line A show data of the GaN-based semiconductor light-emitting element of Example 1, and black circles and straight line B show data of the GaN-based semiconductor light-emitting element of Comparative Example 1. As is apparent from FIG. 4, the amount of shift of light emission wavelength in Example 1 was smaller than that in Comparative Example 1.

As described above, in Example 1 and Examples 2 to 5 described below, a GaN-based semiconductor light-emitting element having a high luminous efficiency (high optical output) can be realized by providing the varying-composition barrier layers. In addition, the problem of a decrease in the luminous efficiency in emission of light having a long wavelength can be solved by preventing the luminous efficiency at a high current density from decreasing. Furthermore, the amount of shift of the wavelength at a high current density can be decreased, and the electric power consumption of an image display apparatus can be reduced. The pulse width in pulse driving can be decreased, and thus the lifetime of the GaN-based semiconductor light-emitting element can be increased.

EXAMPLE 2

Figure 2:
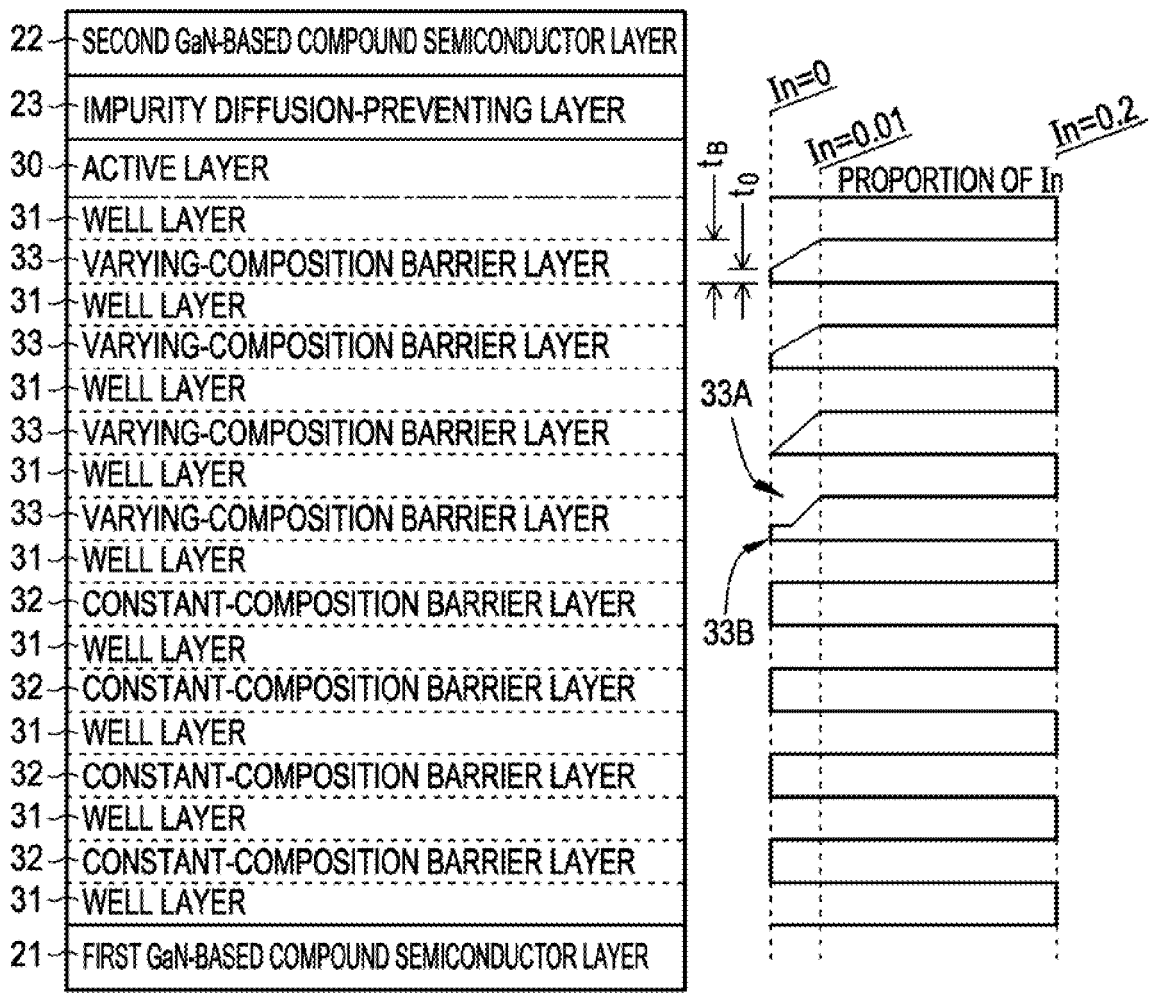
FIG. 2 includes a view showing a laminated state of well layers and barrier layers constituting an active layer of a GaN-based semiconductor light-emitting element of Example 2 and a diagram showing the proportion of indium (In) in the well layers and the barrier layers.

Example 2 is a modification of Example 1. In Example 1, the composition of each of the varying-composition barrier layers 33 varies stepwise in the thickness direction. In contrast, in Example 2, the composition of each of the varying-composition barrier layers 33 continuously varies in the thickness direction. Specifically, the composition of a second region 33B of a varying-composition barrier layer 33, the second region 33B being adjacent to the boundary between a well layer 31 disposed on the side closer to a first GaN-based compound semiconductor layer 21 and the varying-composition barrier layer 33, is GaN. On the other hand, the composition of a first region 33A of the varying-composition barrier layer 33, the first region 33A being adjacent to the boundary between a well layer 31 disposed on the side closer to a second GaN-based compound semiconductor layer 22 and the varying-composition barrier layer 33, is In$_z$Ga$_{(1-z)}$N. Furthermore, the composition of each of the well layers 31 is In$_y$Ga$_{(1-y)}$N (wherein y>z). In Example 2, y is 0.2 and z is 0.01. FIG. 2 shows a laminated state of the well layers and the barrier layers constituting an active layer and the proportion of indium (In) in the well layers and the barrier layers. As shown in FIG. 2, the indium (In) content linearly varies from the second region 33B to the first region 33A. The variation in the In content from the second region 33B to the first region 33A may be any of the variation patterns shown in the right side of FIG. 2. Specifically, as shown in the first and second varying-composition barrier layers 33 from the top of the right side of FIG. 2, the composition, e.g., GaN, of the second region 33B of the varying-composition barrier layer 33 may continue to some extent and the In content may then linearly vary. As shown in the third varying-composition barrier layer 33 from the top of the right side of FIG. 2, the In content may linearly vary from the second region 33B of the varying-composition barrier layer 33. Alternatively, as shown in the fourth varying-composition barrier layer 33 from the top of the right side of FIG. 2, a linear variation may be combined with the stepwise variation in the In content of Example 1. Furthermore, the variation in the In content is not limited to a linear variation. Alternatively, the In content may vary so as to form a curve that is convex in the upward direction or a curve that is concave in the upward direction.

The configuration and structure of the GaN-based semiconductor light-emitting element of Example 2 can be the same as those of the GaN-based semiconductor light-emitting element of Example 1 except for the above point, and thus the detailed description thereof is omitted.

EXAMPLE 3

Example 3 is also a modification of Example 1. In Example 1, the composition of the second region 33B of each of the varying-composition barrier layers 33 is GaN, the composition of the first region 33A thereof is $In_zGa_{(1-z)}N$, and each of the composition of the well layers 31 is $In_yGa_{(1-y)}N$. In contrast, in Example 3, the composition of a second region 33B of a varying-composition barrier layer 33, the second region 33B being adjacent to the boundary between a well layer 31 disposed on the side closer to a first GaN-based compound semiconductor layer 21 and the varying-composition barrier layer 33 is AlGaN, the composition of a first region 33A of the varying-composition barrier layer 33, the first region 33A being adjacent to the boundary between a well layer 31 disposed on the side closer to a second GaN-based compound semiconductor layer 22 and the varying-composition barrier layer 33 is GaN, and the composition of each of the well layers 31 is $In_yGa_{(1-y)}N$ (wherein y=0.2). Alternatively, the composition of the second region 33B of the varying-composition barrier layer 33 is AlGaN, the composition of the first region 33A of the varying-composition barrier layer 33 is $In_zGa_{(1-z)}N$ (wherein z=0.01), and the composition of each of the well layers 31 is $In_yGa_{(1-y)}N$ (wherein y=0.2). The composition of the varying-composition barrier layer 33 varies stepwise in the thickness direction. By adding aluminum, the band-gap energy becomes higher than the bang-gap energy in the case where aluminum is not added.

The configuration and structure of the GaN-based semiconductor light-emitting element of Example 3 can be the same as those of the GaN-based semiconductor light-emitting element of Example 1 except for the above point, and thus the detailed description thereof is omitted. In Example 3, the composition of the varying-composition barrier layer 33 may continuously vary in the thickness direction as in Example 2.

EXAMPLE 4

Example 4 is also a modification of Example 1, and relates to GaN-based semiconductor light-emitting elements according to a first structure and a second structure. FIG. 6A is a schematic partial cross-sectional view of a GaN-based semiconductor light-emitting element 1A of Example 4. FIG. 6B shows the structure of a first GaN-based compound semiconductor layer, an active layer, a laminated structure (third GaN-based compound semiconductor layer), and a second GaN-based compound semiconductor layer, etc. in the GaN-based semiconductor light-emitting element 1A. In FIG. 6A etc., an active layer 30 is represented as a single layer.

In the GaN-based semiconductor light-emitting element 1A of Example 4, from the active layer side, (F) an impurity diffusion-preventing layer 23 for preventing a p-type impurity from diffusing into the active layer 30, the impurity diffusion-preventing layer 23 being composed of an undoped GaN-based compound semiconductor, and (G) a laminated structure 40 according to the GaN-based semiconductor light-emitting element having the first structure, or (G) a third GaN-based compound semiconductor layer 50 of p-conductivity type according to the GaN-based semiconductor light-emitting element having the second structure are further provided in that order between the active layer 30 and the second GaN-based compound semiconductor layer 22.

According to the GaN-based semiconductor light-emitting element having the first structure, the laminated structure 40 includes at least one laminate unit 41, specifically, two laminate units 41 in Example 4, in which a GaN-based compound semiconductor layer 42 of p-conductivity type and an undoped GaN-based compound semiconductor layer 43 are laminated in that order from the active layer side.

Meanwhile, according to the GaN-based semiconductor light-emitting element having the second structure, at least one undoped GaN-based compound semiconductor layer 53 is provided on a side of the third GaN-based compound semiconductor layer 50, the side being closer to the second GaN-based compound semiconductor layer 22. Specifically, in Example 4, two undoped GaN-based compound semiconductor layers 53 are provided.

In Example 4, the GaN-based compound semiconductor layer 42 of p-conductivity type and the undoped GaN-based compound semiconductor layer 43 which constitute the laminate unit 41 have the same composition, specifically, GaN. Meanwhile, the third GaN-based compound semiconductor layer 50 of p-conductivity type and the undoped GaN-based compound semiconductor layer 53 provided in the third GaN-based compound semiconductor layer 50 have the same composition, specifically, GaN. The p-type impurity concentration of the GaN-based compound semiconductor layer 42 of p-conductivity type constituting the laminate unit 41, or the p-type impurity concentration of the third GaN-based compound semiconductor layer 50 is in the range of $1 \times 10^{18}/cm^3$ to $4 \times 10^{20}/cm^3$, specifically, $5 \times 10^{19}/cm^3$.

Furthermore, the thickness of the GaN-based compound semiconductor layer 42 of p-conductivity type constituting the laminate unit 41 is 5 nm. The thickness of the undoped GaN-based compound semiconductor layer 43 constituting the laminate unit 41 (or the thickness of the undoped GaN-based compound semiconductor layers 53 provided in the third GaN-based compound semiconductor layer 50) is 13 nm. The thickness of the laminated structure 40 (or the thickness of the third GaN-based compound semiconductor layer 50) is 36 nm (=18 nm×2).

A method of producing a GaN-based semiconductor light-emitting element of Example 4 will now be described.

Step-400

First, by performing the same steps as Step-100 and Step-110 in Example 1, an underlayer 11, a first GaN-based compound semiconductor layer 21, and an active layer 30 having a multi-quantum well structure including well layers 31 and barrier layers 32 and 33 are formed on a light-emitting element formation substrate 10.

Step-410

After the formation of the active layer 30 having the multi-quantum well structure is completed, an impurity diffusion-preventing layer 23 composed of undoped GaN with a thickness of 5 nm is grown while increasing the substrate temperature to 800° C.

Step-420

Subsequently, supply of bis(cyclopentadienyl)magnesium ($Cp_2Mg$) gas used as a Mg source is started while the substrate temperature is maintained at 800° C. Thereby, a GaN-based compound semiconductor layer 42 of p-conductivity type (specifically, Mg-doped GaN layer 42) is grown so as to have a thickness of 5 nm. Subsequently, in the state in which the supply of $Cp_2Mg$ gas is stopped, an undoped GaN-based compound semiconductor layer 43 (specifically, undoped GaN layer 43) is grown so as to have a thickness of 13 nm. The Mg-doped GaN layer 42 with a thickness of 5 nm and the undoped GaN layer 43 with a thickness of 13 nm are repeatedly grown twice in this manner. The doping concentration of Mg is about $5 \times 10^{19}/cm^3$. As a result, a laminated structure 40 including at least one laminate unit 41 in which the GaN-based compound semiconductor layer 42 of p-conductivity type and the undoped GaN-based compound semiconductor layer 43 are laminated in that order from the active layer side can be obtained. Alternatively, a third GaN-based compound semiconductor layer 50 including at least one undoped GaN-based compound semiconductor layer 53 (undoped GaN layer 53) on the side closer to the second GaN-based compound semiconductor layer 22 can be obtained.

Step-430

Subsequently, the supply of TEG gas and Cp$_2$Mg gas is temporarily stopped, and the carrier gas is switched from nitrogen to hydrogen. The substrate temperature is increased to 850° C., and supply of TMG gas and Cp$_2$Mg gas is started, thereby forming a second GaN-based compound semiconductor layer 22 composed of Mg-doped GaN (GaN:Mg) with a thickness of 100 nm by crystal growth. The doping concentration is about $5 \times 10^{19}/cm^3$. Subsequently, a contact layer (not shown) composed of InGaN is formed by crystal growth. The supply of TMG gas and Cp$_2$Mg gas is stopped, and the substrate temperature is decreased. The supply of ammonia gas is stopped at a substrate temperature of 600° C., and the substrate temperature is decreased to room temperature to complete the crystal growth.

Regarding the substrate temperature $T_{MAX}$ after the growth of the active layer 30, as in Example 1, the relationship $T_{MAX} < 1,350 - 0.75\lambda$ (° C.) is satisfied, and preferably, the relationship $T_{MAX} < 1,250 - 0.75\lambda$ (° C.) is satisfied, wherein $\lambda$ (nm) is the light emission wavelength. By using such a substrate temperature $T_{MAX}$ after the growth of the active layer 30, thermal degradation of the active layer 30 can be suppressed.

Step-440

After the crystal growth is completed, an annealing treatment is performed at 800° C. for ten minutes in a nitrogen gas atmosphere to activate the p-type impurity (p-type dopant).

Step-450

Subsequently, as in the ordinary wafer process and chip formation process for LEDs, a protective film (not shown) is formed, a second electrode 25 and a first electrode 24 are formed by photolithography, etching, and metal vapor deposition, and chips are then formed by dicing. Furthermore, resin molding and packaging of the chips are performed. Thus, a GaN-based semiconductor light-emitting element 1A of Example 4 (e.g., any of various types of light-emitting diodes having a shell-type structure, a surface-mounted structure, or the like) can be produced.

In Example 4, it is assumed that the hole concentration in the active layer is increased by forming the laminated structure 40 including the undoped GaN-based compound semiconductor layer 43 (or the third GaN-based compound semiconductor layer 50 including the undoped GaN-based compound semiconductor layer 53) between the active layer 30 and the second GaN-based compound semiconductor layer 22. Consequently, a higher luminous efficiency can be realized in the range from a low operating current density to a high operating current density.

EXAMPLE 5

Example 5 relates to a modification of the GaN-based semiconductor light-emitting element of Example 4.

FIG. 7 shows the structure of a first GaN-based compound semiconductor layer, an active layer, a laminated structure (a third GaN-based compound semiconductor layer), and a second GaN-based compound semiconductor layer, etc. In a GaN-based semiconductor light-emitting element 1A of Example 5, an undoped GaN-based compound semiconductor layer 143 constituting a laminate unit 141 has a GaN-based compound semiconductor layer, the composition of which contains indium (specifically, an InGaN layer). Alternatively, an undoped GaN-based compound semiconductor layer 153 provided in a third GaN-based compound semiconductor layer 150 has a GaN-based compound semiconductor layer, the composition of which contains indium (specifically, an InGaN layer).

Alternatively, the undoped GaN-based compound semiconductor layer 143 constituting the laminate unit 141 has a three-layer structure including a first layer 143A having the same composition as the GaN-based compound semiconductor layer 42 of p-conductivity type constituting the laminate unit 141, a second layer 143B having the composition that is the same as that of the first layer 143A and that further contains indium, and a third layer 143C having the same composition as the first layer 143A. Specifically, the undoped GaN-based compound semiconductor layer 143 constituting the laminate unit 141 has a three-layer structure including the first layer 143A composed of undoped GaN, the second layer 143B composed of undoped $In_xGa_{(1-x)}N$ (wherein $0 < x \leq 0.3$), and the third layer 143C composed of undoped GaN. Furthermore, an active layer 30 includes an $In_yGa_{(1-y)}N$ layer, wherein the relationship $x \leq y$ is satisfied.

Meanwhile, the undoped GaN-based compound semiconductor layer 153 provided in the third GaN-based compound semiconductor layer 150 has a three-layer structure including a first layer 153A having the same composition as the third GaN-based compound semiconductor layer 150 of p-conductivity type, a second layer 153B having the composition that is the same as that of the first layer 153A and that further contains indium, and a third layer 153C having the same composition as the first layer 153A. Specifically, the undoped GaN-based compound semiconductor layer 153 provided in the third GaN-based compound semiconductor layer 150 has a three-layer structure including the first layer 153A composed of undoped GaN, the second layer 153B composed of undoped $In_xGa_{(1-x)}N$ (wherein $0 < x \leq 0.3$), and the third layer 153C composed of undoped GaN. Furthermore, the active layer 30 includes an $In_yGa_{(1-y)}N$ layer, wherein the relationship $x \leq y$ is satisfied.

More specifically, in Example 5, x is 0.23, and y is 0.20. The difference in the In content can be achieved by forming the GaN-based compound semiconductor layer (second layer 143B), the composition of which contains indium, in the undoped GaN-based compound semiconductor layer 143 constituting the laminate unit 141 at a temperature higher than the temperature at which the GaN-based compound semiconductor layer (specifically, the well layer), the composition of which contains indium, in the active layer 30 is formed. Alternatively, the difference in the In content can be achieved by forming the GaN-based compound semiconductor layer (second layer 153B), the composition of which contains indium, in the undoped GaN-based compound semiconductor layer 153 provided in the third GaN-based compound semiconductor layer 150 at a temperature higher than the temperature at which the GaN-based compound semiconductor layer (specifically, the well layer), the composition of which contains indium, in the active layer 30 is formed. When the relationship $x \leq y$ is satisfied, the band-gap of the second layer 143B or 153B increases. As a result, the light generated in the active layer 30 is not readily absorbed by the second layer 143B or 153B.

A method of producing a GaN-based semiconductor light-emitting element in Example 5 will now be described. As a whole, the resulting GaN-based semiconductor light-emitting element 1A has substantially the same structure as that shown in FIG. 6A.

Step-500

First, as in Step-400 and Step-410 in Example 4, an underlayer 11 and a first GaN-based compound semiconductor layer 21 are formed on a light-emitting element formation substrate 10, and an active layer 30 and an impurity diffusion-preventing layer 23 are further formed thereon.

Step-510

Next, by starting supply of $Cp_2Mg$ gas used as a Mg source, a GaN-based compound semiconductor layer 42 of p-conductivity type (specifically, Mg-doped GaN layer 42) or a third GaN-based compound semiconductor layer 150 is grown so as to have a thickness of 5 nm. Subsequently, in the state in which the supply of $Cp_2Mg$ gas is stopped, an undoped GaN-based compound semiconductor layer (a first layer 143A having the same composition as the GaN-based compound semiconductor layer 42 of p-conductivity type constituting the laminate unit 141 or a first layer 153A having the same composition as the third GaN-based compound semiconductor layer 150 of p-conductivity type) is grown so as to have a thickness of 5 nm. Subsequently, by starting supply of trimethylindium (TMI) gas used as an In source, an InGaN layer (a second layer 143B having the composition that is the same as that of the first layer 143A and that further contains indium, or a second layer 153B having the composition that is the same as that of the first layer 153A and that further contains indium) is grown so as to have a thickness of 3 nm. Next, in the state in which the supply of TMI gas is stopped, a GaN layer (a third layer 143C having the same composition as the first layer 143A or a third layer 153C having the same composition as the first layer 153A) is grown so as to have a thickness of 5 nm. The substrate temperature during the growth of the first layer 143A or 153A, the second layer 143B or 153B, and the third layer 143C or 153C is 760° C. This temperature is higher than 750° C., which is the substrate temperature during the growth of the active layer 30. As a result, the compositional proportion of In of the second layer 143B or 153B composed of InGaN is 0.2. The doping concentration of Mg is about $5 \times 10^{19}/cm^3$.

In such a manner, at a temperature (specifically, 760° C. in Example 5) higher than the temperature (specifically 750° C. in Example 5) at which the GaN-based compound semiconductor layer, the composition of which contains indium, in the active layer 30 is formed, the GaN-based compound semiconductor layer (second layer 143B), the composition of which contains indium, in the undoped GaN-based compound semiconductor layer 143 constituting the laminate unit 141 is formed, or the GaN-based compound semiconductor layer (second layer 153B), the composition of which contains indium, in the undoped GaN-based compound semiconductor layer 153 provided in the third GaN-based compound semiconductor layer 150 is formed.

The Mg-doped GaN layer 42 with a thickness of 5 nm and the undoped GaN-based compound semiconductor layer 143 with a thickness of 13 nm are repeatedly grown twice. As a result, a laminated structure 140 including at least one laminate unit 141 in which the GaN-based compound semiconductor layer 42 of p-conductivity type and the undoped GaN-based compound semiconductor layer 143 are laminated in that order from the active layer side can be obtained. Alternatively, the third GaN-based compound semiconductor layer 150 including at least one undoped GaN-based compound semiconductor layer 153 (undoped GaN layer 153) on the side closer to the second GaN-based compound semiconductor layer 22 can be obtained.

Step-520

Subsequently, by performing the same steps as Step-430 to Step-450 in Example 4, a GaN-based semiconductor light-emitting element 1A of Example 5 (e.g., any of various types of light-emitting diodes having a shell-type structure, a surface-mounted structure, or the like) can be produced.

In Example 5, the undoped GaN-based compound semiconductor layer 143 constituting the laminate unit 141 includes the GaN-based compound semiconductor layer (second layer 143B), the composition of which contains indium, or the undoped GaN-based compound semiconductor layer 153 provided in the third GaN-based compound semiconductor layer 150 includes the GaN-based compound semiconductor layer (second layer 153B), the composition of which contains indium. Since the composition of the second layer 143B or 153B contains indium, the band-gap of the second layer 143B or 153B is smaller than that of the first layer 143A or 153A and that of the third layer 143C or 153C, and thus a high hole concentration can be maintained. As a result, the hole concentration in the active layer can be further increased. Consequently, in the GaN-based semiconductor light-emitting element of Example 5, a higher luminous efficiency can be achieved at the same operating current density compared with Example 4.

EXAMPLE 6

Example 6 relates to light-emitting element assemblies according to embodiments and image display apparatuses according to embodiments.

Figure 8:
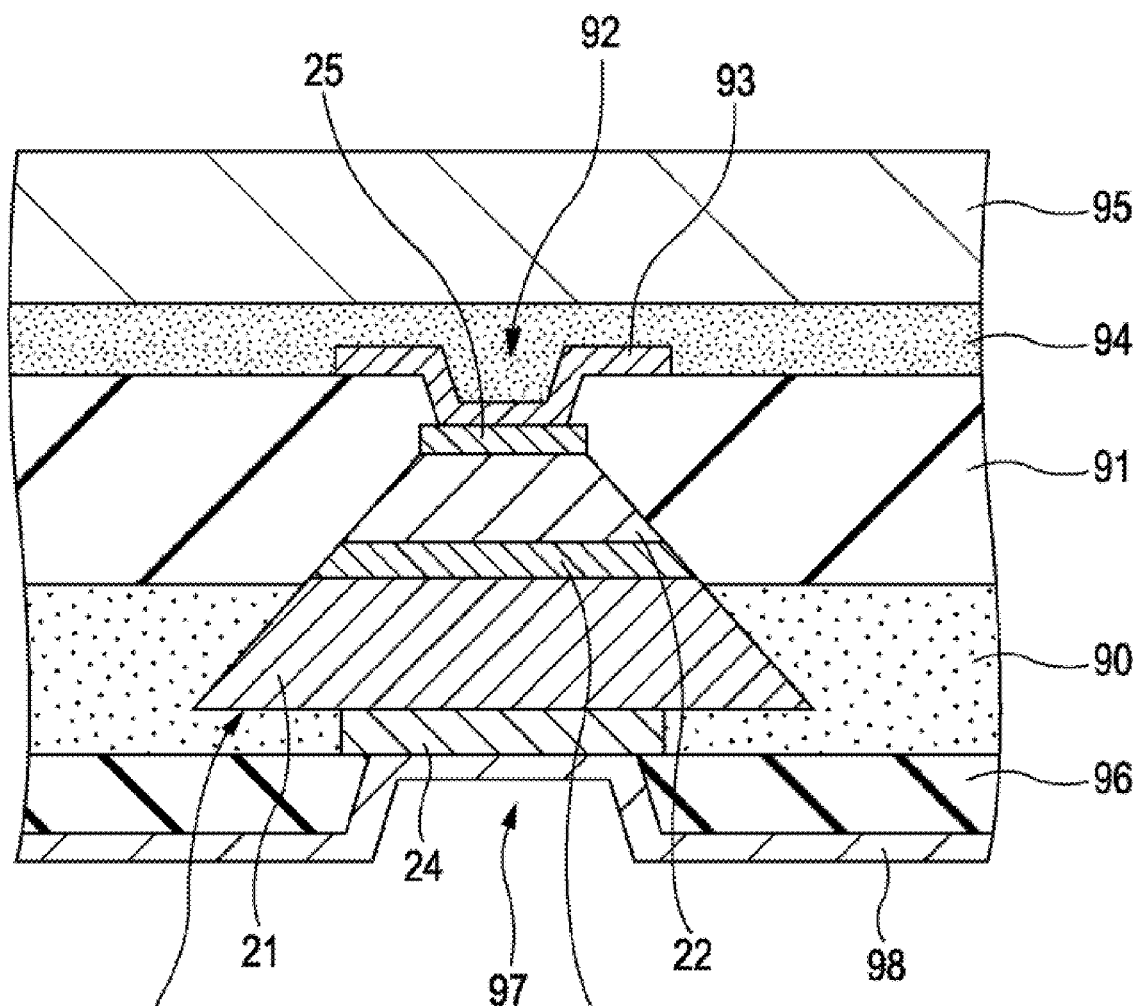
FIG. 8 is a schematic partial cross-sectional view of a light-emitting element assembly of Example 6.
Figure 9A:
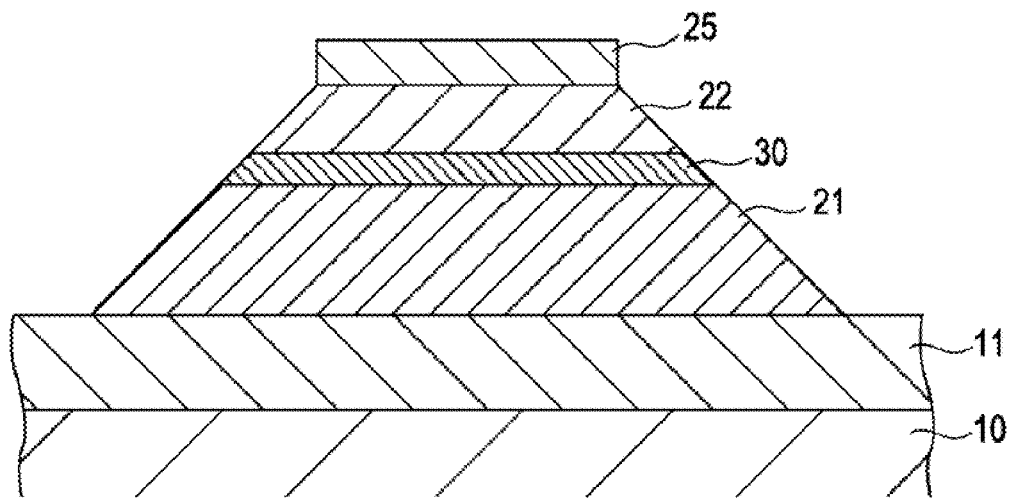
FIGS. 9A and 9B are schematic cross-sectional views of a GaN-based semiconductor light-emitting element, etc. illustrating a method of producing the light-emitting element assembly of Example 6.
Figure 9B:
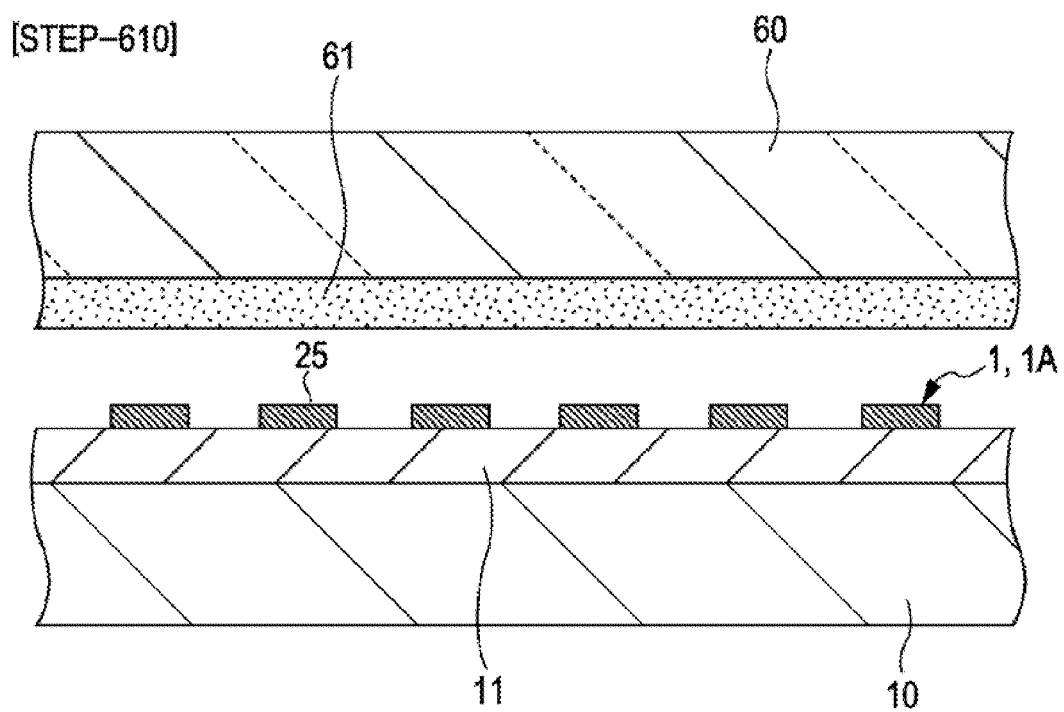

FIG. 8 is a schematic partial cross-sectional view of a light-emitting element assembly of Example 6. As shown in FIG. 8, the light-emitting element assembly of Example 6 includes any of the GaN-based semiconductor light-emitting elements 1 and 1A of Examples 1 to 5 described above and a supporting member having the light-emitting element 1 or 1A thereon. In FIG. 8, the positional relationship between the GaN-based semiconductor light-emitting element 1 or 1A and the supporting member in the vertical direction is reversely shown. Furthermore, an image display apparatus of Example 6 includes any of the GaN-based semiconductor light-emitting elements 1 and 1A of Examples 1 to 5, or a light-emitting element assembly of Example 6 in order to display an image.

A method of producing a light-emitting element assembly of Example 6 will now be described with reference to FIGS. 9A, 9B, 10A, 10B, 11A, 11B, 12A, 12B, 13A, and 13B.

Step-600

First, for example, the same steps as Step-100 to Step-140 of Example 1 are performed, and the steps up to the formation of a second electrode 25 by photolithography, etching, and metal vapor deposition in Step-150 of Example 1 are then further performed. Alternatively, the same steps as Step-400 to Step-440 of Example 4 are performed, and the steps up to the formation of a second electrode 25 by photolithography, etching, and metal vapor deposition in Step-450 of Example 4 are then further performed. Alternatively, the same steps as Step-500 to Step-520 of Example 2 are performed (up to the formation of a second electrode 25 by photolithography, etching, and metal vapor deposition in Step-520). Thus, a GaN-based semiconductor light-emitting element 1 or 1A having a trapezoidal cross section shown in FIG. 9A can be prepared.

Step-610

Next, GaN-based semiconductor light-emitting elements 1 or 1A are temporarily fixed onto a temporary fixing substrate 60 with second electrodes 25 therebetween. Specifically, the temporary fixing substrate 60 composed of a glass substrate having an adhesion layer 61 composed of an uncured adhesive on a surface thereof is prepared. The GaN-based semiconductor light-emitting elements 1 or 1A are bonded to the adhesion layer 61, and the adhesion layer 61 is then cured. Thus, the GaN-based semiconductor light-emitting elements 1 or 1A can be temporarily fixed onto the temporary fixing substrate 60 (see FIGS. 9B and 10A).

Step-620

Figure 10A:
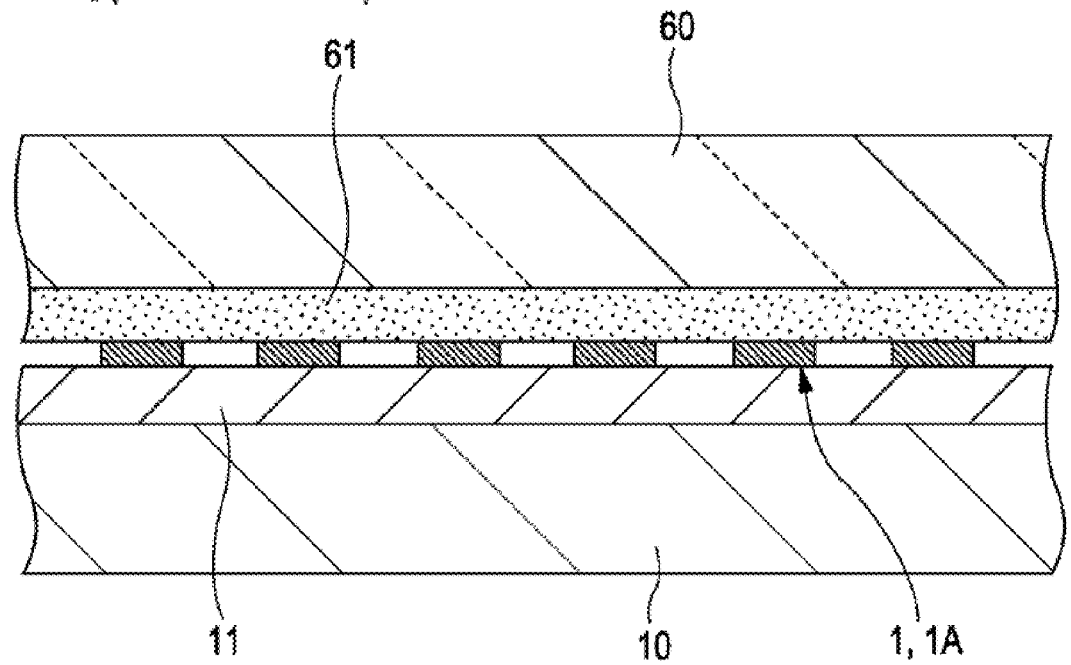
FIGS. 10A and 10B are schematic cross-sectional views of the GaN-based semiconductor light-emitting element, etc. after the step shown in FIG. 9B has been performed in the method of producing the light-emitting element assembly of Example 6.
Figure 10B:
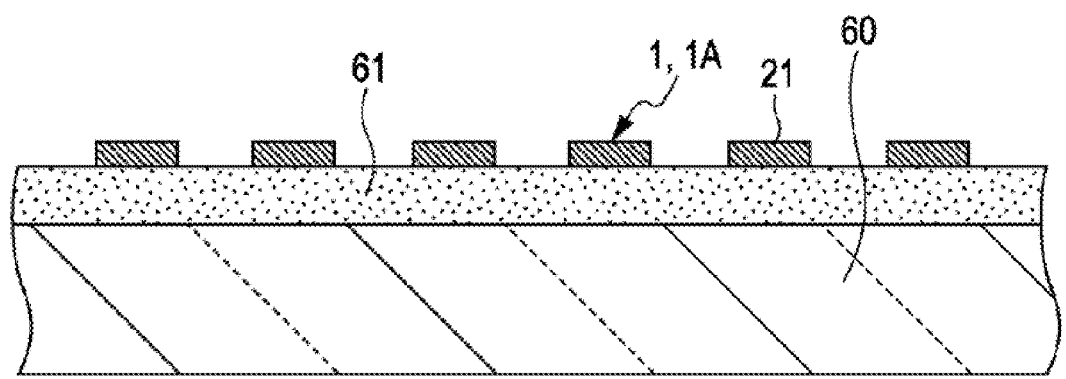

Subsequently, the GaN-based semiconductor light-emitting elements 1 or 1A are detached from the light-emitting element formation substrate 10 (see FIG. 10B). Specifically, the thickness of the light-emitting element formation substrate 10 is decreased by lapping from the reverse face. Next, the light-emitting element formation substrate 10 and the underlayer 11 are removed by wet etching to expose the first GaN-based compound semiconductor layer 21.

In addition to the glass substrate, examples of the material constituting the temporary fixing substrate 60 further include a metal plate, an alloy plate, a ceramic plate, and a plastic plate. In addition to the method in which an adhesive is used, examples of the method of temporarily fixing the GaN-based semiconductor light-emitting elements to the temporary fixing substrate 60 further include a metal bonding method, a semiconductor bonding method, and a metal-semiconductor bonding method. In addition to the etching method, examples of the method of removing the light-emitting element formation substrate 10 etc. from the GaN-based semiconductor light-emitting elements further include a laser ablation method and a heating method.

Step-630

Next, a first electrode 24 is formed on the bottom surface of the exposed first GaN-based compound semiconductor layer 21 of each GaN-based semiconductor light-emitting element 1 or 1A. Specifically, first, a resist layer is formed on the entire surface by lithography. Openings are then formed in portions of the resist layer provided on the bottom surface of the first GaN-based compound semiconductor layer 21 on which the first electrodes 24 are to be formed. Subsequently, the first electrodes 24 each composed of a multilayer film in which, for example, Au, Pt, Ti, Au, AuGe, and Pd are laminated in that order is formed on the entire surface by a PVD method, such as vacuum deposition or sputtering. The resist layer and the multilayer film on the resist layer are then removed.

Step-640

A transfer substrate 70 having a slightly adhesive layer 71 composed of silicone rubber thereon and a mounting substrate 80 composed of a glass substrate having an adhesive layer 81 composed of an uncured photosensitive resin on a surface thereof are prepared. An alignment mark (not shown) composed of a metal thin film or the like is formed in advance at a predetermined position of the mounting substrate 80.

The material constituting the adhesive layer 81 is not particularly limited as long as the material exhibits adhesiveness by a certain method, for example, a material that exhibits adhesiveness by irradiation of energy ray, such as light (in particular, ultraviolet light or the like), a radiation ray (e.g., X-ray), or an electron beam; or a material that exhibits adhesiveness by application of heat, pressure, or the like. Examples of the material that can be easily formed into an adhesive layer and that exhibits adhesiveness include resin-based adhesives, in particular, photosensitive adhesives, thermosetting adhesives, and thermoplastic adhesives. For example, when a photosensitive adhesive is used, adhesiveness can be exhibited by irradiating the resulting adhesive layer with light or ultraviolet light or by heating the adhesive layer. When a thermosetting adhesive is used, adhesiveness can be exhibited by heating the resulting adhesive layer by means of irradiation of light or the like. When a thermoplastic adhesive is used, a part of the resulting adhesive layer is melted by selectively heating the part by means of irradiation of light or the like, and thus flowability can be provided to the adhesive layer. Another example of the adhesive layer is a pressure-sensitive adhesive layer (composed of an acrylic resin or the like).

Figure 11A:
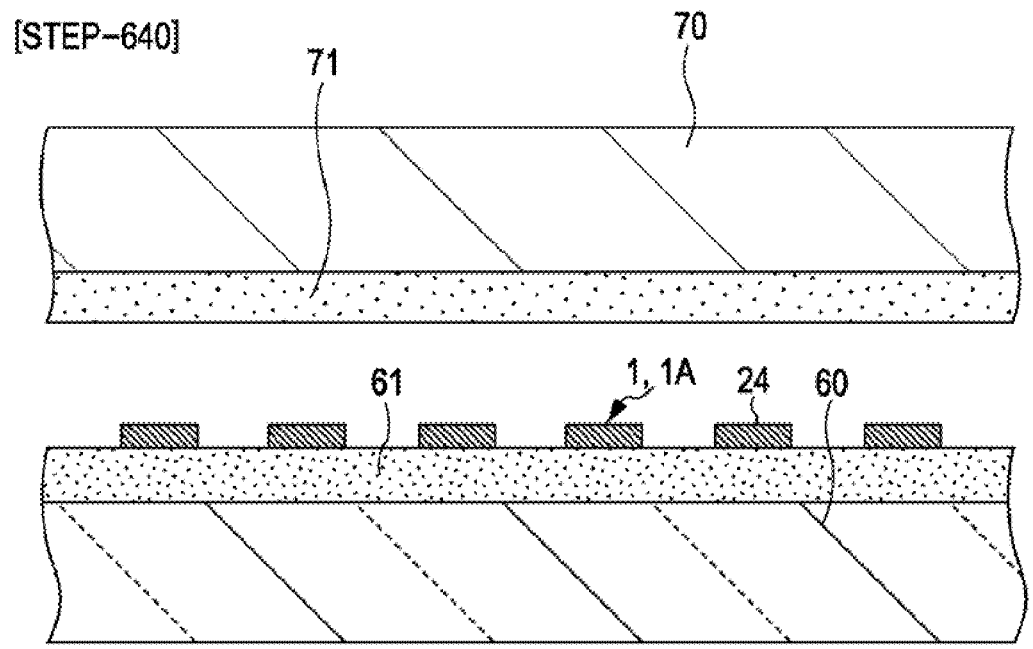
FIGS. 11A and 11B are schematic cross-sectional views of the GaN-based semiconductor light-emitting element, etc. after the step shown in FIG. 10B has been performed in the method of producing the light-emitting element assembly of Example 6.
Figure 11B:
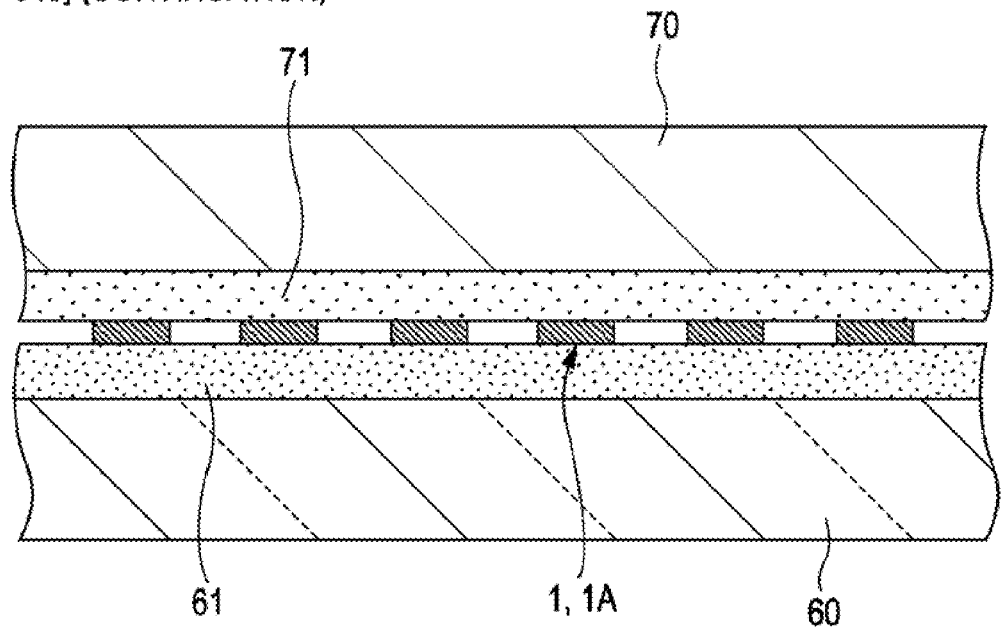
Figure 12A:
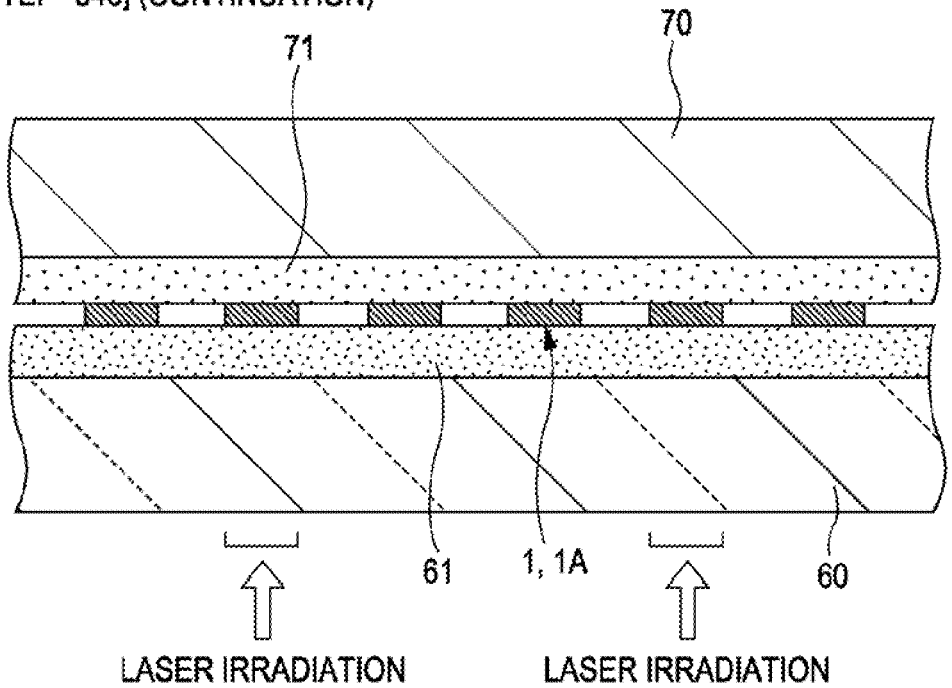
FIGS. 12A and 12B are schematic cross-sectional views of the GaN-based semiconductor light-emitting element, etc. after the step shown in FIG. 11B has been performed in the method of producing the light-emitting element assembly of Example 6.
Figure 12B:
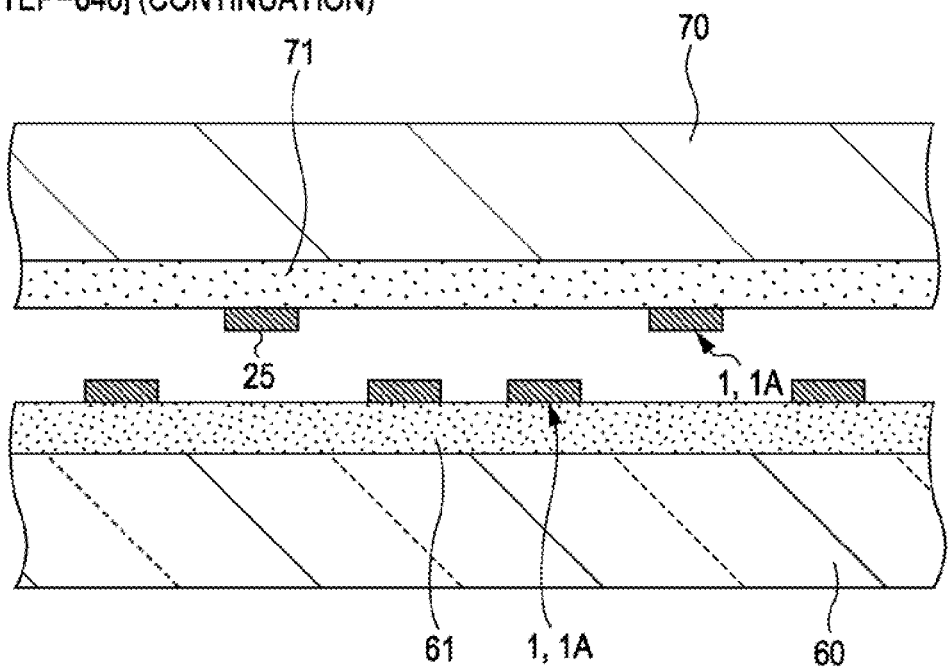

Next, the slightly adhesive layer 71 is pressed onto the GaN-based semiconductor light-emitting elements 1 or 1A remaining in an array (in a two-dimensional matrix) on the temporary fixing substrate 60 (see FIGS. 11A and 11B). Examples of the material constituting the transfer substrate 70 include a glass plate, a metal plate, an alloy plate, a ceramic plate, a semiconductor substrate, and a plastic plate. The transfer substrate 70 is held by a positioning device (not shown). The positional relationship between the transfer substrate 70 and the temporary fixing substrate 60 can be adjusted by operating the positioning device. Next, the GaN-based semiconductor light-emitting element 1 or 1A to be mounted is irradiated with, for example, excimer laser from the reverse face side of the temporary fixing substrate 60 (see FIG. 12A). Consequently, laser ablation occurs, and the GaN-based semiconductor light-emitting element 1 or 1A irradiated with the excimer laser is detached from the temporary fixing substrate 60. Subsequently, when the transfer substrate 70 is separated from the GaN-based semiconductor light-emitting elements 1 or 1A, the GaN-based semiconductor light-emitting element 1 or 1A detached from the temporary fixing substrate 60 adheres to the slightly adhesive layer 71 (see FIG. 12B).

Figure 13A:
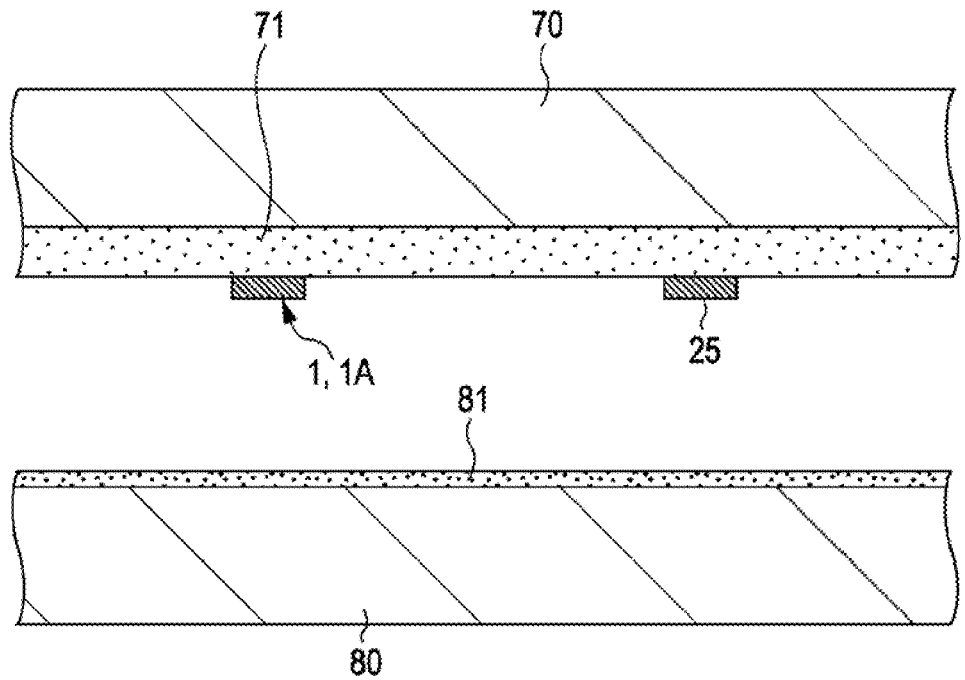
FIGS. 13A and 13B are schematic cross-sectional views of the GaN-based semiconductor light-emitting element, etc. after the step shown in FIG. 12B has been performed in the method of producing the light-emitting element assembly of Example 6.
Figure 13B:
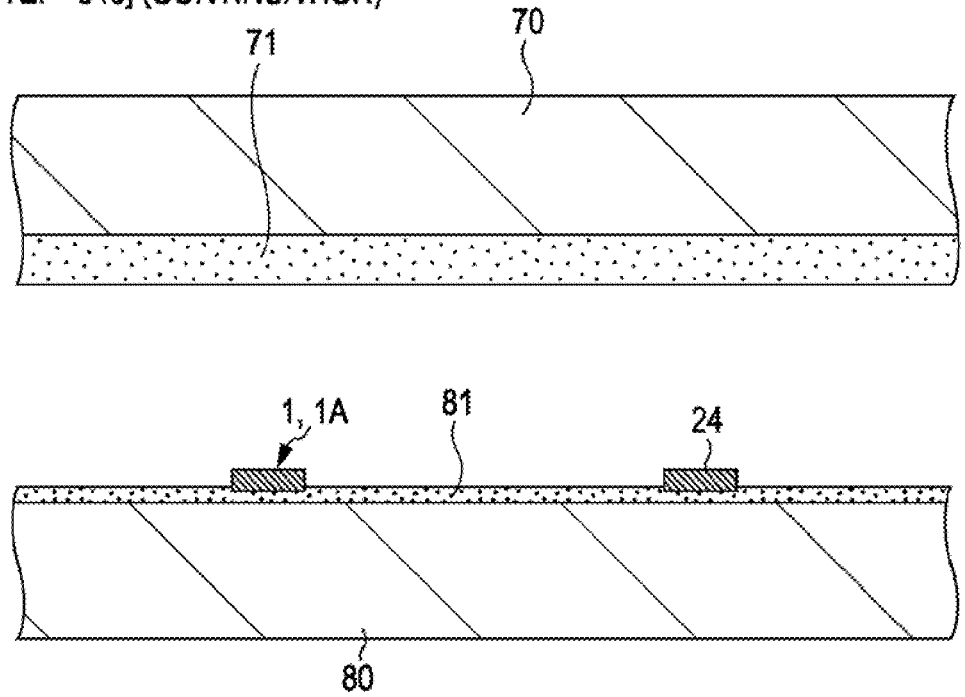

Next, the GaN-based semiconductor light-emitting element 1 or 1A is placed (moved or transferred) onto the adhesive layer 81 (see FIGS. 13A and 13B). Specifically, the GaN-based semiconductor light-emitting element 1 or 1A is transferred from the transfer substrate 70 onto the adhesive layer 81 on the mounting substrate 80 on the basis of the alignment mark provided on the mounting substrate 80. The GaN-based semiconductor light-emitting element 1 or 1A only weakly adheres to the slightly adhesive layer 71. Therefore, when the transfer substrate 70 is moved in a direction away from the mounting substrate 80 in a state in which the GaN-based semiconductor light-emitting element 1 or 1A is in contact with (pressed to) the adhesive layer 81, the GaN-based semiconductor light-emitting element 1 or 1A is left on the adhesive layer 81. Furthermore, by deeply embedding the GaN-based semiconductor light-emitting element 1 or 1A in the adhesive layer 81 using a roller or the like, the GaN-based semiconductor light-emitting element (light-emitting diode) 1 or 1A can be mounted on the mounting substrate 80.

The above-described method using the transfer substrate 70 is referred to as a "step-transfer method" for convenience. By repeating the step-transfer method a desired number of times, a desired number of GaN-based semiconductor light-emitting elements 1 or 1A adhere to the slightly adhesive layer 71 in a two-dimensional matrix, and are then transferred onto the mounting substrate 80. Specifically, in Example 6, in one step transfer, 160×120 GaN-based semiconductor light-emitting elements 1 or 1A are allowed to adhere to the slightly adhesive layer 71 in a two-dimensional matrix, and then transferred onto the mounting substrate 80. Accordingly, by repeating the step-transfer method 108 times ((1,920×1,080)/(160×120)=108), 1,920×1,080 GaN-based semiconductor light-emitting elements 1 or 1A can be transferred onto the mounting substrate 80. By repeating the above process three times, the predetermined number of red-light-emitting diodes, green-light-emitting diodes, and blue-light-emitting diodes can be mounted on the mounting substrate 80 at predetermined intervals or pitches.

Subsequently, the adhesive layer 81 which is composed of a photosensitive resin and on which the GaN-based semiconductor light-emitting elements 1 or 1A are arranged is irradiated with ultraviolet light to cure the photosensitive resin constituting the adhesive layer 81. As a result, the GaN-based semiconductor light-emitting elements 1 or 1A are fixed to the adhesive layer 81. Next, each of the GaN-based semiconductor light-emitting elements 1 or 1A is temporarily fixed to a second temporary fixing substrate with the corresponding first electrode 24 therebetween. Specifically, a second temporary fixing substrate composed of a glass substrate having an adhesion layer 90 composed of an uncured adhesive on a surface thereof is prepared. The GaN-based semiconductor light-emitting element 1 or 1A is bonded to the adhesion layer 90, and the adhesion layer 90 is then cured. Thus, the GaN-based semiconductor light-emitting element 1 or 1A can be temporarily fixed onto the second temporary fixing substrate. The adhesive layer 81 and the mounting substrate 80 are then removed from the GaN-based semiconductor light-emitting element 1 or 1A by an appropriate method. In this state, the second electrode 25 of the GaN-based semiconductor light-emitting element 1 or 1A is exposed.

Step-650

Next, a second insulating layer 91 is formed over the entire surface, and an opening 92 is formed in the second insulating layer 91 above the second electrode 25 of the GaN-based semiconductor light-emitting element 1 or 1A. A second wiring 93 is formed on the second electrode 25 so as to extend over the opening 92 and the second insulating layer 91. Next, the second insulating layer 91 including the second wiring 93 is bonded to a supporting member 95 composed of a glass substrate with an adhesion layer 94 therebetween. Thereby, the GaN-based semiconductor light-emitting element 1 or 1A can be fixed to the supporting member 95. Next, the reverse face of the second temporary fixing substrate is irradiated with, for example, excimer laser. Consequently, laser ablation occurs, and the GaN-based semiconductor light-emitting element 1 or 1A irradiated with the excimer laser is detached from the second temporary fixing substrate. In this state, the first electrode 24 of the GaN-based semiconductor light-emitting element 1 or 1A is exposed. Next, a first insulating layer 96 is formed over the entire surface, and an opening 97 is formed in the first insulating layer 96 above the first electrode 24 of the GaN-based semiconductor light-emitting element 1 or 1A. A first wiring 98 is formed on the first electrode 24 so as to extend over the opening 97 and the first insulating layer 96. This state is shown in the schematic partial cross-sectional view of FIG. 8. By connecting the first wiring and the second wiring to driving circuits by an appropriate method, a light-emitting element assembly can be produced, or an image display apparatus (light-emitting diode display apparatus) can be produced. The GaN-based semiconductor light-emitting element 1 or 1A has a flip-chip structure, and light generated in the active layer 30 is emitted in the lower direction of FIG. 8.

Examples of the image display apparatus of Example 6 include image display apparatuses having the configurations and the structures described below. Unless otherwise stated, the number of GaN-based semiconductor light-emitting elements constituting an image display apparatus or a light-emitting element panel may be determined on the basis of the specifications of the image display apparatus. In addition, as described above, the GaN-based semiconductor light-emitting element constituting an image display apparatus or a light-emitting element panel may be any one of the GaN-based semiconductor light-emitting elements described in Examples 1 to 5, or may be the light-emitting element assembly of Example 6. In the latter case, the GaN-based semiconductor light-emitting element 1 or 1A in the description below may be read as the light-emitting element assembly.

(1A) Image Display Apparatus Having First Structure-A

A passive matrix-type, direct-view-type image display apparatus including (α) a light-emitting element panel 200 having GaN-based semiconductor light-emitting elements 1 or 1A arranged in a two-dimensional matrix, wherein the light emission/non-emission state of each of the GaN-based semiconductor light-emitting elements is controlled, and the emission state of each of the GaN-based semiconductor light-emitting elements is directly visually observed to display an image.

Figure 14A:
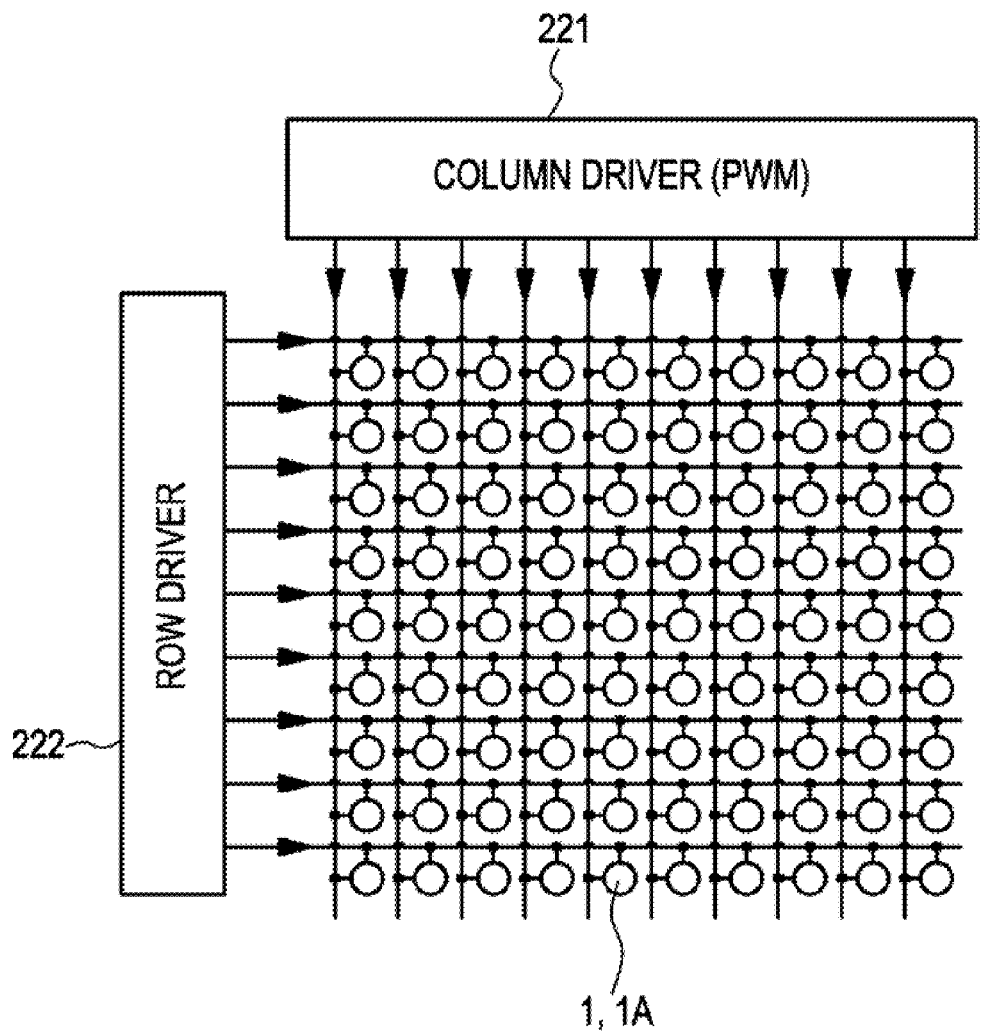
FIG. 14A is a circuit diagram of a passive matrix-type, direct-view-type image display apparatus (image display apparatus having a first structure-A) in Example 6.
Figure 14B:
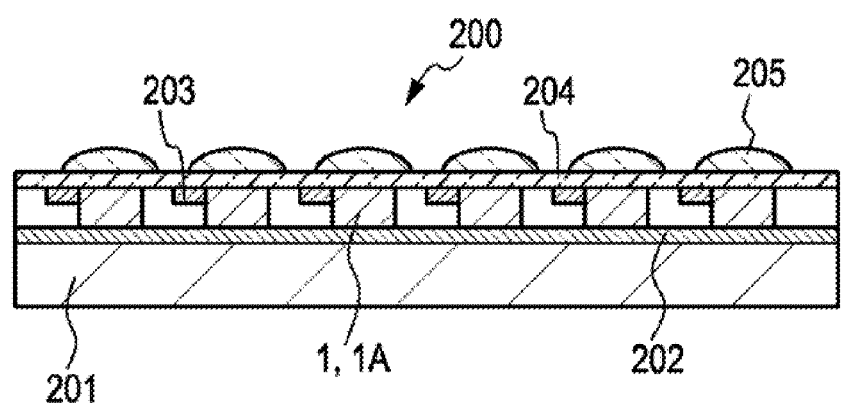
FIG. 14B is a schematic cross-sectional view of a light-emitting element panel having GaN-based semiconductor light-emitting elements arranged in a two-dimensional matrix.

FIG. 14A shows a circuit diagram including a light-emitting element panel 200 constituting such a passive matrix-type, direct-view-type image display apparatus. FIG. 14B is a schematic cross-sectional view of the light-emitting element panel 200 having GaN-based semiconductor light-emitting elements 1 or 1A arranged in a two-dimensional matrix. One electrode (a second electrode or first electrode) of each of the GaN-based semiconductor light-emitting elements 1 or 1A is connected to a column driver 221, and the other electrode (the first electrode or second electrode) of each of the GaN-based semiconductor light-emitting elements 1 or 1A is connected to a row driver 222. The light emission/non-emission state of each of the GaN-based semiconductor light-emitting elements 1 or 1A is controlled by, for example, the row driver 222, and a driving current for driving each of the GaN-based semiconductor light-emitting elements 1 or 1A is supplied from the column driver 221. Selection and driving of the respective GaN-based semiconductor light-emitting elements 1 or 1A can be performed by ordinary methods, and thus the description thereof is omitted.

The light-emitting element panel 200 includes a supporting body 201 composed of, for example, a printed circuit board (in some cases, corresponding to the supporting member 95); GaN-based semiconductor light-emitting elements 1 or 1A disposed on the supporting body 201; X-direction wirings 202 that are provided on the supporting body 201, that are electrically connected to one electrode (the second electrode or first electrode) of the respective GaN-based semiconductor light-emitting elements 1 or 1A, and that are connected to the column driver 221 or the row driver 222; Y-direction wirings 203 that are electrically connected to the other electrode (the first electrode or second electrode) of the respective GaN-based semiconductor light-emitting elements 1 or 1A and that are connected to the row driver 222 or the column driver 221; a transparent base member. 204 that covers the GaN-based semiconductor light-emitting elements 1 or 1A; and microlenses 205 provided on the transparent base member 204. However, the structure of the light-emitting element panel 200 is not limited thereto.

(1B) Image Display Apparatus Having First Structure-B

An active matrix-type, direct-view-type image display apparatus including (α) a light-emitting element panel 200 having GaN-based semiconductor light-emitting elements 1 or 1A arranged in a two-dimensional matrix, wherein the light emission/non-emission state of each of the GaN-based semiconductor light-emitting elements is controlled, and the emission state of each of the GaN-based semiconductor light-emitting elements is directly visually observed to display an image.

Figure 15:
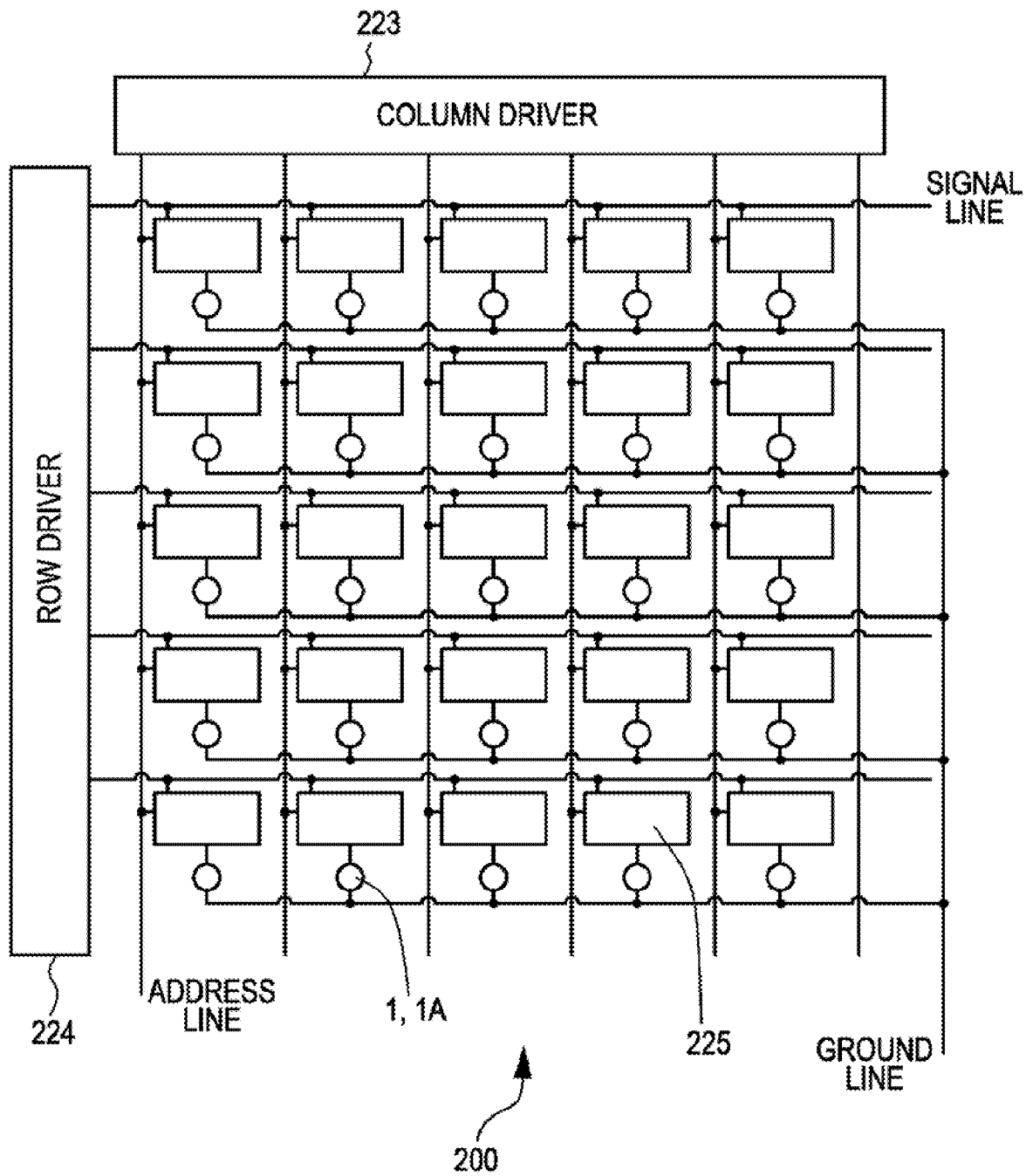
FIG. 15 is a circuit diagram of an active matrix-type, direct-view-type image display apparatus (image display apparatus having the first structure-B) in Example 6.

FIG. 15 shows a circuit diagram including a light-emitting element panel 200 constituting such an active matrix-type, direct-view-type image display apparatus. One electrode (a second electrode or first electrode) of each of GaN-based semiconductor light-emitting elements 1 or 1A is connected to a driver 225, and the driver 225 is connected to a column driver 223 and a row driver 224. The other electrode (the first electrode or second electrode) of each of the GaN-based semiconductor light-emitting elements 1 or 1A is connected to a ground line. The light emission/non-emission state of each of the GaN-based semiconductor light-emitting elements 1 or 1A is controlled by, for example, selection of the driver 225 by the row driver 224, and a luminance signal for driving each of the GaN-based semiconductor light-emitting elements 1 or 1A is supplied from the column driver 223 to the corresponding driver 225. A predetermined voltage is supplied from a power supply (not shown) to each driver 225, and the driver 225 supplies the corresponding GaN-based semiconductor light-emitting element 1 or 1A with a driving current (based on a PDM control or PWM control) corresponding to the luminance signal. Selection and driving of the respective GaN-based semiconductor light-emitting elements 1 or 1A can be performed by ordinary methods, and thus the description thereof is omitted.

(2) Image Display Apparatus Having Second Structure

A passive matrix-type or active matrix-type, projection-type image display apparatus including (α) a light-emitting element panel 200 having GaN-based semiconductor light-emitting elements 1 or 1A arranged in a two-dimensional matrix, wherein the light emission/non-emission state of each of the GaN-based semiconductor light-emitting elements 1 or 1A is controlled, and projection is performed on a screen to display an image.

Figure 16:
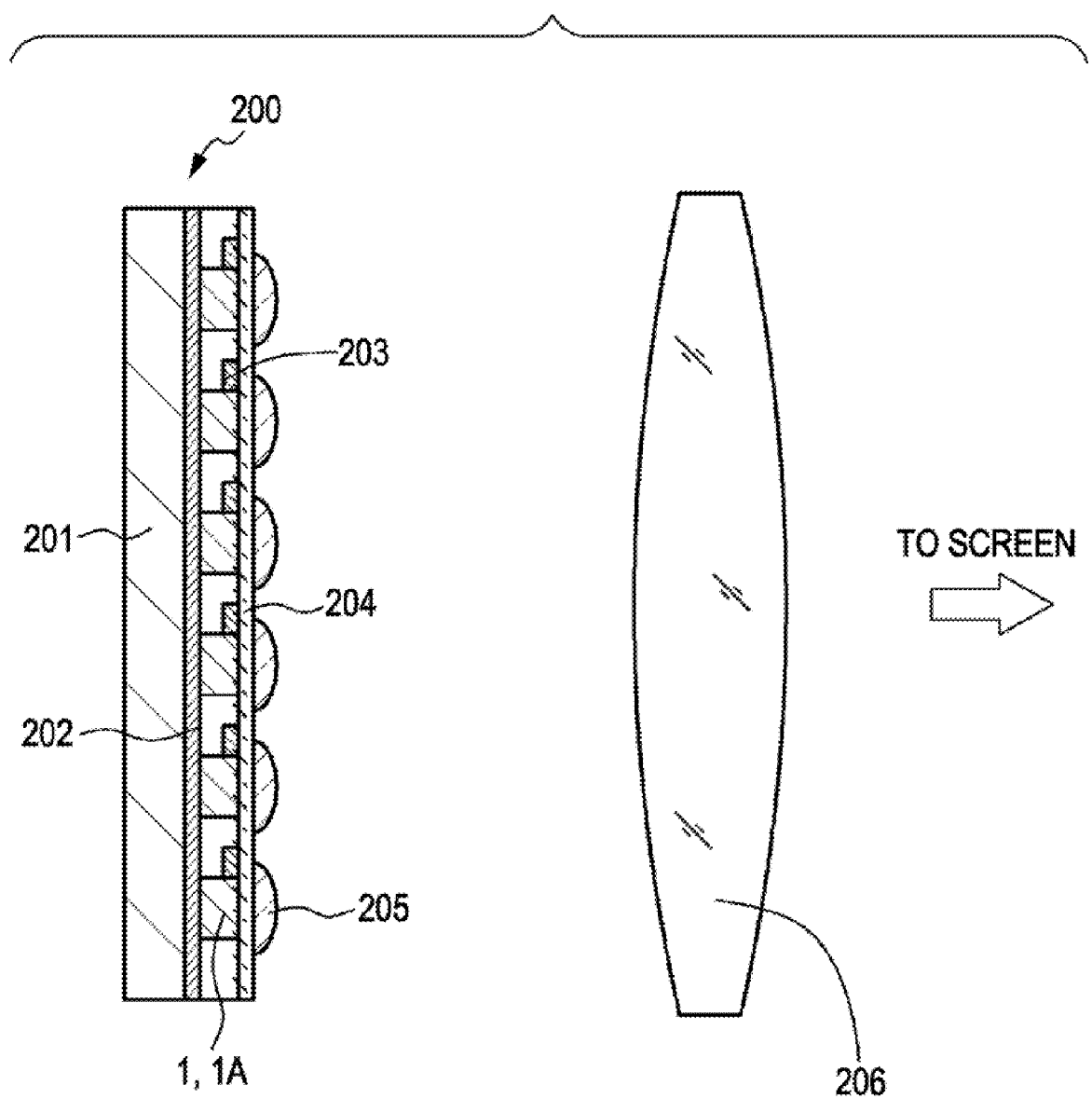
FIG. 16 is a schematic view of a projection-type image display apparatus (image display apparatus having a second structure) including a light-emitting element panel having GaN-based semiconductor light-emitting elements in Example 6 or Example 7 arranged in a two-dimensional matrix.

The circuit diagram including a light-emitting element panel constituting such a passive matrix-type image display apparatus is similar to that shown in FIG. 14A, and the circuit diagram including a light-emitting element panel constituting such an active matrix-type image display apparatus is similar to that shown in FIG. 15. Therefore, the detailed description thereof is omitted. FIG. 16 is a schematic view showing the light-emitting element panel 200 having GaN-based semiconductor light-emitting elements 1 or 1A arranged in a two-dimensional matrix, etc. Light emitted from the light-emitting element panel 200 passes through a projector lens 206 and is projected on a screen. The configuration and structure of the light-emitting element panel 200 are the same as those of the light-emitting element panel 200 described with reference to FIG. 14B. Therefore, the detailed description thereof is omitted.

(3) Image Display Apparatus Having Third Structure

A direct-view-type or projection-type color image display apparatus including (α) a red-light-emitting element panel 200R having red-light-emitting semiconductor light-emitting elements R (e.g., AlGaInP-based semiconductor light-emitting elements or GaN-based semiconductor light-emitting elements 1R) arranged in a two-dimensional matrix; (β) a green-light-emitting element panel 200G having green-light-emitting GaN-based semiconductor light-emitting elements 1G arranged in a two-dimensional matrix; (γ) a blue-light-emitting element panel 200B having blue-light-emitting GaN-based semiconductor light-emitting elements 1B arranged in a two-dimensional matrix; and (δ) means (e.g., a dichroic prism 207) for combining light emitted from each of the red-light-emitting element panel 200R, the green-light-emitting element panel 200G, and the blue-light-emitting element panel 200B into a single optical path, wherein the light emission/non-emission state of each of the red-light-emitting semiconductor light-emitting elements R, the green-light-emitting GaN-based semiconductor light-emitting elements 1G, and the blue-light-emitting GaN-based semiconductor light-emitting elements 1B is controlled.

Figure 17:
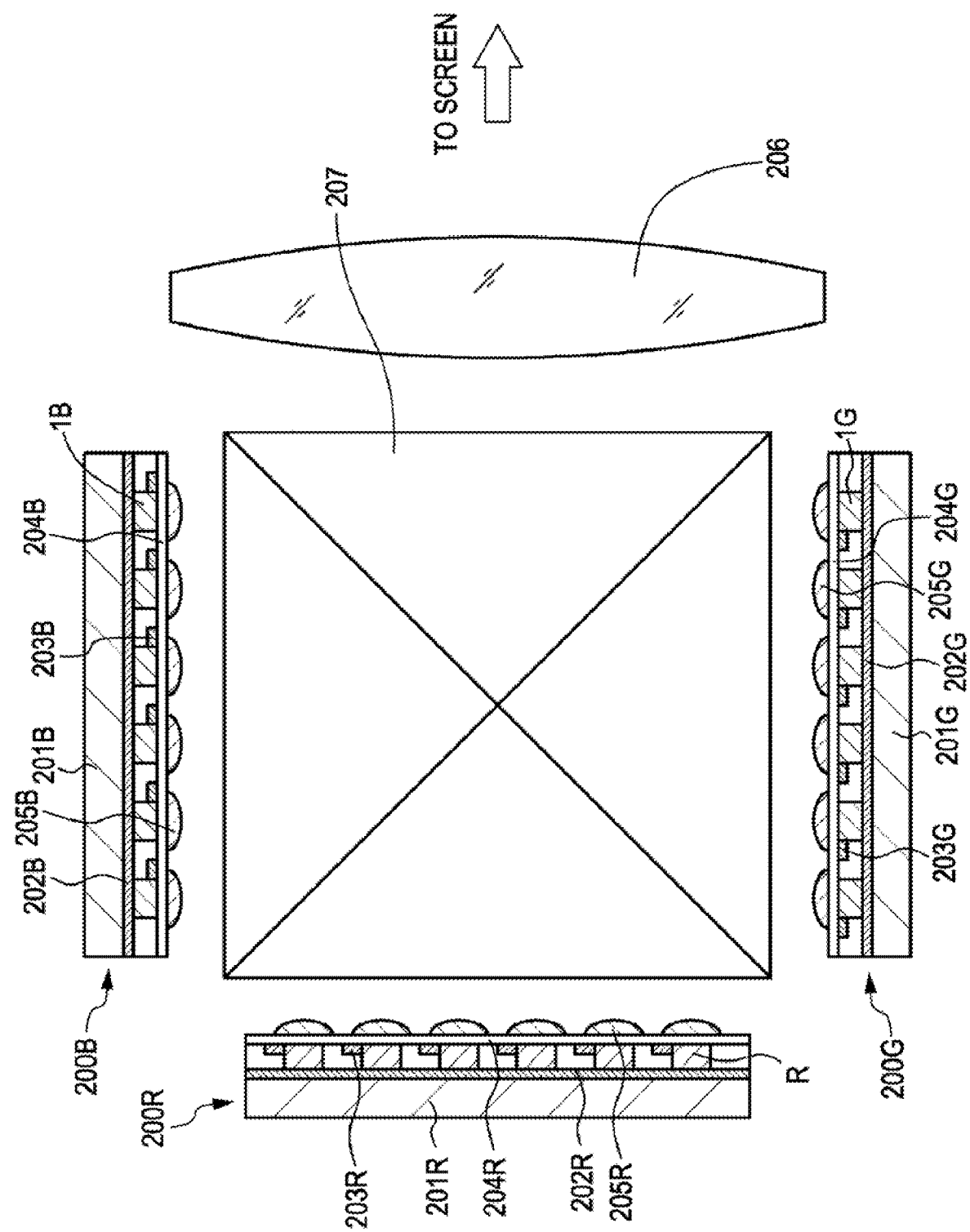
FIG. 17 is a schematic view of a projection-type color image display apparatus (image display apparatus having a third structure) including a red-light-emitting element panel, a green-light-emitting element panel, a blue-light-emitting element panel in Example 6.

The circuit diagram including a light-emitting element panel constituting such a passive matrix-type image display apparatus is similar to that shown in FIG. 14A, and the circuit diagram including a light-emitting element panel constituting such an active matrix-type image display apparatus is similar to that shown in FIG. 15. Therefore, the detailed description thereof is omitted. FIG. 17 is a schematic view showing the light-emitting element panel 200R having the red-light-emitting semiconductor light-emitting elements R arranged in a two-dimensional matrix, and the light-emitting element panels 200G and 200B having the GaN-based semiconductor light-emitting elements 1G and 1B, respectively, arranged in a two-dimensional matrix, etc. Light components emitted from the light-emitting element panels 200R, 200G, and 200B enter a dichroic prism 207, and the optical paths of these light components are combined into a single optical path. In a direct-view-type image display apparatus, the resulting light is directly viewed. Alternatively, in a projection-type image display apparatus, the resulting light passes through a projector lens 206 and is projected on a screen. The configuration and structure of each of the light-emitting element panels 200R, 200G, and 200B are the same as those of the light-emitting element panel 200 described with reference to FIG. 14B. Therefore, the detailed description thereof is omitted.

In such an image display apparatus, each of the semiconductor light-emitting elements R, 1G, and 1B constituting the light-emitting element panels 200R, 200G, and 200B, respectively, is preferably composed of any of the GaN-based semiconductor light-emitting elements 1 and 1A described in Examples 1 to 5. Alternatively, for example, the semiconductor light-emitting elements R constituting the light-emitting element panel 200R may be composed of AlInGaP-based compound semiconductor light-emitting diodes, and each of the GaN-based semiconductor light-emitting elements 1G and 1B constituting the light-emitting element panels 200G and 200B, respectively, may be composed of any of the GaN-based semiconductor light-emitting elements 1 and 1A described in Examples 1 to 5.

(4) Image Display Apparatus Having Fourth Structure

A direct-view-type or projection-type image display apparatus including (α) a GaN-based semiconductor light-emitting element 1 or 1A; and (β) a light transmission controlling device (e.g., a liquid crystal display device 208 including a high-temperature polysilicon thin-film transistor; hereinafter the same) which is a light valve that controls transmission/non-transmission of light emitted from the GaN-based semiconductor light-emitting element 1 or 1A, wherein the transmission/non-transmission of light emitted from the GaN-based semiconductor light-emitting element 1 or 1A is controlled by the liquid crystal display device 208 which is the light transmission controlling device to display an image.

Figure 18:
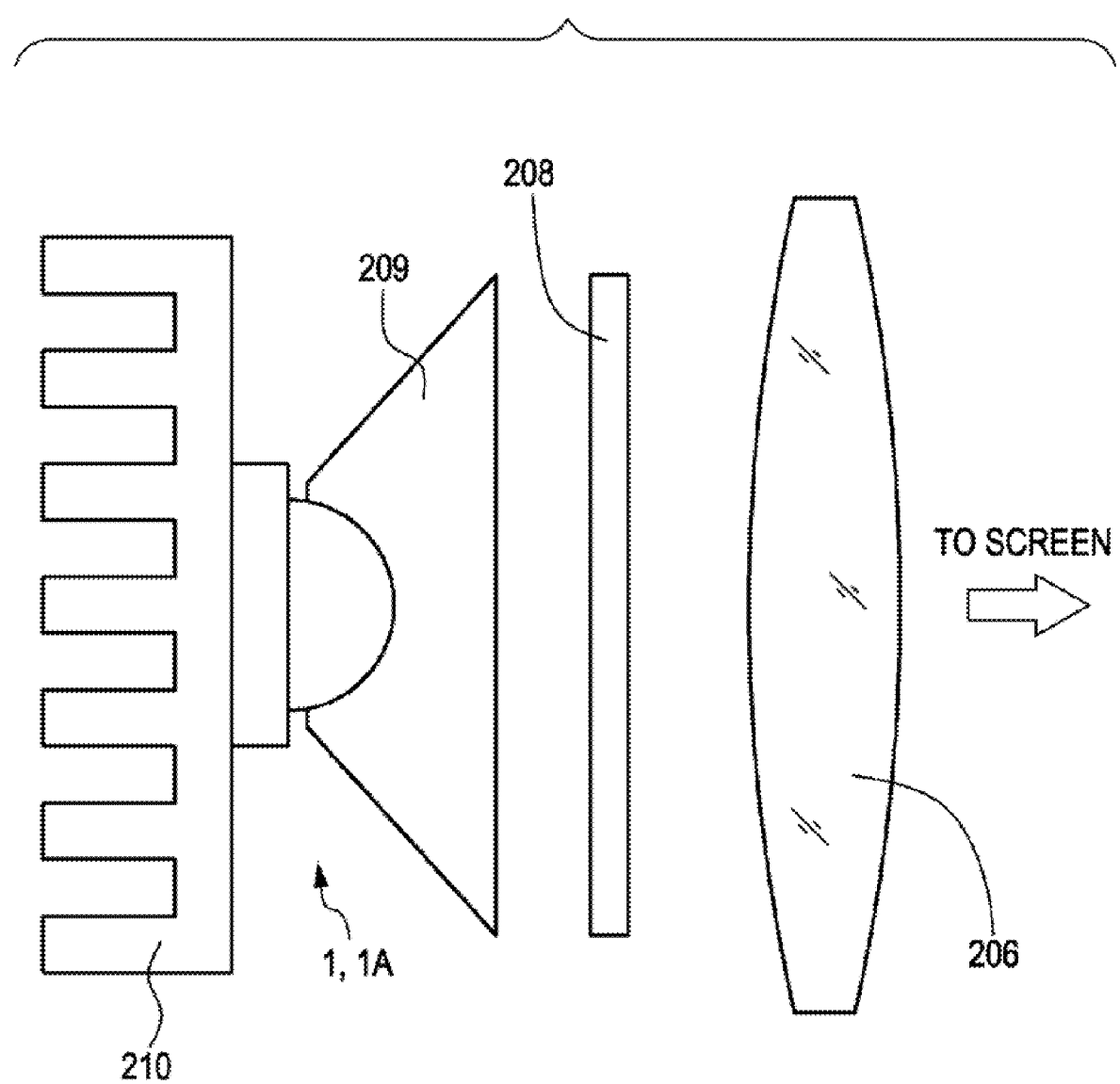
FIG. 18 is a schematic view of a projection-type image display apparatus (image display apparatus having a fourth structure) including a GaN-based semiconductor light-emitting element in Example 6 and a light transmission controlling device.

The number of GaN-based semiconductor light-emitting elements may be determined on the basis of the specifications of the image display apparatus, and may be one or two or more. FIG. 18 is a schematic view of an image display apparatus. In the example shown in FIG. 18, the number of GaN-based semiconductor light-emitting elements 1 or 1A is one, and the GaN-based semiconductor light-emitting element 1 or 1A is fixed to a heat sink 210. Light emitted from the GaN-based semiconductor light-emitting element 1 or 1A is guided by a light-guiding member 209 including an optical guiding member composed of a light-transmissive material such as a silicone resin, an epoxy resin, or a polycarbonate resin, and a reflector such as a mirror, and enters the liquid crystal display device 208. In a direct-view-type image display apparatus, the light emitted from the liquid crystal display device 208 is directly viewed. Alternatively, in a projection-type image display apparatus, the light emitted from the liquid crystal display device 208 passes through a projector lens 206 and is projected on a screen. Any of the GaN-based semiconductor light-emitting elements described in Examples 1 to 5 can be used as the GaN-based semiconductor light-emitting element 1 or 1A.

Figure 19:
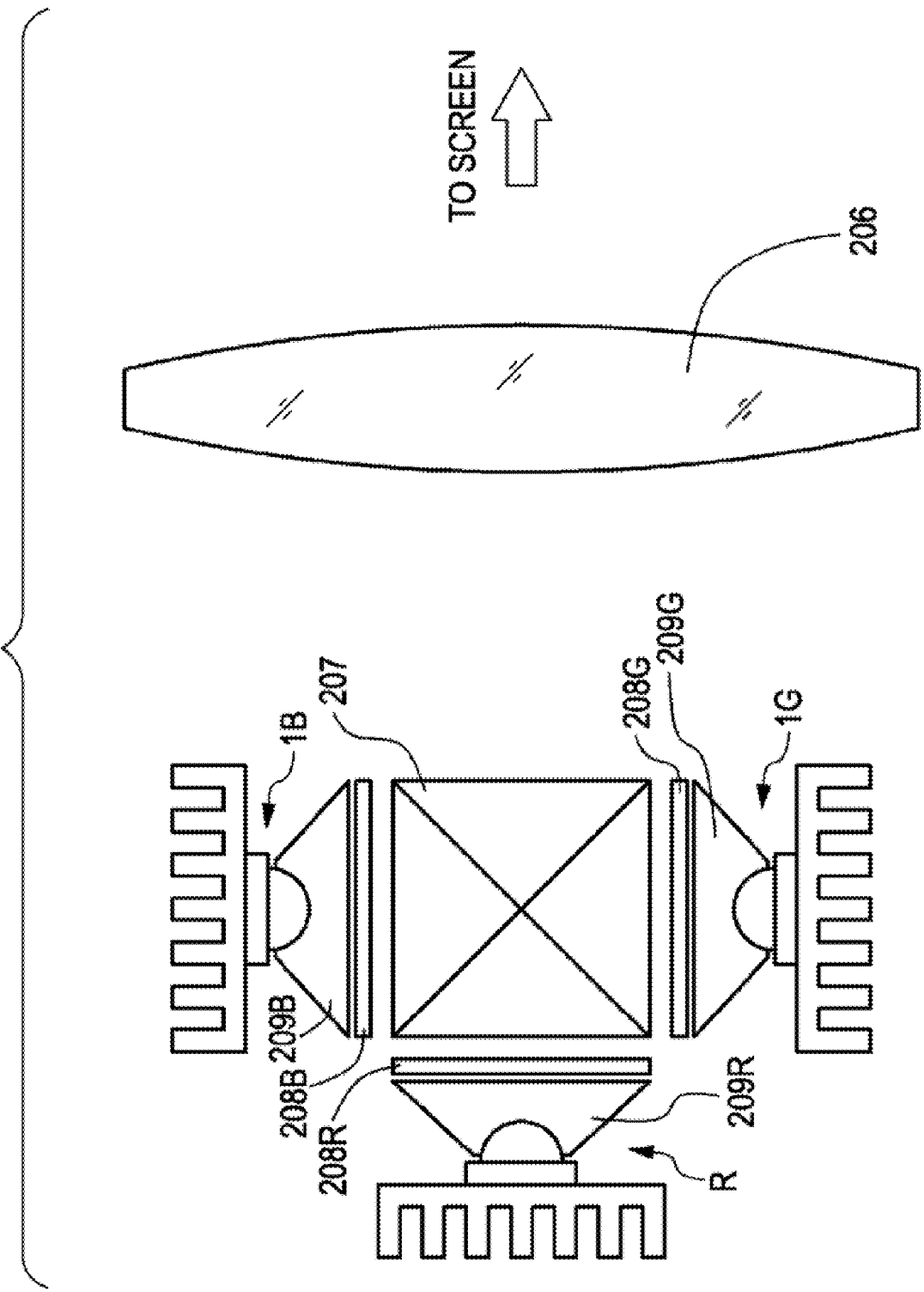
FIG. 19 is a schematic view of a projection-type color image display apparatus (image display apparatus having the fourth structure) including three sets of a GaN-based semiconductor light-emitting element in Example 6 and three sets of a light transmission controlling device.

A direct-view-type or projection-type color image display apparatus can be obtained by producing an image display apparatus including a red-light-emitting semiconductor light-emitting element R (e.g., an AlGaInP-based semiconductor light-emitting element or a GaN-based semiconductor light-emitting element 1R), and a light transmission controlling device (e.g., a liquid crystal display device 208R) which is a light valve that controls transmission/non-transmission of light emitted from the red-light-emitting semiconductor light-emitting element R; a green-light-emitting GaN-based semiconductor light-emitting element 1G, and a light transmission controlling device (e.g., a liquid crystal display device 208G) which is a light valve that controls transmission/non-transmission of light emitted from the green-light-emitting GaN-based semiconductor light-emitting element 1G; a blue-light-emitting GaN-based semiconductor light-emitting element 1B, and a light transmission controlling device (e.g., a liquid crystal display device 208B) which is a light valve that controls transmission/non-transmission of light emitted from the blue-light-emitting GaN-based semiconductor light-emitting element 1B; light-guiding members 209R, 209G, and 209B which guide light components emitted from the red-light-emitting semiconductor light-emitting element R, the green-light-emitting GaN-based semiconductor light-emitting element 1G, and the blue-light-emitting GaN-based semiconductor light-emitting element 1B, respectively; and means (e.g., a dichroic prism 207) for combining the light components into a single optical path. FIG. 19 is a schematic view showing an example of such a projection-type color image display apparatus.

In such an image display apparatus, each of the semiconductor light-emitting elements R, 1G, and 1B is preferably composed of any of the GaN-based semiconductor light-emitting elements 1 and 1A described in Examples 1 to 5. Alternatively, for example, the semiconductor light-emitting element R may be composed of an AlInGaP-based compound semiconductor light-emitting diode, and each of the GaN-based semiconductor light-emitting elements 1G and 1B may be composed of any of the GaN-based semiconductor light-emitting elements 1 and 1A described in Examples 1 to 5.

(5) Image Display Apparatus Having Fifth Structure

A direct-view-type or projection-type image display apparatus including (α) a light-emitting element panel 200 having GaN-based semiconductor light-emitting elements 1 or 1A arranged in a two-dimensional matrix; and (β) a light transmission controlling device (liquid crystal display device 208) that controls transmission/non-transmission of light emitted from each of the GaN-based semiconductor light-emitting elements 1 or 1A, wherein the transmission/non-transmission of light emitted from each of the GaN-based semiconductor light-emitting elements 1 or 1A is controlled by the light transmission controlling device (liquid crystal display device 208) to display an image.

Figure 20:
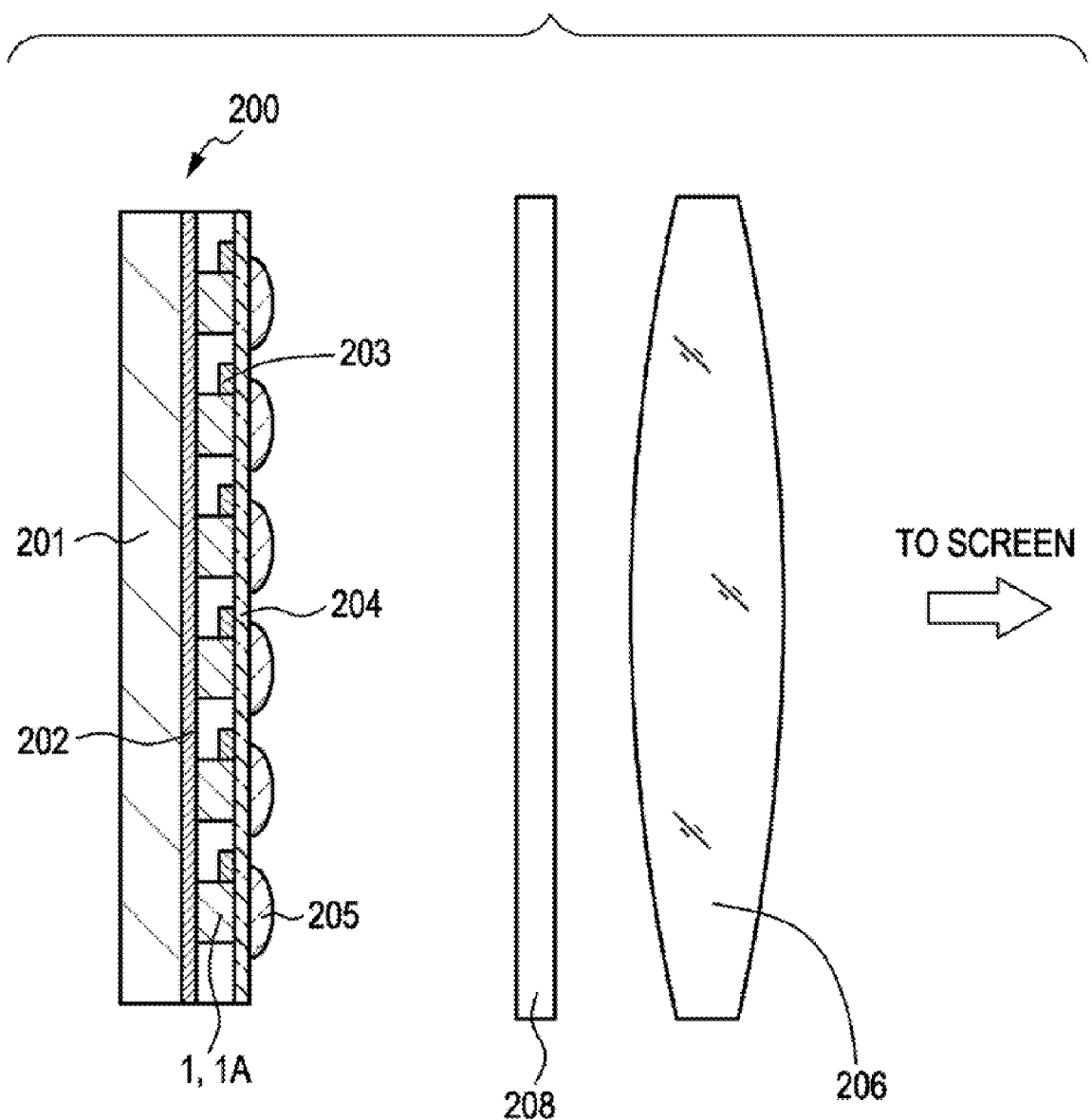
FIG. 20 is a schematic view of a projection-type image display apparatus (image display apparatus having a fifth structure) including the light-emitting element panel in Example 6 and a light transmission controlling device.

FIG. 20 is a schematic view of the light-emitting element panel 200 etc. The configuration and structure of the light-emitting element panel 200 can be the same as those of the light-emitting element panel 200 described with reference to FIG. 14B. Therefore, the detailed description thereof is omitted. Transmission/non-transmission and brightness of light emitted from the light-emitting element panel 200 are controlled by the operation of the liquid crystal display device 208. Therefore, GaN-based semiconductor light-emitting elements 1 or 1A constituting the light-emitting element panel 200 may be constantly turned on, or may be repeatedly turned on and off in an appropriate cycle. The light emitted from the light-emitting element panel 200 enters the liquid crystal display device 208. In a direct-view-type image display apparatus, the light emitted from the liquid crystal display device 208 is directly viewed. Alternatively, in a projection-type image display apparatus, the light emitted from the liquid crystal display device 208 passes through a projector lens 206 and is projected on a screen.

(6) Image Display Apparatus Having Sixth Structure

A direct-view-type or projection-type color image display apparatus including (α) a red-light-emitting element panel 200R having red-light-emitting semiconductor light-emitting elements R (e.g., AlGaInP-based semiconductor light-emitting elements or GaN-based semiconductor light-emitting elements 1R) arranged in a two-dimensional matrix, and a red-light transmission controlling device (liquid crystal display device 208R) that controls transmission/non-transmission of light emitted from the red-light-emitting element panel 200R; (β) a green-light-emitting element panel 200G having green-light-emitting GaN-based semiconductor light-emitting elements 1G arranged in a two-dimensional matrix, and a green-light transmission controlling device (liquid crystal display device 208G) that controls transmission/non-transmission of light emitted from the green-light-emitting element panel 200G; (γ) a blue-light-emitting element panel 200B having blue-light-emitting GaN-based semiconductor light-emitting elements 1B arranged in a two-dimensional matrix, and a blue-light transmission controlling device (liquid crystal display device 208B) that controls transmission/non-transmission of light emitted from the blue-light-emitting element panel 200B; and (δ) means (e.g., a dichroic prism 207) for combining the light emitted from each of the red-light transmission controlling device 208R, the green-light transmission controlling device 208G, and the blue-light transmission controlling device 208B into a single optical path, wherein transmission/non-transmission of the light emitted from the light-emitting element panels 200R, 200G, and 200B is controlled by the corresponding light transmission controlling devices 208R, 208G, and 208B to display an image.

Figure 21:
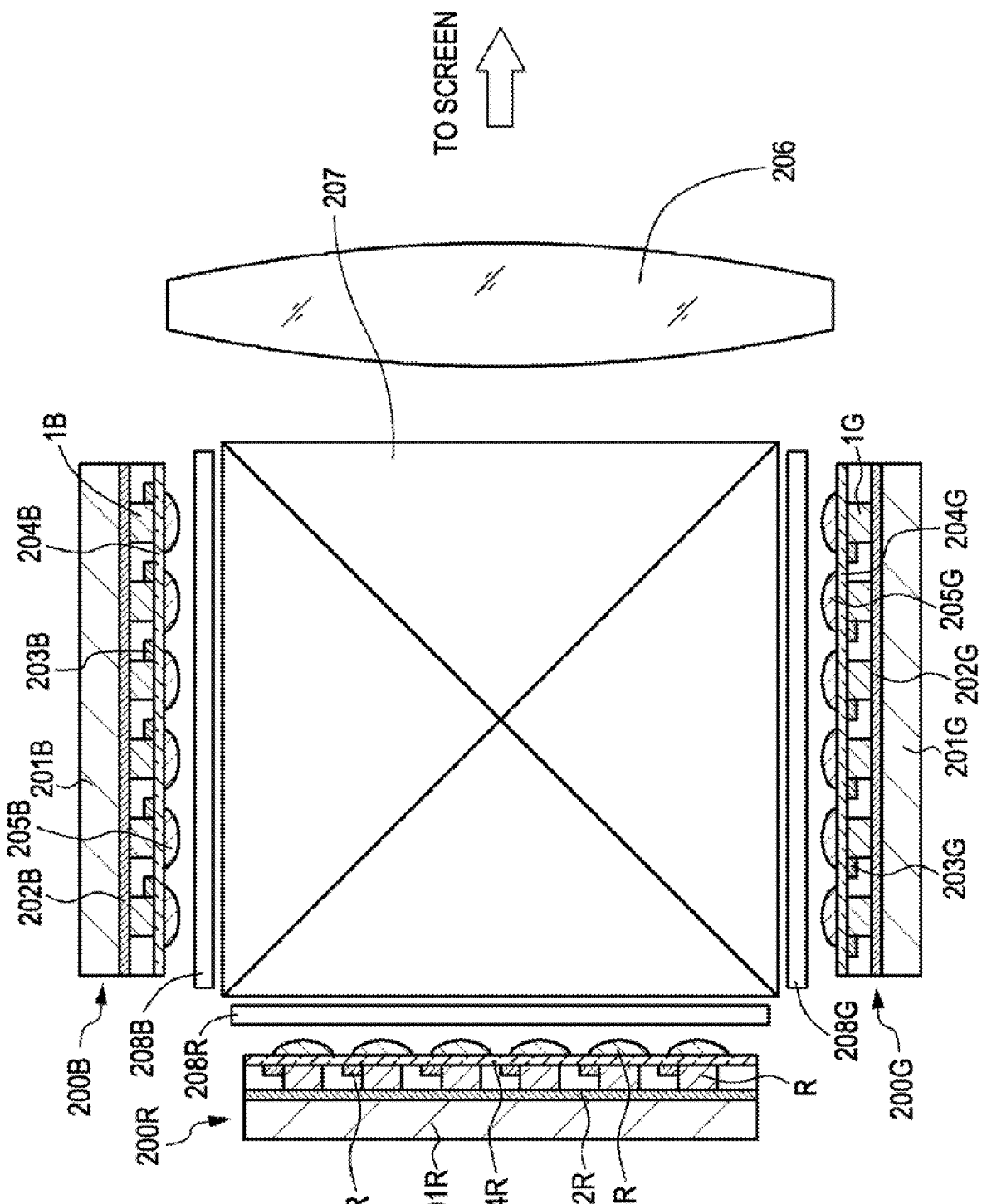
FIG. 21 is a schematic view of a projection-type color image display apparatus (image display apparatus having a sixth structure) including three sets of a GaN-based semiconductor light-emitting element in Example 6 and three sets of a light transmission controlling device.

FIG. 21 is a schematic view showing the light-emitting element panel 200R having the red-light-emitting semiconductor light-emitting elements R arranged in a two-dimensional matrix, and the light-emitting element panels 200G and 200B having the GaN-based semiconductor light-emitting elements 1G and 1B, respectively, arranged in a two-dimensional matrix, etc. Light components emitted from the light-emitting element panels 200R, 200G, and 200B, whose transmission/non-transmission is controlled by the light transmission controlling devices 208R, 208G, and 208B, respectively, enter the dichroic prism 207. The optical paths of the light components are combined into a single optical path. In a direct-view-type image display apparatus, the resulting light is directly viewed. Alternatively, in a projection-type image display apparatus, the resulting light passes through a projector lens 206 and is projected on a screen. The configuration and structure of each of the light-emitting element panels 200R, 200G, and 200B can be the same as those of the light-emitting element panel 200 described with reference to FIG. 14B. Therefore, the detailed description thereof is omitted.

In such an image display apparatus, each of the semiconductor light-emitting elements R, 1G, and 1B constituting the light-emitting element panels 200R, 200G, and 200B, respectively, is preferably composed of any of the GaN-based semiconductor light-emitting elements 1 and 1A described in Examples 1 to 5. Alternatively, for example, the semiconductor light-emitting elements R constituting the light-emitting element panel 200R may be composed of AlInGaP-based compound semiconductor light-emitting diodes, and each of the GaN-based semiconductor light-emitting elements 1G and 1B constituting the light-emitting element panels 200G and 200B, respectively, may be composed of any of the GaN-based semiconductor light-emitting elements 1 and 1A described in Examples 1 to 5.

(7) Image Display Apparatus Having Seventh Structure

A (direct-view-type or projection-type) field-sequential color image display apparatus including (α) a red-light-emitting semiconductor light-emitting element R (e.g., AlGaInP-based semiconductor light-emitting element or GaN-based semiconductor light-emitting element 1R); (β) a green-light-emitting GaN-based semiconductor light-emitting element 1G; (γ) a blue-light-emitting GaN-based semiconductor light-emitting element 1B; (δ) means (e.g., a dichroic prism 207) for combining light emitted from each of the red-light-emitting semiconductor light-emitting element R, the green-light-emitting GaN-based semiconductor light-emitting element 1G, and the blue-light-emitting GaN-based semiconductor light-emitting element 1B into a single optical path; and (ε) a light transmission controlling device (liquid crystal display device 208) that controls transmission/non-transmission of light emitted from the means (dichroic prism 207) for combining the light into the optical path, wherein the transmission/non-transmission of the light emitted from each of the light-emitting elements is controlled by the light transmission controlling device 208 to display an image.

Figure 22:
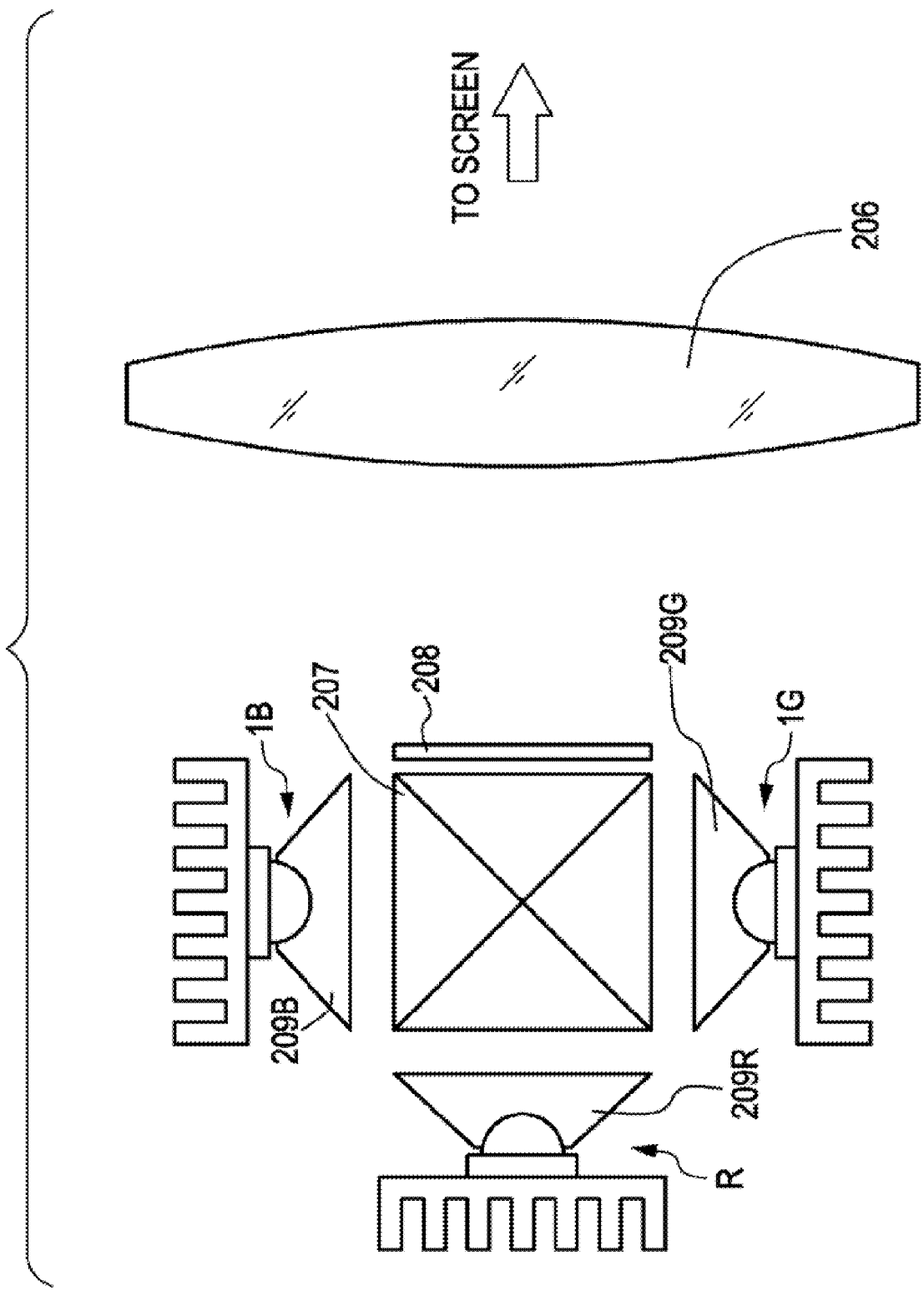
FIG. 22 is a schematic view of a projection-type color image display apparatus (image display apparatus having a seventh structure) including three sets of a GaN-based semiconductor light-emitting element in Example 6 and a light transmission controlling device.

FIG. 22 is a schematic view of the semiconductor light-emitting elements R, 1G, and 1B, etc. Light components emitted from the semiconductor light-emitting elements R, 1G, and 1B enter the dichroic prism 207, and the optical paths of these light components are combined into a single optical path. The transmission/non-transmission of each of the light components emitted from the dichroic prism 207 is controlled by the light transmission controlling device 208. In a direct-view-type image display apparatus, the resulting light is directly viewed. Alternatively, in a projection-type image display apparatus, the resulting light passes through a projector lens 206 and is projected on a screen. In such an image display apparatus, each of the semiconductor light-emitting elements R, 1G, and 1B is preferably composed of any of the GaN-based semiconductor light-emitting elements 1 and 1A described in Examples 1 to 5. Alternatively, for example, the semiconductor light-emitting element R may be composed of an AlInGaP-based compound semiconductor light-emitting diode, and each of the GaN-based semiconductor light-emitting elements 1G and 1B may be composed of any of the GaN-based semiconductor light-emitting elements 1 and 1A described in Examples 1 to 5.

(8) Image Display Apparatus Having Eighth Structure

A (direct-view-type or projection-type) field-sequential color image display apparatus including (α) a red-light-emitting element panel 200R having red-light-emitting semiconductor light-emitting elements R (e.g., AlGaInP-based semiconductor light-emitting elements or GaN-based semiconductor light-emitting elements 1R) arranged in a two-dimensional matrix; (β) a green-light-emitting element panel 200G having green-light-emitting GaN-based semiconductor light-emitting elements 1G arranged in a two-dimensional matrix; (γ) a blue-light-emitting element panel 200B having blue-light-emitting GaN-based semiconductor light-emitting elements 1B arranged in a two-dimensional matrix; (δ) means (e.g., a dichroic prism 207) for combining light emitted from each of the red-light-emitting element panel 200R, the green-light-emitting element panel 200G, and the blue-light-emitting element panel 200B into a single optical path; and (ε) a light transmission controlling device (liquid crystal display device 208) that controls transmission/non-transmission of light emitted from the means (dichroic prism 207) for combining light into the optical path, wherein the transmission/non-transmission of the light emitted from each of the light-emitting element panels 200R, 200G, and 200B is controlled by the light transmission controlling device 208 to display an image.

Figure 23:
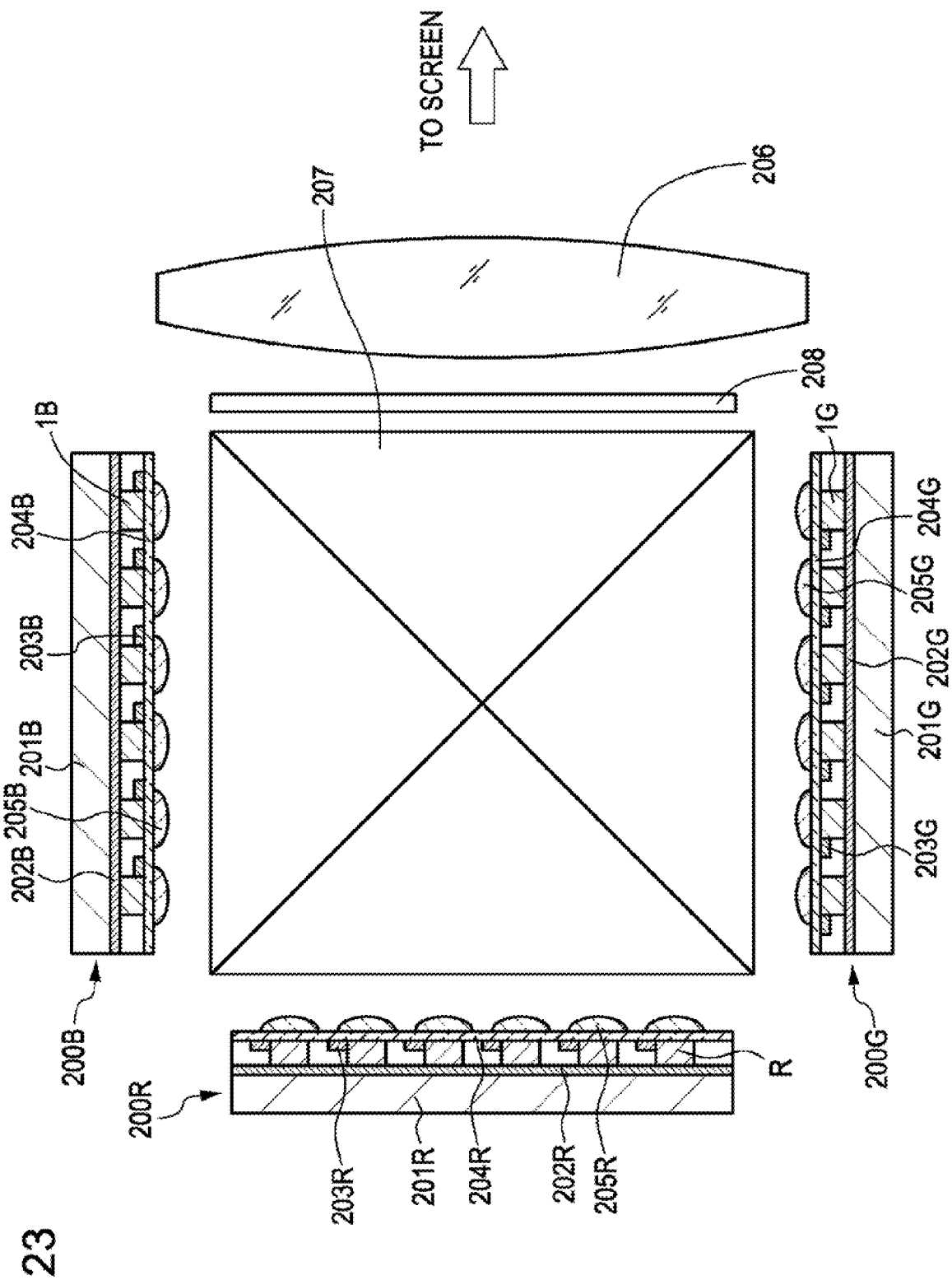
FIG. 23 is a schematic view of a projection-type color image display apparatus (image display apparatus having an eighth structure) including three sets of a light-emitting element panel in Example 6 and a light transmission controlling device.

FIG. 23 is a schematic view showing the light-emitting element panel 200R having the red-light-emitting semiconductor light-emitting elements R arranged in a two-dimensional matrix, and the light-emitting element panels 200G and 200B having the GaN-based semiconductor light-emitting elements 1G and 1B, respectively, arranged in a two-dimensional matrix, etc. Light components emitted from the light-emitting element panels 200R, 200G, and 200B enter the dichroic prism 207, and the optical paths of these light components are combined into a single optical path. The transmission/non-transmission of each of the light components emitted from the dichroic prism 207 is controlled by the light transmission controlling device 208. In a direct-view-type image display apparatus, the resulting light is directly viewed. Alternatively, in a projection-type image display apparatus, the resulting light passes through a projector lens 206 and is projected on a screen. The configuration and structure of each of the light-emitting element panels 200R, 200G, and 200B are the same as those of the light-emitting element panel 200 described with reference to FIG. 14B. Therefore, the detailed description thereof is omitted.

In such an image display apparatus, each of the semiconductor light-emitting elements R, 1G, and 1B constituting the light-emitting element panels 200R, 200G, and 200B, respectively, is preferably composed of any of the GaN-based semiconductor light-emitting elements 1 and 1A described in Examples 1 to 5. Alternatively, for example, the semiconductor light-emitting elements R constituting the light-emitting element panel 200R may be composed of AlInGaP-based compound semiconductor light-emitting diodes, and each of the GaN-based semiconductor light-emitting elements 1G and 1B constituting the light-emitting element panels 200G and 200B, respectively, may be composed of any of the GaN-based semiconductor light-emitting elements 1 and 1A described in Examples 1 to 5.

EXAMPLE 7

Example 7 also relates to image display apparatuses. An image display apparatus of Example 7 includes light-emitting element units UN for displaying a color image arranged in a two-dimensional matrix, and each of the light-emitting element units UN includes a first light-emitting element that emits blue light, a second light-emitting element that emits green light, and a third light-emitting element that emits red light. The basic configuration and structure of a GaN-based semiconductor light-emitting element (light-emitting diode) constituting at least one of the first light-emitting element, the second light-emitting element, and the third light-emitting element may be the same as those of any of the GaN-based semiconductor light-emitting elements 1 and 1A described in Examples 1 to 5, as in Example 6, or may be the same as those of the light-emitting element assembly of Example 6. In the latter case, the GaN-based semiconductor light-emitting element 1 or 1A in the description below may be read as the light-emitting element assembly. In such an image display apparatus, it is sufficient that any one of the first light-emitting element, the second light-emitting element, and the third light-emitting element is composed of any of the GaN-based semiconductor light-emitting elements 1 and 1A described in Examples 1 to 5. In some cases, for example, the third light-emitting element that emits red light may be composed of an AlInGaP-based compound semiconductor light-emitting diode.

Examples of the image display apparatus of Example 7 include image display apparatuses having the configuration and structure described below. The number of light-emitting element units UN may be determined on the basis of the specifications of the image display apparatus.

(1) Image Display Apparatuses Having Ninth Structure and Tenth Structure

A passive matrix-type or active matrix-type, direct-view-type color image display apparatus including a first light-emitting element, a second light-emitting element, and a third light-emitting element, wherein the light emission/non-emission state of each of the first light-emitting element, the second light-emitting element, and the third light-emitting element is controlled, and the emission state of each of the light-emitting elements is directly visually observed to display an image; and a passive matrix-type or active matrix-type, projection-type color image display apparatus including a first light-emitting element, a second light-emitting element, and a third light-emitting element, wherein the light emission/non-emission state of each of the first light-emitting element, the second light-emitting element, and the third light-emitting element is controlled, and projection is performed on a screen to display an image.

Figure 24:
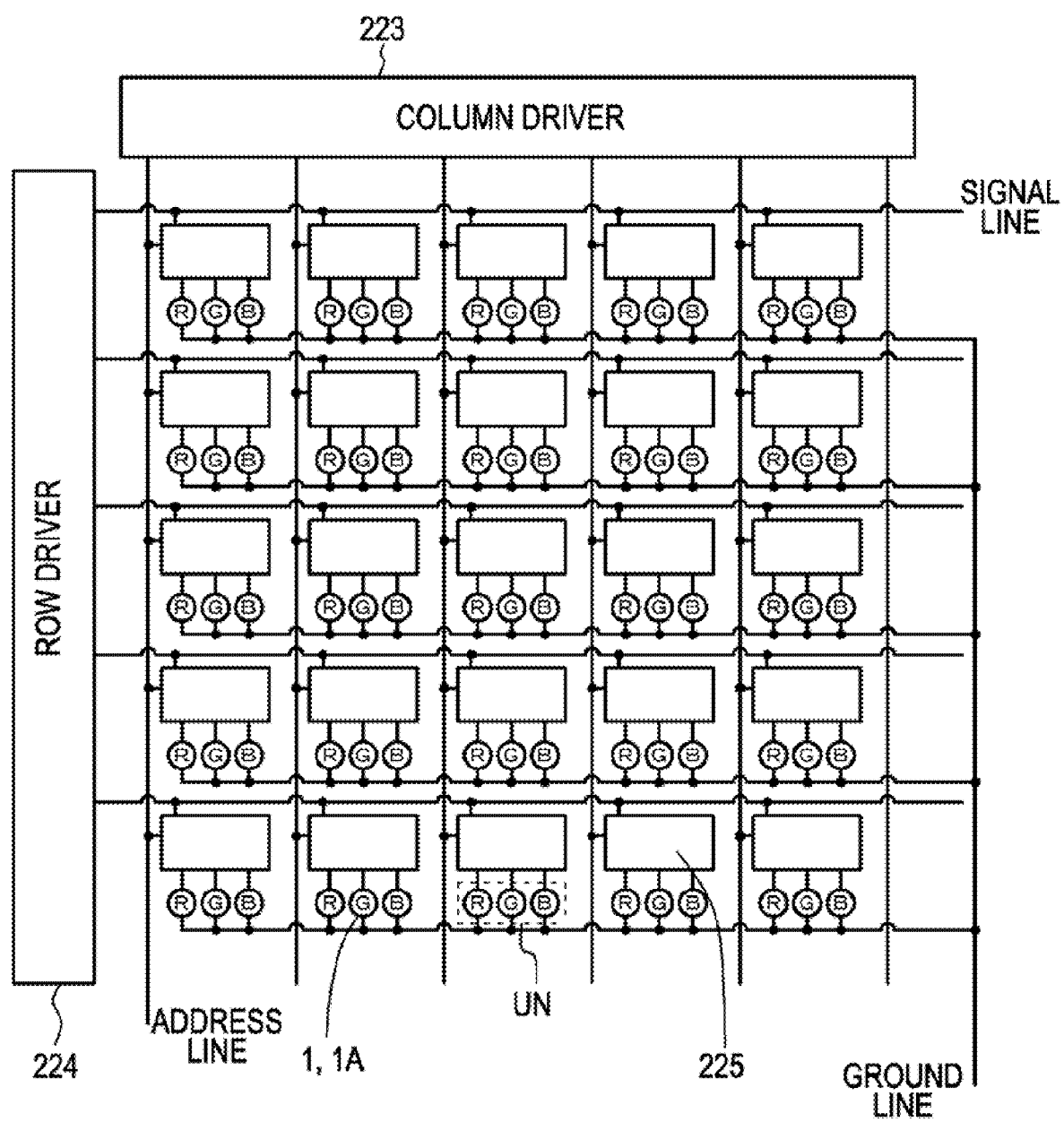
FIG. 24 is a circuit diagram of an active matrix-type, direct-view-type color image display apparatus (image display apparatus having a ninth or tenth structure) in Example 7.

FIG. 24 is a circuit diagram including a light-emitting element panel constituting such an active matrix-type, direct-view-type color image display apparatus. One electrode (a second electrode or first electrode) of each GaN-based semiconductor light-emitting element 1 or 1A (in FIG. 24, a semiconductor light-emitting element that emits red light (i.e., red-light-emitting semiconductor light-emitting element) being represented by "R", a GaN-based semiconductor light-emitting element that emits green light (i.e., green-light-emitting semiconductor light-emitting element) being represented by "G", and a GaN-based semiconductor light-emitting element that emits blue light (i.e., blue-light-emitting semiconductor light-emitting element) being represented by "B") is connected to a driver 225. Each driver 225 is connected to a column driver 223 and a row driver 224. The other electrode (the first electrode or second electrode) of each of the GaN-based semiconductor light-emitting elements 1 or 1A is connected to a ground line. The light emission/non-emission state of each of the GaN-based semiconductor light-emitting elements 1 or 1A is controlled by, for example, selection of the driver 225 by the row driver 224, and a luminance signal for driving each of the GaN-based semiconductor light-emitting elements 1 or 1A is supplied from the column driver 223 to the corresponding driver 225. A predetermined voltage is supplied from a power supply (not shown) to each driver 225, and the driver 225 supplies the corresponding GaN-based semiconductor light-emitting element 1 or 1A with a driving current (based on a PDM control or PWM control) corresponding to the luminance signal. Selection of the red-light-emitting semiconductor light-emitting element R, the green-light-emitting GaN-based semiconductor light-emitting element G, and the blue-light-emitting GaN-based semiconductor light-emitting element B is performed by the corresponding driver 225. The light emission/non-emission state of each of the red-light-emitting semiconductor light-emitting element R, the green-light-emitting GaN-based semiconductor light-emitting element G, and the blue-light-emitting GaN-based semiconductor light-emitting element B may be controlled by time-sharing, or the semiconductor light-emitting elements R, G, and B may simultaneously emit light. Selection and driving of the respective GaN-based semiconductor light-emitting elements 1 or 1A can be performed by ordinary methods, and thus the description thereof is omitted. In a direct-view-type image display apparatus, the resulting light is directly viewed. Alternatively, in a projection-type image display apparatus, the resulting light passes through a projector lens and is projected on a screen.

(2) Image Display Apparatus Having Eleventh Structure

A direct-view-type or projection-type, field-sequential color image display apparatus including light-emitting element units arranged in a two-dimensional matrix, and a light transmission controlling device (e.g., liquid crystal display device) that controls transmission/non-transmission of light emitted from each of the light-emitting element units, wherein the light emission/non-emission state of each of a first light-emitting element, a second light-emitting element, and a third light-emitting element in each of the light-emitting element units is controlled by time-sharing, and transmission/non-transmission of light emitted from each of the first light-emitting element, the second light-emitting element, and the third light-emitting element is controlled by the light transmission controlling device to display an image.

The schematic view of such an image display apparatus is similar to that shown in FIG. 16. In a direct-view-type image display apparatus, the resulting light is directly viewed. Alternatively, in a projection-type image display apparatus, the resulting light passes through a projector lens and is projected on a screen.

EXAMPLE 8

Example 8 relates to a light-emitting apparatuses according to an embodiment. A light-emitting apparatus of Example 8 includes any of the GaN-based semiconductor light-emitting elements 1 and 1A described in Examples 1 to 5, and a color conversion material that is excited by light emitted from the GaN-based semiconductor light-emitting element 1 or 1A to emit light having a wavelength different from that of the light emitted from the GaN-based semiconductor light-emitting element 1 or 1A. The color conversion material is, for example, applied to a light-emitting portion of the GaN-based semiconductor light-emitting element 1 or 1A. Alternatively, a color conversion material film may be applied to the GaN-based semiconductor light-emitting element 1 or 1A as the color conversion material. In the light-emitting apparatus of Example 8, examples of light emitted from the GaN-based semiconductor light-emitting element 1 or 1A include visible light, ultraviolet light, and a combination of visible light and ultraviolet light. The GaN-based semiconductor light-emitting element 1 or 1A may be replaced with the light-emitting element assembly of Example 6. In such a case, the GaN-based semiconductor light-emitting element 1 or 1A in the description below may be read as a light-emitting element assembly.

The light-emitting apparatus of Example 8 may have a structure in which the light emitted from the GaN-based semiconductor light-emitting element 1 or 1A is blue light, and the light emitted from the color conversion material is at least one selected from the group consisting of yellow light, green light, and red light. Alternatively, the light-emitting apparatus may have a structure in which the light emitted from the GaN-based semiconductor light-emitting element 1 or 1A and the light emitted from the color conversion material (e.g., yellow; red and green; yellow and red; or green, yellow, and red) are mixed to emit white light. The structure of the light-emitting apparatus is not limited thereto, and the light-emitting apparatus can be applied to variable color illumination or a display.

More specifically, in Example 8, light emitted from the GaN-based semiconductor light-emitting element 1 or 1A is blue light, and light emitted from the color conversion material is yellow light. The color conversion material is composed of yttrium aluminum garnet (YAG)-based phosphor particles. The light (blue light) emitted from the GaN-based semiconductor light-emitting element 1 or 1A and the light (yellow light) emitted from the color conversion material are mixed to emit white light.

Alternatively, in Example 8, light emitted from the GaN-based semiconductor light-emitting element 1 or 1A is blue light, and light emitted from the color conversion material is composed of green light and red light. The light (blue light) emitted from the GaN-based semiconductor light-emitting element 1 or 1A and the light (green and red light) emitted from the color conversion material are mixed to emit white light. In this case, the color conversion material that emits green light is composed of green-light-emitting phosphor particles, such as $SrGa_2S_4$:Eu, which are excited by blue light emitted from the GaN-based semiconductor light-emitting element 1 or 1A. The color conversion material that emits red light is composed of red-light-emitting phosphor particles, such as CaS:Eu, which are excited by blue light emitted from the GaN-based semiconductor light-emitting element 1 or 1A.

EXAMPLE 9

Example 9 is an example in which any of the GaN-based semiconductor light-emitting elements described in Examples 1 to 5 is applied to a surface light source device and a liquid crystal display device assembly (specifically, a color liquid crystal display device assembly). The surface light source device of Example 9 radiates light to a transmissive or semi-transmissive color liquid crystal display device from the back surface side. The color liquid crystal display device assembly of Example 9 includes a transmissive or semi-transmissive color liquid crystal display device and a surface light source device that radiates light to the color liquid crystal display device from the back surface side. The basic configuration and structure of the GaN-based semiconductor light-emitting elements (light-emitting diodes) 1R, 1G, and 1B provided as light sources in the surface light source device are the same as those of the GaN-based semiconductor light-emitting elements described in Examples 1 to 5. The GaN-based semiconductor light-emitting elements 1R, 1G, and 1B may be replaced with the light-emitting element assemblies of Example 6. In such a case, the GaN-based semiconductor light-emitting elements 1R, 1G, and 1B in the description below may be read as light-emitting element assemblies.

Figure 25A:
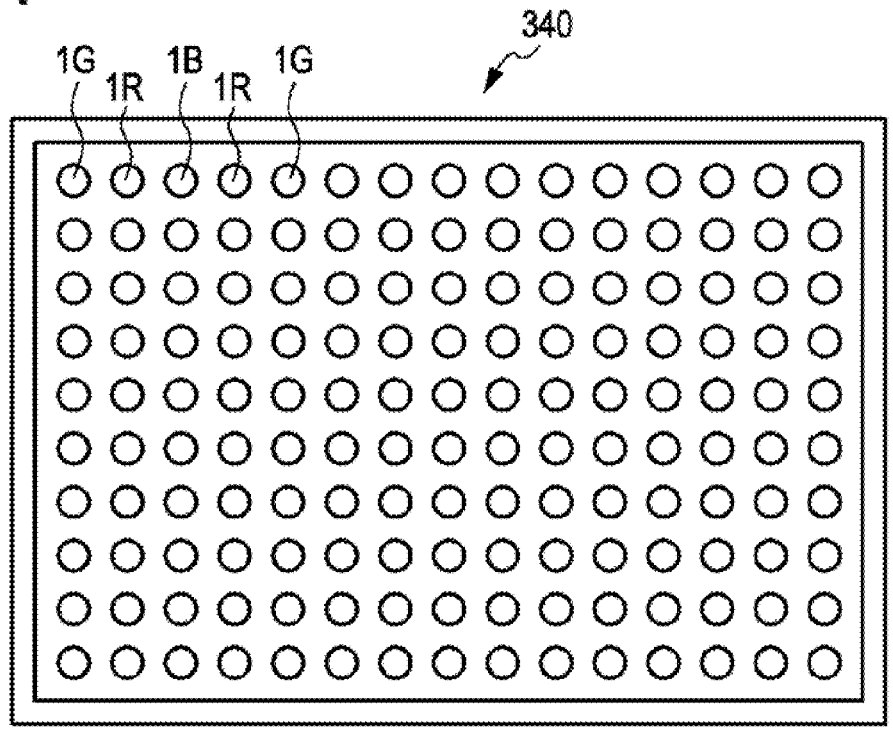
FIG. 25A is a schematic view showing the arrangement of light-emitting elements in a surface light source device of Example 9.
Figure 25B:
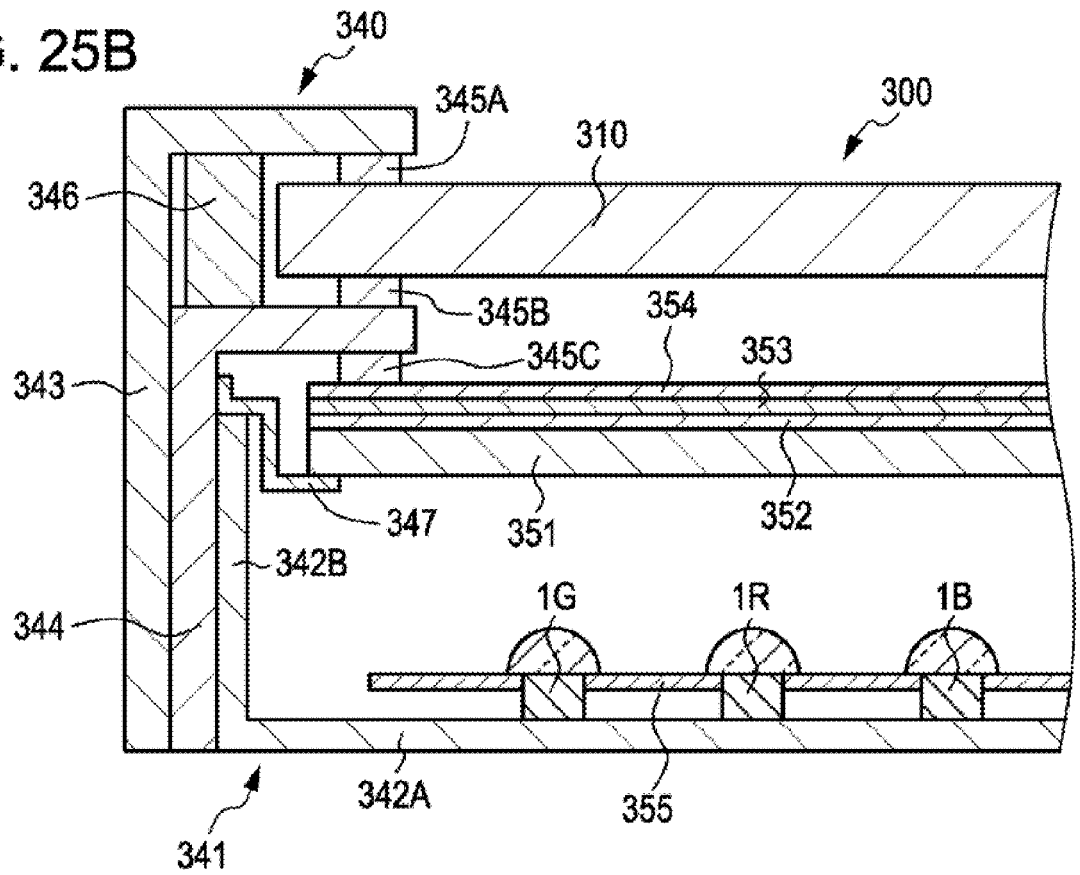
FIG. 25B is a schematic partial cross-sectional view of a surface light source device and a color liquid crystal display device assembly.
Figure 26:
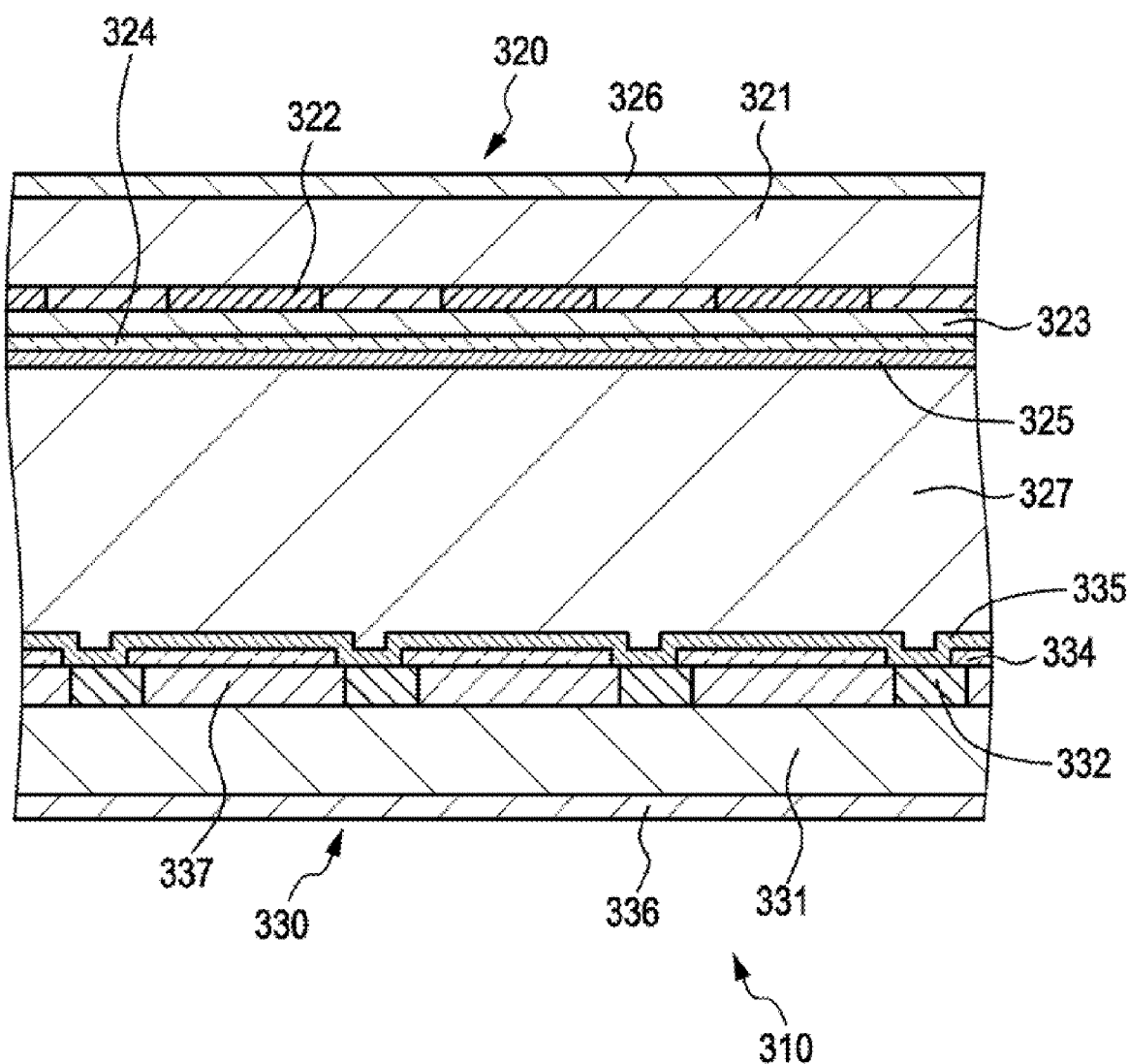
FIG. 26 is a schematic partial cross-sectional view of a color liquid crystal display device.

FIG. 25A schematically shows the arrangement of GaN-based semiconductor light-emitting elements (light-emitting diodes) 1R, 1G, and 1B in a surface light source device of Example 9. FIG. 25B is a schematic partial cross-sectional view of a surface light source device and a color liquid crystal display device assembly. FIG. 26 is a schematic partial cross-sectional view of a color liquid crystal display device.

More specifically, a color liquid crystal display device assembly 300 of Example 9 includes a transmissive color liquid crystal display device 310 including (a) a front panel 320 having a transparent first electrode 324, (b) a rear panel 330 having a transparent second electrode 334, and (c) a liquid crystal material 327 disposed between the front panel 320 and the rear panel 330; and (d) a surface light source device (direct-type backlight) 340 having semiconductor light-emitting elements 1R, 1G, and 1B serving as light sources. The surface light source device (direct-type backlight) 340 is disposed so as to face the rear panel 330, and the color liquid crystal display device 310 is irradiated with light emitted from the surface light source device 340 from the rear panel side.

The direct-type surface light source device 340 includes a casing 341 including an outer frame 343 and an inner frame 344. Each end of the transmissive color liquid crystal display device 310 is held so as to be sandwiched between the outer frame 343 and the inner frame 344, with spacers 345A and 345B therebetween, respectively. A guiding member 346 is disposed between the outer frame 343 and the inner frame 344 so that the color liquid crystal display device 310 sandwiched between the outer frame 343 and the inner frame 344 is not shifted from the appropriate position. A diffusion plate 351 is attached to the inner frame 344, with a spacer 345C and a bracket member 347 therebetween, at the upper part in the casing 341. An optical functional sheet group including a diffusion sheet 352, a prism sheet 353, and a polarization conversion sheet 354 is disposed on the diffusion plate 351.

A reflection sheet 355 is provided at the lower part in the casing 341. The reflection sheet 355 is arranged so that a reflection surface thereof faces the diffusion plate 351, and is attached to a bottom surface 342A of the casing 341 with a fixing member (not shown) therebetween. The reflection sheet 355 can be composed of, for example, a high-reflection silver film having a structure in which a silver reflection film, a low-refractive-index film, and a high-refractive-index film are laminated on a sheet base material in that order. The reflection sheet 355 reflects light emitted from a plurality of red-light-emitting GaN-based semiconductor light-emitting elements 1R (or AlGaInP-based semiconductor light-emitting elements), a plurality of green-light-emitting GaN-based semiconductor light-emitting elements 1G, and a plurality of blue-light-emitting GaN-based semiconductor light-emitting elements 1B, and light reflected by a side surface 342B of the casing 341. Thus, red light, green light, and blue light emitted from the semiconductor light-emitting elements 1R, 1G, and 1B are mixed, and white light with high color purity can be obtained as illuminating light. This illuminating light passes through the diffusion plate 351, and the optical functional sheet group including the diffusion sheet 352, the prism sheet 353, and the polarization conversion sheet 354, and irradiates the color liquid crystal display device 310 from the back surface side.

Regarding the arrangement of the light-emitting elements, for example, a plurality of light-emitting element rows may be arranged in the horizontal direction to form a light-emitting element row array, the light-emitting element rows each including a predetermined number of red-light-emitting GaN-based semiconductor light-emitting elements 1R (or AlGaInP-based semiconductor light-emitting elements), green-light-emitting GaN-based semiconductor light-emitting elements 1G, and blue-light-emitting GaN-based semiconductor light-emitting elements 1B, and a plurality of such light-emitting element row arrays may be arranged in the vertical direction. Regarding the number of light-emitting elements constituting the light-emitting element row, the light-emitting element row includes, for example, two red-light-emitting AlGaInP-based semiconductor light-emitting elements, two green-light-emitting GaN-based semiconductor light-emitting elements, and one blue-light-emitting GaN-based semiconductor light-emitting element. In this case, for example, a red-light-emitting AlGaInP-based semiconductor light-emitting element, a green-light-emitting GaN-based semiconductor light-emitting element, a blue-light-emitting GaN-based semiconductor light-emitting element, a green-light-emitting GaN-based semiconductor light-emitting element, and a red-light-emitting AlGaInP-based semiconductor light-emitting element are arranged in that order.

As shown in FIG. 26, the front panel 320 constituting the color liquid crystal display device 310 includes a first substrate 321 composed of, for example, a glass substrate and a polarizing film 326 provided on the outer surface of the first substrate 321. A color filter 322 coated with an overcoat layer 323 composed of an acrylic resin or an epoxy resin is provided on the inner surface of the first substrate 321. A transparent first electrode (also referred to as a "common electrode" composed of, for example, ITO) 324 is provided on the overcoat layer 323. An alignment layer 325 is provided on the transparent first electrode 324. The rear panel 330 includes a second substrate 331 composed of, for example, a glass substrate, switching elements (specifically, thin-film transistors (TFTs)) 332 disposed on the inner surface of the second substrate 331, transparent second electrodes (also referred to as "pixel electrodes" composed of, for example, ITO) 334 whose conduction/non-conduction is controlled by the switching elements 332, and a polarizing film 336 disposed on the outer surface of the second substrate 331. An alignment layer 335 is provided over the entire surface including the transparent second electrodes 334. The front panel 320 and the rear panel 330 are bonded to each other at the outer peripheries thereof with a sealing member (not shown) therebetween. The switching elements 332 are not limited to TFTs. Alternatively, the switching elements 332 may be composed of, for example, MIM elements. An insulating layer 337 is provided between the switching elements 332.

The various members and the liquid crystal material constituting the transmissive color liquid crystal display device can be composed of commonly used members and materials, and thus the detailed description thereof is omitted.

Furthermore, by dividing the surface light source device into a plurality of regions and by dynamically controlling each region independently, the dynamic range with respect to the luminance of the color liquid crystal display device can be further increased. Specifically, the surface light source device is divided into a plurality of regions for each image display frame, and the brightness of the surface light source device is changed in accordance with an image signal in each region (for example, the luminance of each region of the surface light source device is changed in proportion to the maximum luminance of the corresponding region of an image). In this case, in a bright region of the image, the corresponding region of the surface light source device is brightened, whereas in a dark region of the image, the corresponding region of the surface light source device is darkened. Thereby, the contrast ratio of the color liquid crystal display device can be markedly improved. Furthermore, the average electric power consumption can be reduced. In this technique, it is important to decrease color unevenness between the regions of the surface light source device. In GaN-based semiconductor light-emitting elements, variations in luminous colors readily occur during the production. However, each of the GaN-based semiconductor light-emitting elements used in Example 9 is the same as any of the GaN-based semiconductor light-emitting elements 1 and 1A described in Examples 1 to 5, and thus it is possible to realize a surface light source device in which variations in luminous colors between the regions are suppressed. Furthermore, in addition to the control of the operating current density (or driving current) of the GaN-based semiconductor light-emitting element functioning as the light source, the luminance (brightness) of the GaN-based semiconductor light-emitting element functioning as the light source can be controlled by controlling the pulse width of the driving current and/or the pulse density of the driving current. Accordingly, each of a plurality of divided regions can be dynamically and independently controlled more reliably and easily. Specifically, for example, the luminance of each region of the surface light source device may be controlled by the peak current value of the driving current (operating current), and the luminance may be finely controlled by controlling the pulse width and/or the pulse density of the driving current. Alternatively, contrary to this, the luminance of the whole surface light source device may be controlled by controlling the pulse width and/or the pulse density of the driving current, and the luminance may be finely controlled by the peak current value of the driving current (operating current).

EXAMPLE 10

Example 10 is a modification of Example 9. In Example 9, a direct-type surface light source device has been described. On the other hand, in Example 10, an edge-light-type surface light source device will be described. FIG. 27 is a schematic view of a color liquid crystal display device assembly of Example 10. The schematic partial cross-sectional view of the color liquid crystal display device in Example 10 is the same as the schematic partial cross-sectional view shown in FIG. 26.

A color liquid crystal display device assembly 300A of Example 10 includes a transmissive color liquid crystal display device 310 including (a) a front panel 320 having a transparent first electrode 324, (b) a rear panel 330 having a transparent second electrode 334, and (c) a liquid crystal material 327 disposed between the front panel 320 and the rear panel 330; and (d) a surface light source device (edge-light-type backlight) 350 that is composed of a light guide plate 370 and a light source 360 and that radiates light from the rear panel side to the color liquid crystal display device 310. The light guide plate 370 is disposed so as to face the rear panel 330.

The light source 360 is composed of, for example, red-light-emitting AlGaInP-based semiconductor light-emitting elements, green-light-emitting GaN-based semiconductor light-emitting elements, and blue-light-emitting GaN-based semiconductor light-emitting elements. These semiconductor light-emitting elements are not shown in FIG. 27. Each of the green-light-emitting GaN-based semiconductor light-emitting elements and the blue-light-emitting GaN-based semiconductor light-emitting elements may be the same as any of the GaN-based semiconductor light-emitting elements 1 and 1A described in Examples 1 to 5. The configurations and structures of the front panel 320 and the rear panel 330 that constitute the color liquid crystal display device 310 can have the same as those of the front panel 320 and the rear panel 330 of Example 9 described with reference to FIG. 26, and thus the detailed description thereof is omitted.

The light guide plate 370 composed of, for example, a polycarbonate resin has a first surface (bottom surface) 371, a second surface (top surface) 373 opposite the first surface 371, a first side surface 374, a second side surface 375, a third side surface 376 opposite the first side surface 374, and a fourth side surface opposite the second side surface 375. More specifically, as a whole, the light guide plate 370 has a wedge-like, truncated quadrangular pyramid shape. Two opposing side surfaces of the truncated quadrangular pyramid correspond to the first surface 371 and the second surface 373, and the bottom surface of the truncated quadrangular pyramid corresponds to the first side surface 374. The first surface 371 has an irregular portion 372. When the light guide plate 370 is cut along an assumed plane that extends in a direction of light incident to the light guide plate 370 and that is perpendicular to the first surface 371, the cross-sectional shape of the continuous irregular portion is triangular. That is, the irregular portion 372 provided on the first surface 371 is prismatic. The second surface 373 of the light guide plate 370 may be a smooth surface (i.e., mirror surface), or may be provided with irregularities having a diffusion effect, the irregularities being formed by blasting (i.e., fine irregular surface). A reflection member 381 is arranged so as to face the first surface 371 of the light guide plate 370. The color liquid crystal display device 310 is arranged so as to face the second surface 373 of the light guide plate 370. Furthermore, a diffusion sheet 382 and a prism sheet 383 are arranged between the color liquid crystal display device 310 and the second surface 373 of the light guide plate 370. Light emitted from the light source 360 enters the light guide plate 370 from the first side surface 374 (e.g., surface corresponding to the bottom surface of the truncated quadrangular pyramid) of the light guide plate 370, collides with the irregular portion 372 on the first surface 371 to be scattered, is emitted from the first surface 371, is reflected on the reflection member 381, enters the first surface 371 again, is emitted from the second surface 373, passes through the diffusion sheet 382 and the prism sheet 383, and irradiates the color liquid crystal display device 310.

The present embodiments are not limited to the Examples described above. The configurations and structures of the GaN-based semiconductor light-emitting elements described in Examples, and the light-emitting element assemblies, light-emitting apparatuses, image display apparatuses, surface light source devices, and the color liquid crystal display device assemblies that include the GaN-based semiconductor light-emitting elements are merely illustrative. The members, materials, and the like constituting these are also merely illustrative and can be appropriately changed. The order of lamination in the GaN-based semiconductor light-emitting element may be reversed. The direct-view-type image display apparatus may be an image display apparatus in which an image is projected on the human retina. The GaN-based semiconductor light-emitting element can constitute a semiconductor laser.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A GaN-based semiconductor light-emitting element comprising:
    (A) a first GaN-based compound semiconductor layer of n-conductivity type;
    (B) an active layer having a multi-quantum well structure including well layers and barrier layers that separate adjacent well layers;
    (C) a second GaN-based compound semiconductor layer of p-conductivity type;
    (D) a first electrode that is electrically connected to the first GaN-based compound semiconductor layer; and
    (E) a second electrode that is electrically connected to the second GaN-based compound semiconductor layer,
    wherein at least one of the barrier layers constituting the active layer is composed of a varying-composition barrier layer, and
    the composition of the varying-composition barrier layer varies in a thickness direction thereof so that the band-gap energy in a first region of the varying-composition barrier layer, the first region being adjacent to a boundary between a well layer disposed on a side closer to the second GaN-based compound semiconductor layer and the varying-composition barrier layer, is lower than the band-gap energy in a second region of the varying-composition barrier layer, the second region being adjacent to a boundary between a well layer disposed on a side closer to the first GaN-based compound semiconductor layer and the varying-composition barrier layer.

2. The GaN-based semiconductor light-emitting element according to claim 1, wherein the composition of the varying-composition barrier layer varies stepwise in the thickness direction.

3. The GaN-based semiconductor light-emitting element according to claim 2,
    wherein the composition of the varying-composition barrier layer varies in the thickness direction in two steps, and
    when the boundary between the well layer disposed on the side closer to the first GaN-based compound semiconductor layer and the varying-composition barrier layer is assumed to be a reference, a position to in the thickness direction at which the composition varies satisfies the following relationship:

$$0.01 t_B \leq t_0 \leq 0.5 t_B$$

wherein $t_B$ represents the thickness of the varying-composition barrier layer.

4. The GaN-based semiconductor light-emitting element according to claim 1, wherein the composition of the varying-composition barrier layer continuously varies in the thickness direction.

5. The GaN-based semiconductor light-emitting element according to claim 1,
    wherein the composition of the second region of the varying-composition barrier layer is GaN,
    the composition of the first region of the varying-composition barrier layer is $In_z Ga_{(1-z)} N$, and
    the composition of each of the well layers is $In_y Ga_{(1-y)} N$ (wherein y>z).

6. The GaN-based semiconductor light-emitting element according to claim 5, wherein the relationship $1 \times 10^{-4} \leq z \leq 3 \times 10^{-2}$ is satisfied.

7. The GaN-based semiconductor light-emitting element according to claim 1,
    wherein the composition of the second region of the varying-composition barrier layer is AlGaN,
    the composition of the first region of the varying-composition barrier layer is GaN or $In_z Ga_{(1-z)} N$, and
    the composition of each of the well layers is $In_y Ga_{(1-y)} N$ (wherein y>z).

8. The GaN-based semiconductor light-emitting element according to claim 1, wherein the number of well layers is in the range of 6 to 15.

9. The GaN-based semiconductor light-emitting element according to claim 8, wherein the number of varying-composition barrier layers is ½ or more of the total number of barrier layers.

10. The GaN-based semiconductor light-emitting element according to claim 9, wherein the varying-composition barrier layers occupy positions closer to the second GaN-based compound semiconductor layer.

11. The GaN-based semiconductor light-emitting element according to claim 1, wherein the density of a current applied to the active layer is 50 amperes/cm$^2$ or more.

12. The GaN-based semiconductor light-emitting element according to claim 1, wherein the active layer has an area in the range of $10^{-12}$ to $10^{-8}$ m$^2$.

13. The GaN-based semiconductor light-emitting element according to claim 1, wherein the GaN-based semiconductor light-emitting element has a thickness in the range of $1\times10^{-7}$ to $1\times10^{-5}$ m.

14. The GaN-based semiconductor light-emitting element according to claim 1, further comprising:
(F) an impurity diffusion-preventing layer for preventing a p-type impurity from diffusing into the active layer, the impurity diffusion-preventing layer being composed of an undoped GaN-based compound semiconductor, and
(G) a laminated structure,
the impurity diffusion-preventing layer and the laminated structure being disposed between the active layer and the second GaN-based compound semiconductor layer in that order from the active layer side,
wherein the laminated structure includes at least one laminate unit in which a GaN-based compound semiconductor layer of p-conductivity type and an undoped GaN-based compound semiconductor layer are laminated in that order from the active layer side.

15. The GaN-based semiconductor light-emitting element according to claim 1, further comprising:
(F) an impurity diffusion-preventing layer for preventing a p-type impurity from diffusing into the active layer, the impurity diffusion-preventing layer being composed of an undoped GaN-based compound semiconductor, and
(G) a third GaN-based compound semiconductor layer of p-conductivity type,
the impurity diffusion-preventing layer and the third GaN-based compound semiconductor layer being disposed between the active layer and the second GaN-based compound semiconductor layer in that order from the active layer side,
wherein at least one undoped GaN-based compound semiconductor layer is provided on a side of the third GaN-based compound semiconductor layer, the side being closer to the second GaN-based compound semiconductor layer.

16. A light-emitting element assembly comprising:
a supporting member; and
a GaN-based semiconductor light-emitting element disposed on the supporting member,
wherein the GaN-based semiconductor light-emitting element includes
(A) a first GaN-based compound semiconductor layer of n-conductivity type;
(B) an active layer having a multi-quantum well structure including well layers and barrier layers that separate adjacent well layers;
(C) a second GaN-based compound semiconductor layer of p-conductivity type;
(D) a first electrode that is electrically connected to the first GaN-based compound semiconductor layer; and
(E) a second electrode that is electrically connected to the second GaN-based compound semiconductor layer,
in which at least one of the barrier layers constituting the active layer is composed of a varying-composition barrier layer, and
the composition of the varying-composition barrier layer varies in a thickness direction thereof so that the band-gap energy in a first region of the varying-composition barrier layer, the first region being adjacent to a boundary between a well layer disposed on a side closer to the second GaN-based compound semiconductor layer and the varying-composition barrier layer, is lower than the band-gap energy in a second region of the varying-composition barrier layer, the second region being adjacent to a boundary between a well layer disposed on a side closer to the first GaN-based compound semiconductor layer and the varying-composition barrier layer.

17. A light-emitting apparatus comprising:
(a) a GaN-based semiconductor light-emitting element; and
(b) a color conversion material that is excited by light emitted from the GaN-based semiconductor light-emitting element to emit light having a wavelength different from the wavelength of the emitted light,
wherein the GaN-based semiconductor light-emitting element includes
(A) a first GaN-based compound semiconductor layer of n-conductivity type;
(B) an active layer having a multi-quantum well structure including well layers and barrier layers that separate adjacent well layers;
(C) a second GaN-based compound semiconductor layer of p-conductivity type;
(D) a first electrode that is electrically connected to the first GaN-based compound semiconductor layer; and
(E) a second electrode that is electrically connected to the second GaN-based compound semiconductor layer,
in which at least one of the barrier layers constituting the active layer is composed of a varying-composition barrier layer, and
the composition of the varying-composition barrier layer varies in a thickness direction thereof so that the band-gap energy in a first region of the varying-composition barrier layer, the first region being adjacent to a boundary between a well layer disposed on a side closer to the second GaN-based compound semiconductor layer and the varying-composition barrier layer, is lower than the band-gap energy in a second region of the varying-composition barrier layer, the second region being adjacent to a boundary between a well layer disposed on a side closer to the first GaN-based compound semiconductor layer and the varying-composition barrier layer.

18. A method of driving a GaN-based semiconductor light-emitting element that includes
(A) a first GaN-based compound semiconductor layer of n-conductivity type;
(B) an active layer having a multi-quantum well structure including well layers and barrier layers that separate adjacent well layers;
(C) a second GaN-based compound semiconductor layer of p-conductivity type;
(D) a first electrode that is electrically connected to the first GaN-based compound semiconductor layer; and
(E) a second electrode that is electrically connected to the second GaN-based compound semiconductor layer, wherein at least one of the barrier layers constituting the active layer is composed of a varying-composition barrier layer, and the composition of the varying-composition barrier layer varies in a thickness direction thereof so that the band-gap energy in a first region of the varying-composition barrier layer, the first region being adjacent to a boundary between a well layer disposed on a side closer to the second GaN-based compound semiconductor layer and the varying-composition barrier layer, is lower than the band-gap energy in a second region of the varying-composition barrier layer, the second region being adjacent to a boundary between a well layer disposed on a side closer to the first GaN-based compound semiconductor layer and the varying-composition barrier layer, the method comprising:

applying a current to the active layer at a current density of 50 amperes/cm$^2$ or more.

19. An image display apparatus comprising:
a GaN-based semiconductor light-emitting element for displaying an image,
wherein the GaN-based semiconductor light-emitting element includes
(A) a first GaN-based compound semiconductor layer of n-conductivity type;
(B) an active layer having a multi-quantum well structure including well layers and barrier layers that separate adjacent well layers;
(C) a second GaN-based compound semiconductor layer of p-conductivity type;
(D) a first electrode that is electrically connected to the first GaN-based compound semiconductor layer; and
(E) a second electrode that is electrically connected to the second GaN-based compound semiconductor layer,
in which at least one of the barrier layers constituting the active layer is composed of a varying-composition barrier layer, and
the composition of the varying-composition barrier layer varies in a thickness direction thereof so that the band-gap energy in a first region of the varying-composition barrier layer, the first region being adjacent to a boundary between a well layer disposed on a side closer to the second GaN-based compound semiconductor layer and the varying-composition barrier layer, is lower than the band-gap energy in a second region of the varying-composition barrier layer, the second region being adjacent to a boundary between a well layer disposed on a side closer to the first GaN-based compound semiconductor layer and the varying-composition barrier layer.

* * * * *